(12) United States Patent
Hersam et al.

(10) Patent No.: US 12,406,179 B2
(45) Date of Patent: Sep. 2, 2025

(54) TUNABLE GAUSSIAN HETEROJUNCTION TRANSISTORS, FABRICATING METHODS AND APPLICATIONS OF SAME

(71) Applicants: NORTHWESTERN UNIVERSITY, Evanston, IL (US); THE BOARD OF TRUSTEES OF THE UNIVERSITY OF ILLINOIS, Urbana, IL (US)

(72) Inventors: Mark C. Hersam, Wilmette, IL (US); Megan E. Beck, St. Maries, ID (US); Vinod K. Sangwan, Evanston, IL (US); Amit R. Trivedi, Oak Park, IL (US); Ahish Shylendra, Chicago, IL (US)

(73) Assignees: NORTHWESTERN UNIVERSITY, Evanston, IL (US); THE BOARD OF TRUSTEES OF THE UNIVERSITY OF ILLINOIS, Urbana, IL (US)

( * ) Notice: Subject to any disclaimer, the term of this patent is extended or adjusted under 35 U.S.C. 154(b) by 695 days.

(21) Appl. No.: 17/782,728

(22) PCT Filed: Dec. 22, 2020

(86) PCT No.: PCT/US2020/066551
§ 371 (c)(1),
(2) Date: Jun. 6, 2022

(87) PCT Pub. No.: WO2021/133772
PCT Pub. Date: Jul. 1, 2021

(65) Prior Publication Data
US 2023/0040758 A1 Feb. 9, 2023

Related U.S. Application Data

(60) Provisional application No. 62/953,629, filed on Dec. 26, 2019.

(51) Int. Cl.
*G06N 3/065* (2023.01)
*G06N 3/048* (2023.01)
(Continued)

(52) U.S. Cl.
CPC ............. *G06N 3/065* (2023.01); *G06N 3/048* (2023.01); *G06N 3/049* (2013.01); *H10K 10/482* (2023.02);
(Continued)

(58) Field of Classification Search
None
See application file for complete search history.

(56) References Cited

U.S. PATENT DOCUMENTS

2018/0333587 A1  11/2018  Howard

FOREIGN PATENT DOCUMENTS

| CN | 108258038 A | 7/2018 |
| JP | 2018503252 A | 2/2018 |

(Continued)

OTHER PUBLICATIONS

Indiveri, G. et al. Neuromorphic silicon neuron circuits. Front. Neurosci. 5, 1-23 (2011).
(Continued)

*Primary Examiner* — Anthony Ho
(74) *Attorney, Agent, or Firm* — troutman pepper locke; Tim Tingkang Xia, Esq.

(57) ABSTRACT

A GHeT includes a bottom gate formed on a substrate; a first dielectric layer (DL) formed on the bottom gate; a monolayer film formed of an atomically thin material on the first DL; a bottom contact (BC) formed on part of the monolayer film; a second DL formed on the BC; a top contact (TC) formed on the second DL on top of the BC; a network of CNTs formed on the TC and the monolayer film, to define an overlap region with the monolayer film; a third DL
(Continued)

formed on the CNT network, the monolayer film and the TC; and a top gate formed on the third DL and overlapping with the overlap region. Such GHeT design allows gate tunability of Gaussian peak position, height and width that define Gaussian transfer characteristic, thereby enabling simplified circuit architectures for various spiking neuron functions for emerging neuromorphic applications.

40 Claims, 31 Drawing Sheets

(51) Int. Cl.
```
G06N 3/049      (2023.01)
H10K 10/46      (2023.01)
H10K 71/12      (2023.01)
H10K 71/20      (2023.01)
H10K 85/20      (2023.01)
H10K 102/00     (2023.01)
```

(52) U.S. Cl.
CPC ............ *H10K 10/486* (2023.02); *H10K 71/12* (2023.02); *H10K 71/231* (2023.02); *H10K 85/221* (2023.02); *H10K 2102/00* (2023.02)

(56) References Cited

FOREIGN PATENT DOCUMENTS

| | | |
|---|---|---|
| KR | 1020190051766 A | 5/2019 |
| WO | 2010106116 A1 | 9/2010 |

OTHER PUBLICATIONS

Indiveri, G. In 2003 IEEE Int. Symp. Circ. S. 820-823 (IEEE, 2003).
Folowosele, F. et al. In 2009 IEEE Int. Symp. Circ. S. 2149-2152 (IEEE, 2009).
Asai, T., Kanazawa, Y. & Amemiya, Y. A subthreshold MOS neuron circuit based on the Volterra system. IEEE Trans. Neural Networks 14, 1308-1312 (2003).
Wijekoon, J. H. B. & Dudek, P. In 2008 IEEE Int. Symp. Circ. S. 1784-1787 (IEEE, 2008).
Akopyan, F. et al. TrueNorth: Design and tool flow of a 65 mW 1 million neuron programmable neurosynaptic chip. IEEE Trans. Comput. Aided Des. Integr. Circuits Syst. 34, 1537-1557 (2015).
Furber, S. B., Galluppi, F., Temple, S. & Plana, L. A. The SpiNNaker project. Proc. IEEE 102, 652-665 (2014).
Jo, S. H. et al. Nanoscale memristor device as synapse in neuromorphic systems. Nano Lett. 10, 1297-1301 (2010).
Sangwan, V. K. et al. Multi-terminal memtransistors from polycrystalline monolayer molybdenum disulfide. Nature 554, 500-504 (2018).
Wang, L. et al. Artificial synapses based on multiterminal memtransistors for neuromorphic application. Adv. Funct. Mater. 29, 1901106 (2019).
Sharad, M., Augustine, C., Panagopoulos, G. & Roy, K. Spin-based neuron model with domain-wall magnets as synapse. IEEE Trans. Nanotechnol. 11, 843-853 (2012).
Shi, J., Ha, S. D., Zhou, Y., Schoofs, F. & Ramanathan, S. A correlated nickelate synaptic transistor. Nat. Commun. 4, 2676 (2013).
Sebastian, A., Pannone, A., Subbulakshmi Radhakrishnan, S. & Das, S. Gaussian synapses for probabilistic neural networks. Nat. Commun. 10, 4199 (2019).
Pickett, M. D., Medeiros-Ribeiro, G. & Williams, R. S. A scalable neuristor built with Mott memristors. Nat. Mater. 12, 114 (2012).
Gao, L., Chen, P.-Y. & Yu, S. NbOx based oscillation neuron for neuromorphic computing. Appl. Phys. Lett. 111, 103503 (2017).
Thakur, C. S. et al. Large-scale neuromorphic spiking array processors: A quest to mimic the brain. Front. Neurosci. 12, 891 (2018).
Jaiswal, A., Roy, S., Srinivasan, G. & Roy, K. Proposal for a leaky-integrate-fire spiking neuron based on magnetoelectric switching of ferromagnets. IEEE Trans. Electron Devices 64, 1818-1824 (2017).
Wang, Z. et al. In 2018 IEEE Int. Electron Devices Meet. 300-303 (IEEE, 2018).
Izhikevich, E. M. Dynamical Systems in Neuroscience. (MIT Press, Cambridge, 2007).
Meng, X. J. et al. Temperature dependence of ferroelectric and dielectric properties of $PbZr0.5Ti0.5O3$ thin film based capacitors. Appl. Phys. Lett. 81, 4035-4037 (2002).
Feldmann, J., Youngblood, N., Wright, C. D., Bhaskaran, H. & Pernice, W. H. P. All-optical spiking neurosynaptic networks with self-learning capabilities. Nature 569, 208-214 (2019).
Jariwala, D. et al. Gate-tunable carbon nanotube-MoS2 heterojunction p-n diode. Proc. Natl Acad. Sci. USA 110, 18076-18080 (2013).
Jariwala, D. et al. Hybrid, gate-tunable, van der Waals p-n heterojunctions from pentacene and MoS2. Nano Lett. 16, 197-503 (2016).
Nourbakhsh, A., Zubair, A., Dresselhaus, M. S. & Palacios, T. Transport properties of a MoS2/WSe2 heterojunction transistor and its potential for application. Nano Lett. 16, 1359-1366 (2016).
Li, Y. et al. Anti-ambipolar field-effect transistors based on few-layer 2D transition metal dichalcogenides. ACS Appl. Mater. Inter. 8, 15574-15581 (2016).
Hong, T. et al. Anisotropic photocurrent response at black phosphorus-MoS2 p-n heterojunctions. Nanoscale 7, 18537-18541 (2015).
Lee, C.-H. et al. Atomically thin p-n junctions with van der Waals heterointerfaces. Nat. Nanotechnol. 9, 676 (2014).
Wu, E. et al. Photoinduced doping to enable tunable and high-performance anti-ambipolar MoTe2/MoS2 heterotransistors. ACS Nano 13, 5430-5438 (2019).
He, X., Chow, W., Liu, F., Tay, B. & Liu, Z. MoS2/rubrene van der Waals heterostructure: Toward ambipolar field-effect transistors and inverter circuits. Small 13, 1602558 (2017).
Yoo, H., On, S., Lee, S. B., Cho, K. & Kim, J.-J. Negative transconductance heterojunction organic transistors and their application to full-swing ternary circuits. Adv. Mater. 31, 1808265 (2019).
Sangwan, V. K. et al. Self-aligned van der Waals heterojunction diodes and transistors. Nano Lett. 18, 1421-1427 (2018).
Li, D., Wang, B., Chen, M., Zhou, J. & Zhang, Z. Gate-controlled BP-WSe2 heterojunction diode for logic rectifiers and logic optoelectronics. Small 13, 1603726 (2017).
Jariwala, D. et al. Large-area, low-voltage, antiambipolar heterojunctions from solution-processed semiconductors. Nano Lett. 15, 416-421 (2015).
Amsterdam, S. H. et al. Electronic coupling in metallophthalocyanine-transition metal dichalcogenide mixed-dimensional heterojunctions. ACS Nano 13, 4183-4190 (2019).
Geier, M. L. et al. Solution-processed carbon nanotube thin-film complementary static random access memory. Nat. Nanotechnol. 10, 944 (2015).
Gaviria Rojas, W. A. et al. Solution-processed carbon nanotube true random number generator. Nano Lett. 17, 4976-4981 (2017).
Phan, T. L. et al. Efficient gate modulation in a screening-engineered MoS2/single-walled carbon nanotube network heterojunction vertical field-effect transistor. ACS Appl. Mater. Inter. 11, 25516-25523 (2019).
Hodgkin, A. L. & Huxley, A. F. Currents carried by sodium and potassium ions through the membrane of the giant axon of Loligo. J. Physiol. 116, 449-472 (1952).
Kang, K. & Shibata, T. An on-chip-trainable Gaussian-kernel analog support vector machine. IEEE Trans. Circuits-1 57, 1513-1524 (2010).
Reynolds, D. A., Quatieri, T. F. & Dunn, R. B. Speaker verification using adapted Gaussian mixture models. Digit. Signal Process. 10, 19-41 (2000).
Blei, D. M., Kucukelbir, A. & McAuliffe, J. D. Variational inference: A review for statisticians. J. Am. Stat. Assoc. 112, 859-877 (2017).
Crespo, J. L., Duro, R. J. & Pena, F. L. Gaussian synapse ANNs in multi- and hyperspectral image data analysis. IEEE Trans. Instrum. Meas. 52, 724-732 (2003).

(56) References Cited

OTHER PUBLICATIONS

Korean Intellectual Property Office (ISR/KR), "International Search Report for PCT/US2020/066551", Korea, Apr. 19, 2021.

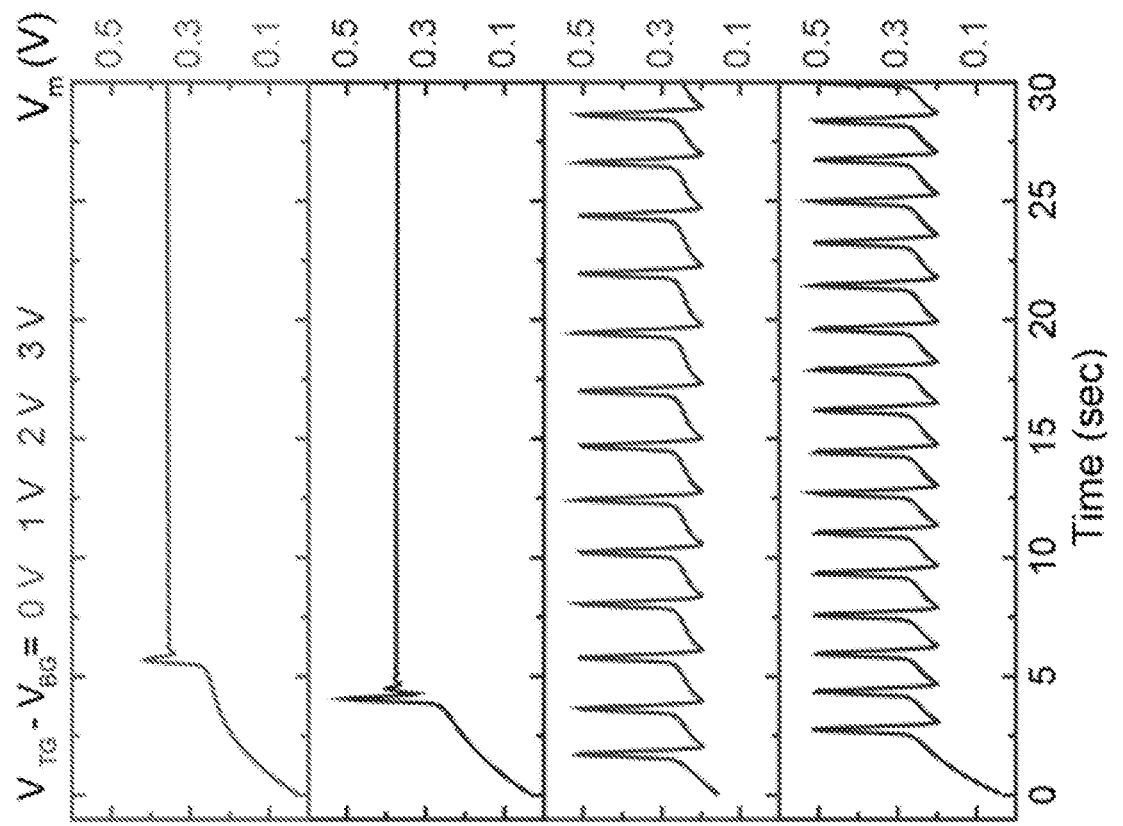
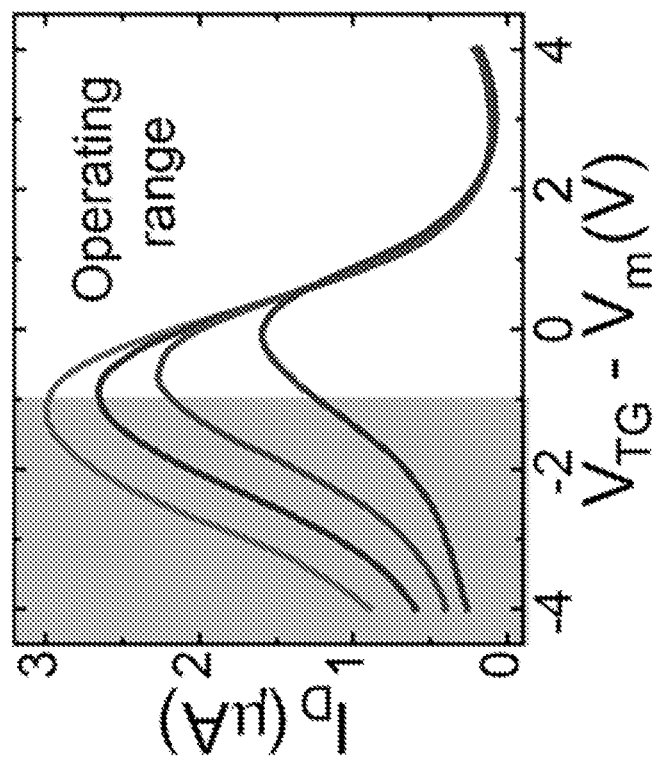
FIG. 17A
FIG. 17B

TUNABLE GAUSSIAN HETEROJUNCTION TRANSISTORS, FABRICATING METHODS AND APPLICATIONS OF SAME

CROSS-REFERENCE TO RELATED PATENT APPLICATION

This application claims priority to and the benefit of U.S. Provisional Application No. 62/953,629, filed Dec. 26, 2019, which is incorporated herein in its entirety by reference.

STATEMENT AS TO RIGHTS UNDER FEDERALLY-SPONSORED RESEARCH

This invention was made with government support under EFRI-1433510 and 1720139 awarded by the National Science Foundation, and 70NANB14H012 awarded by the National Institute of Standards and Technology. The government has certain rights in the invention.

FIELD OF THE INVENTION

The present invention relates generally to semiconductors, and more particularly to spiking neurons from tunable Gaussian heterojunction transistors, fabricating methods and applications of the same.

BACKGROUND OF THE INVENTION

The background description provided herein is for the purpose of generally presenting the context of the invention. The subject matter discussed in the background of the invention section should not be assumed to be prior art merely as a result of its mention in the background of the invention section. Similarly, a problem mentioned in the background of the invention section or associated with the subject matter of the background of the invention section should not be assumed to have been previously recognized in the prior art. The subject matter in the background of the invention section merely represents different approaches, which in and of themselves may also be inventions. Work of the presently named inventors, to the extent it is described in the background of the invention section, as well as aspects of the description that may not otherwise qualify as prior art at the time of filing, are neither expressly nor impliedly admitted as prior art against the invention.

The energy efficiency of spiking neural network (SNN)-based artificial intelligence (AI) can be enhanced by neuromorphic hardware, including spiking neuron-synapse circuits. Since conventional silicon-based complementary metal-oxide-semiconductor (CMOS) transistors do not intrinsically emulate the time-dependent conductance of ion channels in biological neurons, complicated multi-transistor circuits are required for CMOS-based SNNs, thus limiting very-large-scale integration (VLSI) density. For example, CMOS-based neuron circuit that achieve multiple spiking modes requires at least 20 transistors that must adhere to stringent design constraints in addition to current-based addressing of several branches per neuron. Alternatively, IBM TrueNorth and SpiNNaker utilize digital processing of spiking neurons that is seemingly more conducive to VLSI design. However, due to limited chip area, digital cores must multiplex several spiking neurons, which compromises the parallelism of a biological spiking network.

To address these limitations of silicon-based SNN circuits, alternative materials are being explored that allow the encoding of neuromorphic functionality directly at the device level. While memristors, memtransistors, domain-wall memories, metal-insulator-transition (MIT) devices, and Gaussian synapses have been developed for scalable implementation of synaptic functions, approaches for realizing spiking neurons are relatively lacking. For example, neuristors based on MIT devices have been reported, but this design suffers from low gain and limited output swing. A diffusive memristor coupled with a capacitor has been shown to exhibit a spiked response, but this demonstration lacks the biophysical characteristics of a neuron spike and runtime neural dynamic adaptation. Leaky integrate and fire spiking neurons have also been achieved by combining a memristor with CMOS transistors, but the number of necessary circuit elements remains large. In addition, leaky integrate and fire spiking neurons have been proposed using the magneto-electric effect, but this implementation dissipates energy continuously, resulting in poor energy efficiency. A spiking neuron exploiting the abrupt state transition and hysteresis in ferroelectric field-effect transistors has also been shown, but this approach is limited to spike frequency adaptation, whereas biological neurons exhibit a variety of other spiking behaviors (e.g., phasic and tonic spiking or bursting). Ferroelectricity is also highly susceptible to temperature variations, which creates instabilities in ambient operating conditions. Finally, photonic implementations of spiking neurons have recently been discussed based on phase-changing materials. While this strategy is promising for high speed and high bandwidth neural processing, the optical spiking neuron does not exhibit biophysical characteristics.

In contrast, devices fabricated from low-dimensional materials take advantage of weak electrostatic screening to enable gate-tunable electronic properties that hold promise for spiking neurons. In particular, the incorporation of atomically-thin semiconducting materials into gate-tunable p-n heterojunctions results in an antiambipolar response with Gaussian transfer curves. While this behavior has been used for analog signal processing, logic devices, and photodetectors, the single-gated geometries used previously do not provide sufficient control over the Gaussian current-voltage characteristic to enable efficient neuromorphic functionality.

Therefore, a heretofore unaddressed need exists in the art to address the aforementioned deficiencies and inadequacies.

SUMMARY OF THE INVENTION

This invention demonstrates unprecedented electrostatic control of dual-gated Gaussian heterojunction transistors for simplified spiking neuron implementation. These devices employ wafer-scale mixed-dimensional van der Waals heterojunctions including chemical vapor deposited monolayer molybdenum disulfide and solution-processed semiconducting single-walled carbon nanotubes to emulate the spike-generating ion channels in biological neurons. Circuits based on these dual-gated Gaussian devices enable a variety of biological spiking responses including phasic spiking, delayed spiking, and tonic bursting. In addition to neuromorphic computing, the tunable Gaussian response has significant implications for a range of other applications including telecommunications, computer vision, and natural language processing. The dual-gated geometry provides full tunability of the Gaussian transfer curve, thereby enabling a variety of neuronal spiking responses including phasic spiking, delayed spiking, and tonic bursting that hold promise for neuromorphic computing and related AI technologies.

In one aspect, the invention relates to a Gaussian heterojunction transistor (GHeT) including a bottom gate (BG) electrode formed on a substrate; a first dielectric layer formed on the bottom gate electrode; a monolayer film formed of an atomically thin material on the first dielectric layer; a bottom contact (BC) formed on a part of the monolayer film; a second dielectric layer formed on the bottom contact; a top contact formed on the second dielectric layer on the top of the bottom contact; a network of carbon nanotubes (CNTs) formed on the top contact and the monolayer film, so as to define an overlap region with the monolayer film; a third dielectric layer formed on the CNT network, the monolayer film and the top contact over the substrate; and a top gate electrode formed on the third dielectric layer and overlapping with the overlap region.

In one embodiment, the atomically thin material comprises two-dimensional (2D) semiconductor material.

In one embodiment, the 2D semiconductor material comprises $MoS_2$, $MoSe_2$, $WS_2$, $WSe_2$, InSe, GaTe, black phosphorus (BP), or related 2D materials.

In one embodiment, the bottom and top gate electrodes and the bottom and top contacts comprise a same conductive material or different conductive materials.

In one embodiment, each of the bottom and top gate electrodes and the bottom and top contacts is formed of gold (Au), titanium (Ti), aluminum (Al), nickel (Ni), chromium (Cr), or other conductive materials.

In one embodiment, the first, second and third dielectric layers comprise a same dielectric material or different dielectric materials.

In one embodiment, each of the first, second and third dielectric layers is formed of $Al_2O_3$, $HfO_2$, $ZrO_2$, ZnO, $SiO_2$, or dielectrics including alumina, hafnia, or zirconia.

In one embodiment, the top and bottom gates are configured to modulate a diode rectification ratio.

In one embodiment, the top gate operably modulates an output response of the GHeT from a rectifying diode at a first top gate voltage to an inverted polarity rectifying diode at a second top gate voltage.

In one embodiment, the GHeT is configured to have operably band-to-band tunneling between the atomically thin material and the CNTs.

In one embodiment, the GHeT is configured to operate in a dependent biasing scheme to combine modulation of the CNTs by the top gate and modulation of the atomically thin material by the bottom gate, thereby resulting in enhanced electrostatic control of a device response.

In one embodiment, the GHeT is configured to have a tunable Gaussian transfer response in a single heterojunction device.

In one embodiment, the GHeT is configured to have an antiambipolar response that is tunable, so as to enable a variety of applications including Hodgkin-Huxley (HH) spiking neurons.

In another aspect, the invention relates to a GHeT comprising at least one mixed-dimensional van der Waals heterojunction comprising a monolayer film formed of an atomically thin material, and a network of CNTs.

In one embodiment, the atomically thin material comprises a 2D semiconductor material.

In one embodiment, the 2D semiconductor material comprises $MoS_2$, $MoSe_2$, $WS_2$, $WSe_2$, InSe, GaTe, BP, or related two-dimensional materials.

In yet another aspect, the invention relates to a circuit comprising at least one GHeT disclosed above.

In one embodiment, the circuit further comprises a Schmitt Trigger circuit coupled with the at least one Gaussian heterojunction transistor.

In one embodiment, the circuit is configured to achieve a variety of biological spiking responses including phasic spiking, delayed spiking, and tonic bursting.

In a further aspect, the invention relates to a device comprising at least one GHeT disclosed above.

In one embodiment, the device further comprises a Schmitt Trigger circuit coupled with the at least one Gaussian heterojunction transistor.

In one embodiment, the device is configured to mimic a variety of biological spiking responses including phasic spiking, delayed spiking, and tonic bursting.

In one aspect, the invention relates to a method for fabricating a GHeT. The method comprises fabricating a self-aligned bottom gate having a bottom gate electrode formed on a substrate, and a first dielectric layer formed on the bottom gate electrode; transferring a monolayer of an atomically thin material onto the self-aligned bottom gate and patterned using reactive ion etching (RIE); fabricating a self-aligned bottom contact on the monolayer followed by patterning and growth of a dielectric layer as an etch mask on part of the monolayer; wherein the self-aligned bottom contact has a bottom contact electrode and a second dielectric layer formed on the bottom contact electrode; depositing a top contact on the top of the bottom contact followed by transfer of a network of CNTs over the substrate, after which the RIE is performed to define an overlap region of the CNT network with the monolayer, the overlap region being a junction region; growing a third dielectric layer over the substrate; and forming a top gate on the third dielectric layer at least over the junction region.

In one embodiment, the monolayer of the atomically thin material is grown by chemical vapor deposition (CVD), mechanical exfoliation, metal-organic chemical vapor deposition (MOCVD), or atomic layer deposition (ALD).

In one embodiment, each of the self-aligned bottom gate and self-aligned bottom contact is fabricated with an undercut profile in developed negative photoresist combined with directional metal evaporation and conformal atomic layer deposition (ALD) of a dielectric oxide resulting in an encapsulated metal electrode with a self-aligned dielectric extension.

In one embodiment, each of the first, second and third dielectric layers is formed by ALD.

In one embodiment, the first, second and third dielectric layers comprise a same dielectric material or different dielectric materials.

In one embodiment, each of the first, second and third dielectric layers is formed of $Al_2O_3$, $HfO_2$, $ZrO_2$, ZnO, $SiO_2$, or dielectrics including alumina, hafnia, or zirconia.

In one embodiment, the atomically thin material comprises a 2D semiconductor material.

In one embodiment, the 2D semiconductor material comprises $MoS_2$, $MoSe_2$, $WS_2$, $WSe_2$, InSe, GaTe, BP, or related two-dimensional materials.

In another aspect, the invention relates to a circuit for spiking neuron comprising at least one GHeT; first and second transistors T1 and T2 coupled to the GHeT; and a number of passive elements including first and second resistors R1 and R2 and first and second capacitors C1 and C2, which are configured such that the GHeT and circuit components T1-R1-C1 operably emulate conductance of a $Na^+$ ion channel ($g_{Na}$), while circuit components T2-R2-C2 operably emulate conductance of a $K^+$ ion channel ($g_k$).

In one embodiment, the first transistor T1 and the first resistor R1 define a T1-R1 amplifier having an output node n1, wherein first resistor R1 has a first terminal electrically connected to potential V1 and a second terminal electrically connected to the output node n1, and the first transistor T1 has a gate electrically connected to a node n0 at potential $V_m$, a drain electrically connected to the output node n1, and a source electrically connected to a ground node, and the node n0 integrates a synapse current $I_{syn}$. The first capacitor C1 have a first terminal electrically connected to the node n0, and a second terminal electrically connected to the ground node. The second transistor T2 has a gate, a drain electrically connected to the synapse current $I_{syn}$, and a source electrically connected to the ground node. The second resistor R2 has a first terminal electrically connected to the synapse current $I_{syn}$, and a second terminal electrically connected to the gate of the second transistor T2. The second capacitor C2 has a first terminal electrically connected to the gate of the second transistor T2, and a second terminal electrically connected to the ground node.

In one embodiment, bottom and top gates of the GHeT are electrically connected to a bias voltage V3 for providing a bias offset between the bottom and top gates. The top gate of the GHeT is electrically connected to the output node n1. A drain of the GHeT is electrically connected to potential V2. A source of the GHeT is electrically connected to the node n0 that integrates the synapse current $I_{syn}$.

In one embodiment, the circuit further comprises voltage sources V4 and V5 electrically connected at the sources of the first and second transistors T1 and T2, respectively, to allow threshold voltage programmability for the field-effect transistors.

In one embodiment, bottom and top gates of the GHeT are electrically shorted and electrically connected to the output node n1. A drain of the GHeT is electrically connected to potential V2. A source of the GHeT is electrically connected to the node n0 that integrates the synapse current $I_{syn}$.

In one embodiment, a top gate of the GHeT is electrically connected to the output node n1. A bottom gate of the GHeT is electrically connected to a bias voltage V3. A drain of the GHeT is electrically connected to potential V2. A source of the GHeT is electrically connected to the node n0 that integrates a synapse current $I_{syn}$.

In one embodiment, the circuit further comprises a third resistor R3 and a third capacitor C3, wherein the third resistor R3 has a first terminal electrically coupled, via a switch circuit, to the output node n1, and a second terminal electrically connected to a common node n2, and the third capacitor C3 has a first terminal electrically connected to the common node n2, and a second terminal electrically connected to the ground node.

In one embodiment, the common node n2 is eclectically connected to the bias voltage V3.

In one embodiment, the circuit further comprises a third transistor T3 having a gate electrically connected to the bias voltage V3, a drain electrically connected to the node n0, and a source electrically connected to the ground node; a fourth transistor T4 having a gate electrically connected to the bias voltage V3, a drain electrically connected to the common node n2, and a source; a fourth resistor R4 having a first terminal electrically connected to the source of the fourth transistor T4, and a second terminal electrically connected to the ground node; and a Schmitt trigger circuit electrically connected to the common node n2.

In one embodiment, the circuit further comprises a third transistor T3 having a gate electrically connected to voltage V5, a drain electrically connected to the node n0, and a source electrically connected to the ground node; a fourth transistor T4 having a gate electrically connected to the voltage V5, a drain electrically connected to the bias voltage V3 that is in turn electrically connected to the common node n2, and a source; a fourth resistor R4 having a first terminal electrically connected to the source of the fourth transistor T4, and the ground node; and a second terminal electrically connected to the ground node; and a Schmitt trigger circuit electrically connected to the common node n2.

These and other aspects of the present invention will become apparent from the following description of the preferred embodiment taken in conjunction with the following drawings, although variations and modifications therein may be affected without departing from the spirit and scope of the novel concepts of the invention.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment.

FIG. 1A: Photolithography-based self-aligned fabrication, which is enabled by resist undercuts that are controlled by spin-coating speeds, exposure time, and development time. FIG. 1B: Atomic force microscopy topography image of an electrode and dielectric extension (2 μm scale bar) of dashed circle in FIG. 1A. FIG. 1C: Height profile corresponding to the dashed red line in FIG. 1B, revealing a sub-exposure-wavelength extension of about 300 nm on monolayer $MoS_2$. FIG. 1D: Optical micrographs of fabrication process (50 μm scale bar). FIG. 1E: Three-dimensional rendering of the device structure throughout fabrication.

FIG. 2A: Representative $I_D$-$V_D$ curves for $V_{BG}$=0 V, illustrating the $V_{TG}$ tunability of the rectifying diode response, including the inverted polarity of the rectification direction (orange versus purple). FIG. 2B: Rectification ratios ($I_D$ at $V_D$=1V divided by $I_D$ at $V_D$=−1 V) of the diode for various biasing conditions, showing tunability by both $V_{TG}$ and $V_{BG}$. FIG. 2C: $I_D$-$V_{TG}$ for different set $V_{BG}$, exhibiting tunability of the peak position of the antiambipolar response. All measurements were performed in ambient at room temperature with $V_S$=0 V.

FIG. 3A: $I_D$-$V_{TG}$ for simultaneous sweeping of $V_{BG}$ with $V_{TG}$ with controlled offsets, showing control of both sides of the antiambipolar response and of the peak position. FIG. 3B: $I_D$-$V_{TG}$ for varied $V_D$, showing that the height of the Gaussian transfer response can be controlled while maintaining the peak position. FIG. 3C: $I_D$-$V_{TG}$ for changing $V_D$ and $V_{TG}$-$V_{BG}$, indicating that the peak position can be controlled while maintaining the height of the Gaussian transfer response. FIG. 3D: $I_D$-$V_{TG}$ comparing dependent and independent gate biasing with an adjusted $V_D$, showing modulation of the FWHM of the Gaussian transfer response while maintaining the height and peak position. All measurements were performed in ambient at room temperature with $V_S$=0 V.

FIG. 4A: Circuit-level equivalent of the Hodgkin-Huxley model. FIG. 4B: Temporal evolution of $g_K$ which can be represented by the delayed turn-on of an NMOS transistor. FIG. 4C: The more complex transient behavior of $g_{Na}$, which can be mimicked using the antiambipolar characteristics of the GHeTs. FIG. 4D: Full circuit diagram for the experimental spiking neuron. FIG. 4E: Experimental results for the first 30 sec based on the GHeT neuron circuit detailed in FIG. 4D. FIG. 4F: From dashed region in FIG. 4E, the neuron spike FWHM is measured to be about 200 ms. Simulations (dashed brown) of the GHeT neuron circuit agree well with the experimental results. All measurements were performed in ambient conditions at room temperature.

FIGS. 5A-5B: For the experimentally demonstrated circuit shown in FIG. 19, FIG. 5A: constant spiking occurs when a constant $I_{syn}$ is applied, and FIG. 5B: spiking frequency increases with increasing $I_{syn}$ to mimic Class-I spiking. FIGS. 5C-5E: Using independent gate operation (see the circuit in FIG. 20), FIG. 5C: spike latency, FIG. 5D: integrator, and FIG. 5E: phasic spiking occur for various $I_{syn}$. FIGS. 5F-5H: Additional minor modifications to the GHeT neuron circuit enable, FIG. 5F: phasic bursting (see the circuit in FIG. 20), FIG. 5G: tonic bursting (see the circuit in FIG. 21), and FIG. 5H: dampened tonic bursting (see the circuit in FIG. 22).

FIG. 7A: Output response of GHeT for $V_{BG}$=6 V and $V_{TG}$=6 V, 0 V, and −6 V. FIG. 7B: Output response of GHeT for $V_{BG}$=−6 V and $V_{TG}$=6 V, 0 V, and −6 V. Note the different y-axis scale.

FIG. 9A: Transfer sweep for $V_{BG}$ from 6 V to −6 V on a linear and FIG. 9B: log scale. FIG. 9C: Zoomed-in version of the transfer response for $V_{BG}$ from −2 V to −6 V on a linear, and FIG. 9D: log scale. FIG. 9E: Full sweep of the transfer response for selected $V_{BG}$ on a linear and f, log scale showing expected hysteresis on the right side from CNTs. The legend in a corresponds to all plots.

FIG. 10A: Transfer sweep for $V_{TG}$ from 6 V to −6 V on a linear and FIG. 10B: log scale. FIG. 10C: Transconductance extracted by calculated the slope of raw data shown in FIG. 10A. While $V_{TG}$ has some electrostatic tunability of the MoS$_2$ response through the porous CNT film (FIG. 2C), $V_{BG}$ has much less electrostatic control over the CNT response because of the continuous MoS$_2$ monolayer. The legend in FIG. 10A corresponds to all plots.

FIG. 11A: Rectification ratio for $V_{TG}$−$V_{BG}$ from −3 V to 3 V with respect to $V_{TG}$, showing tunability over 3 orders of magnitude for all offsets. FIG. 11B: Transfer response with respect to $V_{BG}$, for simultaneous sweeping of both $V_{BG}$ with $V_{TG}$ on a linear scale. FIG. 11C: Transfer response with respect to $V_{TG}$, for simultaneous sweeping of both $V_{BG}$ with $V_{TG}$ on a log scale. The legend in FIG. 11A corresponds to all plots.

FIG. 13A: Optical image of 1 cm×1 cm device array containing ~0.5 cm×0.5 cm area of continuous MoS$_2$. FIG. 13B: Transfer response with respect to $V_{TG}$ for $V_{TG}$−$V_{BG}$=0 V for 14 different GHeTs under identical biasing conditions. Variability can be attributed to non-uniformities in the CNT network or bilayer regions and grain boundaries in the MoS$_2$ film. FIG. 13C: Extracted peak positions and FWHM from Gaussian fits of curves shown in a with an average peak position of −0.42 V±0.55 V and average FWHM of 2.92 V±0.48 V.

FIG. 14A: Circuit schematic that exploits the unique relationship between the GHeT transconductance ($g_m$) and $V_{TG}$ to mimic the time-dependent peaked response of $g_{Na}$. FIG. 14B: Expected behavior of a GHeT as $V_{n1}$−$V_m$ changes. The drain of the GHeT is connected to potential V2, the source is connected to $V_m$ (i.e., the node integrating the synapse current $I_{syn}$), and the two gate-terminals are shorted and connected to the output node n1 of the T1-R1 amplifier. The loop gain from $V_{n1}$−$V_m$ is proportional to −$g_{T1}$×$g_m$. When $V_m$ is zero and $V_{n1}$ is high, the GHeT is in a positive $g_m$ region, so the loop gain of $V_{n1}$-$V_m$ is negative and the circuit rests at a stable operating point (blue). The input of a constant synaptic current, $I_{syn}$, increases $V_m$, (balanced by the leaking resistor, R2). If $I_{syn}$ is adequately high, $V_m$ increases sufficiently to turn on T1, causing $V_{n1}$ to drop. With decreasing $V_{n1}$−$V_m$, $g_m$ becomes negative, and the loop-gain for $V_{n1}$-$V_m$ becomes positive. This condition generates a spike in $V_m$. Finally, with increasing $V_m$, the GHeT again reaches a positive $g_m$, the loop gain becomes negative, and the circuit resets and settles at the onset of the next stability region (green).

FIGS. 17A-17B show experimental neuron spiking controlled by gate offset according to embodiments of the invention. FIG. 17A: Transfer characteristics from the specific device used in experimental circuit demonstration. FIG. 17B: Experimental results for the first 30 seconds from circuit detailed in FIG. 4D. The bias offset, V3, between the $V_{TG}$ and $V_{BG}$ determines the spiking response of the circuit. When the circuit operating region (4 V to −1 V, shaded in FIG. 17A), does not contain both negative and positive $g_m$ values near $I_{PEAK}$ of the Gaussian transfer response (brown and purple), $g_K$ is unable to reset $V_m$ below the threshold of T1 resulting in no spiking. If the operating region contains both negative and positive $g_m$ values near $I_{PEAK}$ of the Gaussian transfer response (red and blue), $g_K$ resets $V_m$ below the threshold of T1, thereby resetting the GHeT. This results in constant spiking for as long as $I_{syn}$ is applied.

FIG. 18A: Experimental data from a prototypical GHeT device used in the simulations. FIG. 18B: Simulations of the spiking neuron circuit to corroborate the experimental results showing that the offset between the gates can be used to suppress the spiking response of the circuit. The circuit parameters vary slightly from those used for the experimental demonstration to account for various non-idealities.

FIG. 25A: Transfer response of a dual-gated $MoS_2$ transistor showing n-type behavior and tunability of threshold voltage. FIG. 25B: Transfer response of a dual-gated CNT transistor showing ambipolar behavior and tunability of threshold voltages. The channel length of both devices is 50 μm. Because of the sub-micron channel length and semi-vertical structure of the GHeT, these measurements can only be used to qualitatively explain heterojunction device behavior. The exact threshold voltages and current levels will be impacted by the shorter channel length, heterojunction interface, and dielectric environment change because of the presence of the other semiconductor.

FIG. 26B: $V_{TG}=0$ V, FIG. 26C: $V_{TG}=4$ V and of a dual-gated CNT transistor for FIG. 26D: $V_{TG}=-4$ V, FIG. 26E: $V_{TG}=0$ V, FIG. 26F: $V_{TG}=4$. Because of the sub-micron channel length and semi-vertical structure of the GHeT, these measurements can only be used to qualitatively explain heterojunction device behavior. The exact threshold voltages and current levels will be impacted by the shorter channel length, heterojunction interface, and dielectric environment change because of the presence of the other semiconductor.

FIG. 28A: Temporal evolution of GHeT source voltage, $V_m$, applied top gate voltage, $V_{TG}$, relative gate bias, $V_{TG}-V_m$, and drain current, $I_D$, during the first 5 seconds of the constant spiking behavior shown in FIG. 4. FIG. 28B: Transconductance and current evolution as a function of gate bias for the GHeT device used in FIGS. 4A-4E. The states of various elements in the circuit for the numbered positions are detailed in Table 1.

FIG. 29A: The FWHM of a given spike increases and the frequency of spiking decreases with increasing capacitance values. FIG. 29B: The FWHM stays fairly constant and the frequency of spiking increases slightly with increasing $I_{syn}$.

DETAILED DESCRIPTION OF THE INVENTION

Figure 1A:
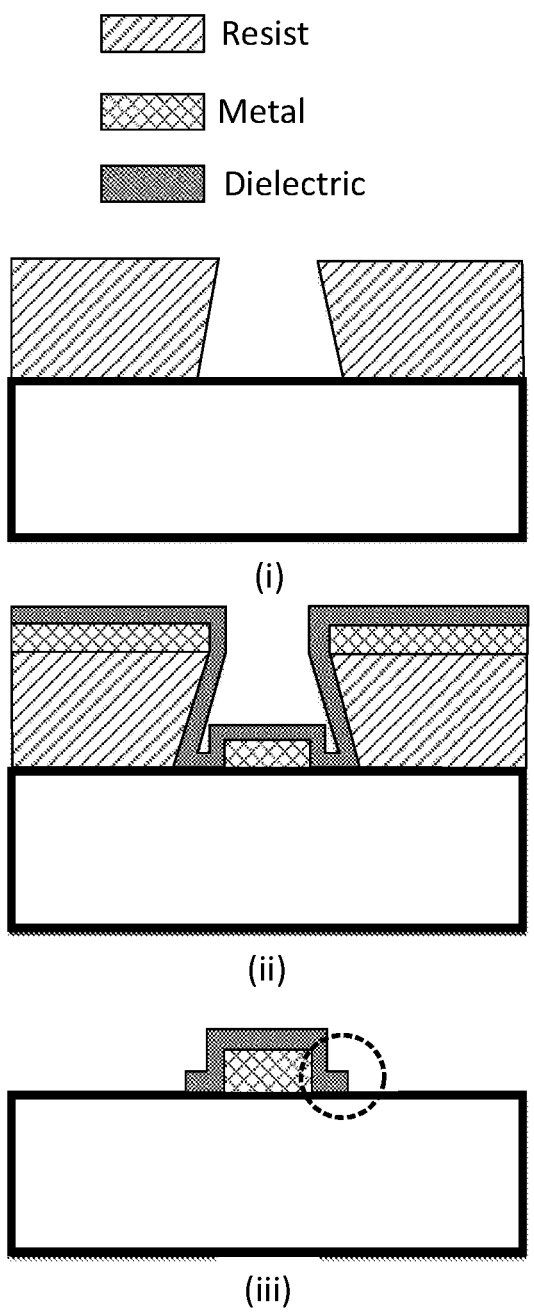
FIGS. 1A-1E show the fabrication of Gaussian heterojunction transistors according to embodiments of the invention.

The invention will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this specification will be thorough and complete, and will fully convey the scope of the invention to those skilled in the art. Like reference numerals refer to like elements throughout.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term are the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or of any exemplified term. Likewise, the invention is not limited to various embodiments given in this specification.

It will be understood that, as used in the description herein and throughout the claims that follow, the meaning of "a", "an", and "the" includes plural reference unless the context clearly dictates otherwise. Also, it will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the figures. For example, if the device in one of the figures. is turned over, elements described as being on the "lower" side of other elements would then be oriented on "upper" sides of the other elements. The exemplary term "lower", can, therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

It will be further understood that the terms "comprises" and/or "comprising," or "includes" and/or "including" or "has" and/or "having", or "carry" and/or "carrying," or "contain" and/or "containing," or "involve" and/or "involving, and the like are to be open-ended, i.e., to mean including but not limited to. When used in this specification, they specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification, and will not be interpreted in an idealized or overly formal sense unless expressly so defined herein.

As used in this specification, "around", "about", "approximately" or "substantially" shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated.

As used in this specification, the phrase "at least one of A, B, and C" should be construed to mean a logical (A or B or C), using a non-exclusive logical OR. As used herein, the term "and/or" includes any and all combinations of one or more of the associated listed items.

The description below is merely illustrative in nature and is in no way intended to limit the invention, its application, or uses. The broad teachings of the invention can be implemented in a variety of forms. Therefore, while this invention includes particular examples, the true scope of the invention should not be so limited since other modifications will become apparent upon a study of the drawings, the specification, and the following claims. For purposes of clarity, the same reference numbers will be used in the drawings to identify similar elements. It should be understood that one or more steps within a method may be executed in a different order (or concurrently) without altering the principles of the invention.

By mimicking the human brain, neuromorphic computing has the potential to realize substantial improvements in computing performance at ultralow power consumption, particularly for artificial intelligence (AI) applications, compared to conventional digital electronics. Among neuromorphic computing architectures, spiking neural networks exploit spatiotemporal processing, spiking sparsity, and high interneuron bandwidth to maximize the energy efficiency of neural processing. Neuron-synapse circuits from conventional silicon-based technology require multiple transistors and complicated layouts that limit integration density.

One of the objectives of this invention is to provide devices with intrinsic neuronal-like responses, which simplify spiking neuron implementation. The devices employ wafer-scale mixed-dimensional van der Waals materials in a semi-vertical, dual-gated geometry resulting in a smaller device footprint and unprecedented electrostatic control of peak position, peak height, and a full-width-half maximum of the Gaussian anti-ambipolar response compared to other anti-ambipolar demonstrations. The fundamental behavior of the Na$^+$ ion channel of a biological neuron is captured by the Gaussian heterojunction transistors in a simple circuit, and by exploiting dual-gated programmability, it is possible to achieve at least eight different biological neuron responses from circuits based on a single Gaussian heterojunction transistor. A competitive silicon-based neuron circuit requires more than twenty transistors to achieve similar biomimetic spiking and input-dependent spike frequency adaptation. More broadly, since silicon-based devices cannot natively mimic the Gaussian response demonstrated here, the tunable Gaussian heterojunction transistors are applicable to hardware-level implementations of other artificial learning paradigms such as natural language processing and computer vision.

In one aspect, the invention relates a Gaussian heterojunction transistor (GHeT). In one embodiment shown in FIGS. 1D-1E, the GHeT includes a bottom gate (BG) electrode formed on a substrate; a first dielectric layer 121 formed on the bottom gate electrode; a monolayer film 130 formed of an atomically thin material on the first dielectric layer 121; a bottom contact (BC) formed on a part of the monolayer film 130; a second dielectric layer 123 formed on the bottom contact; a top contact (TC) formed on the second dielectric layer 123 on the top of the bottom contact; a network of carbon nanotubes (CNTs) 140 formed on the top contact and the monolayer film 130, so as to define an overlap region 150 with the monolayer film 130; a third dielectric layer 125 formed on the CNT network 140, the monolayer film 130 and the top contact over the substrate; and a top gate electrode formed on the third dielectric layer 125 and overlapping with the overlap region 150.

In one embodiment, the atomically thin material comprises two-dimensional (2D) semiconductor material. In one embodiment, the 2D semiconductor material comprises $MoS_2$, $MoSe_2$, $WS_2$, $WSe_2$, InSe, GaTe, black phosphorus (BP), or related 2D materials.

In one embodiment, the bottom and top gate electrodes and the bottom and top contacts comprise a same conductive material or different conductive materials. In one embodiment, each of the bottom and top gate electrodes and the bottom and top contacts is formed of gold (Au), titanium (Ti), aluminum (Al), nickel (Ni), chromium (Cr), or other conductive materials.

In one embodiment, the first, second and third dielectric layers comprise a same dielectric material or different dielectric materials. In one embodiment, each of the first, second and third dielectric layers is formed of $Al_2O_3$, $HfO_2$, $ZrO_2$, ZnO, $SiO_2$, or dielectrics including alumina, hafnia, or zirconia.

In one embodiment, the top and bottom gates are configured to modulate a diode rectification ratio.

In one embodiment, the top gate operably modulates an output response of the GHeT from a rectifying diode at a first top gate voltage to an inverted polarity rectifying diode at a second top gate voltage.

In one embodiment, the GHeT is configured to have operably band-to-band tunneling between the atomically thin material and the CNTs.

In one embodiment, the GHeT is configured to operate in a dependent biasing scheme to combine modulation of the CNTs by the top gate and modulation of the atomically thin material by the bottom gate, thereby resulting in enhanced electrostatic control of a device response.

In one embodiment, the GHeT is configured to have a tunable Gaussian transfer response in a single heterojunction device.

In one embodiment, the GHeT is configured to have an antiambipolar response that is tunable, so as to enable a variety of applications including Hodgkin-Huxley (HH) spiking neurons.

In one embodiment, multiple biological spiking neuron responses are achievable with GHeT-based circuits.

In another aspect, the invention relates to a GHeT comprising at least one mixed-dimensional van der Waals heterojunction comprising a monolayer film formed of an atomically thin material, and a network of CNTs.

In one embodiment, the atomically thin material comprises a 2D semiconductor material. In one embodiment, the 2D semiconductor material comprises $MoS_2$, $MoSe_2$, $WS_2$, $WSe_2$, InSe, GaTe, BP, or related two-dimensional materials.

In yet another aspect, the invention relates to a circuit comprising at least one GHeT disclosed above.

In one embodiment, the circuit further comprises a Schmitt Trigger circuit coupled with the at least one Gaussian heterojunction transistor.

In a further aspect, the invention relates to a device comprising at least one GHeT disclosed above.

In one embodiment, the device further comprises a Schmitt Trigger circuit coupled with the at least one Gaussian heterojunction transistor.

In one embodiment, the device is configured to mimic intrinsic neuronal-like responses.

In one aspect, the invention relates to a method for fabricating a GHeT. The method in one embodiment shown in FIGS. 1D-1E comprises fabricating a self-aligned bottom gate having a bottom gate (BG) electrode formed on a substrate, and a first dielectric layer 121 formed on the bottom gate electrode; transferring a monolayer 130 of an atomically thin material onto the self-aligned bottom gate and patterned using reactive ion etching (RIE); fabricating a self-aligned bottom contact (BC) on the monolayer 130 followed by patterning and growth of a dielectric layer as an etch mask on part of the monolayer 130; wherein the self-aligned bottom contact has a bottom contact electrode and a second dielectric layer 123 formed on the bottom contact electrode; depositing a top contact (PC) on the top of the bottom contact followed by transfer of a network of CNTs 140 over the substrate, after which the RIE is performed to define an overlap region 150 of the CNT network 140 with the monolayer 130, the overlap region 150 being a junction region; growing a third dielectric layer 125 over the substrate; and forming a top gate (TG) on the third dielectric layer 125 at least over the junction region 150.

In one embodiment, the monolayer of the atomically thin material is grown by chemical vapor deposition (CVD), mechanical exfoliation, metal-organic chemical vapor deposition (MOCVD), or atomic layer deposition (ALD).

In one embodiment, each of the self-aligned bottom gate and self-aligned bottom contact is fabricated with an undercut profile in developed negative photoresist combined with directional metal evaporation and conformal atomic layer deposition (ALD) of a dielectric oxide resulting in an encapsulated metal electrode with a self-aligned dielectric extension, as shown in FIG. 1A.

In one embodiment, each of the first, second and third dielectric layers is formed by ALD. In one embodiment, the first, second and third dielectric layers comprise a same dielectric material or different dielectric materials. In one embodiment, each of the first, second and third dielectric layers is formed of $Al_2O_3$, $HfO_2$, $ZrO_2$, ZnO, $SiO_2$, or dielectrics including alumina, hafnia, or zirconia.

In one embodiment, the atomically thin material comprises a 2D semiconductor material. In one embodiment, the 2D semiconductor material comprises $MoS_2$, $MoSe_2$, $WS_2$, $WSe_2$, InSe, GaTe, BP, or related two-dimensional materials.

In another aspect, the invention relates to a circuit for spiking neuron. As shown in FIGS. 4A-4D, 15, and 19-23, the circuit comprises at least one GHeT; first and second transistors T1 and T2 coupled to the GHeT; and a number of passive elements including first and second resistors R1 and R2 and first and second capacitors C1 and C2, which are configured such that the GHeT and circuit components T1-R1-C1 operably emulate conductance of a $Na^+$ ion channel ($g_{Na}$), while circuit components T2-R2-C2 operably emulate conductance of a $K^+$ ion channel ($g_k$).

In some embodiments, the first transistor T1 and the first resistor R1 define a T1-R1 amplifier having an output node n1, wherein first resistor R1 has a first terminal electrically connected to potential V1 and a second terminal electrically connected to the output node n1, and the first transistor T1 has a gate electrically connected to a node n0 at potential $V_m$, a drain electrically connected to the output node n1, and a source electrically connected to a ground node, and the node n0 integrates a synapse current $I_{syn}$. The first capacitor C1 have a first terminal electrically connected to the node n0, and a second terminal electrically connected to the ground node. The second transistor T2 has a gate, a drain electrically connected to the synapse current $I_{syn}$, and a source electrically connected to the ground node. The second resistor R2 has a first terminal electrically connected to the synapse current $I_{syn}$, and a second terminal electrically connected to the gate of the second transistor T2. The second capacitor C2 has a first terminal electrically connected to the gate of the second transistor T2, and a second terminal electrically connected to the ground node.

Figure 4A:
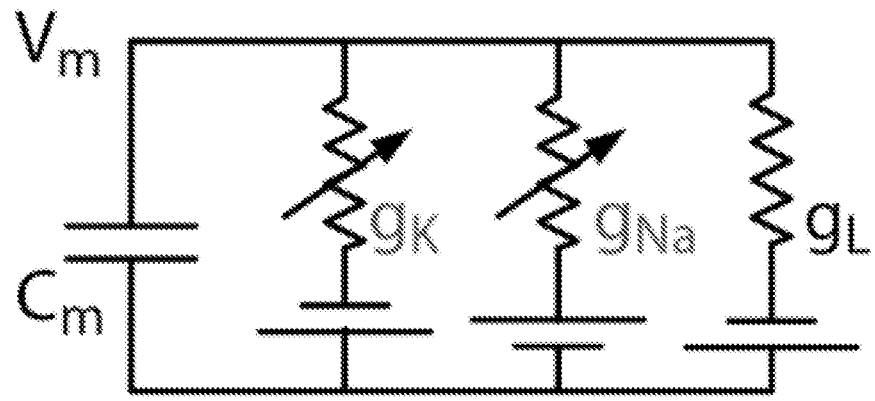
FIGS. 4A-4F show the Hodgkin-Huxley spiking neuron using a Gaussian heterojunction transistor according to embodiments of the invention.
Figure 4B:
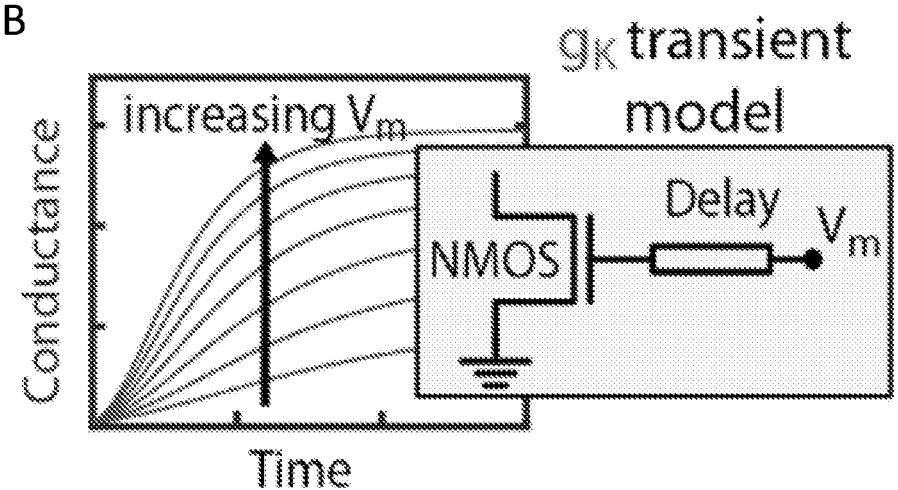
Figure 4C:
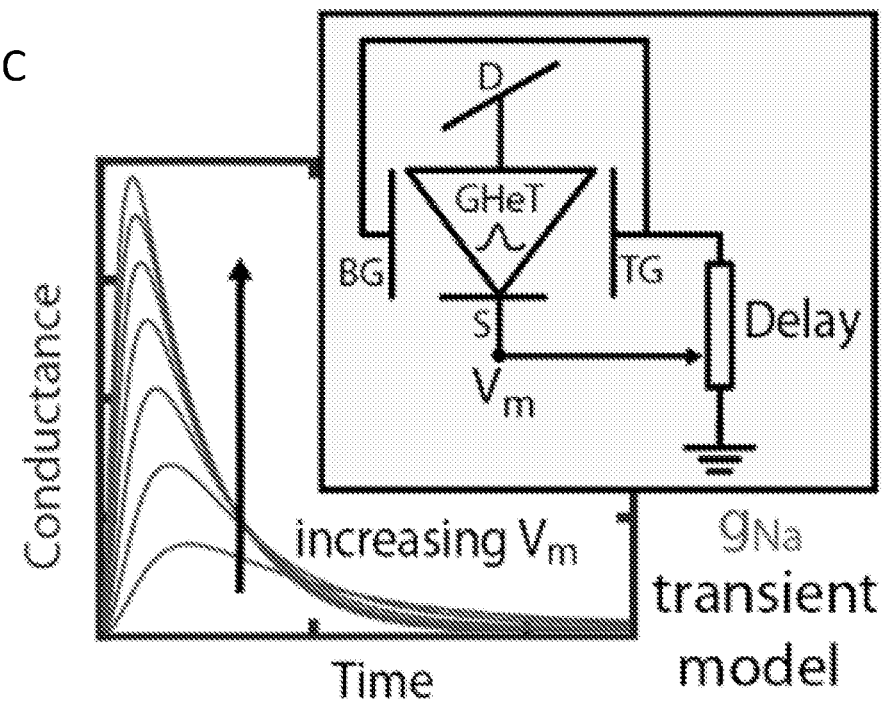
Figure 4D:
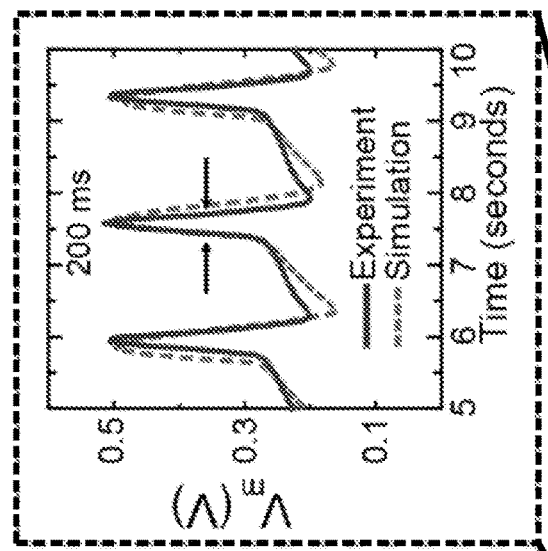
Figure 19:
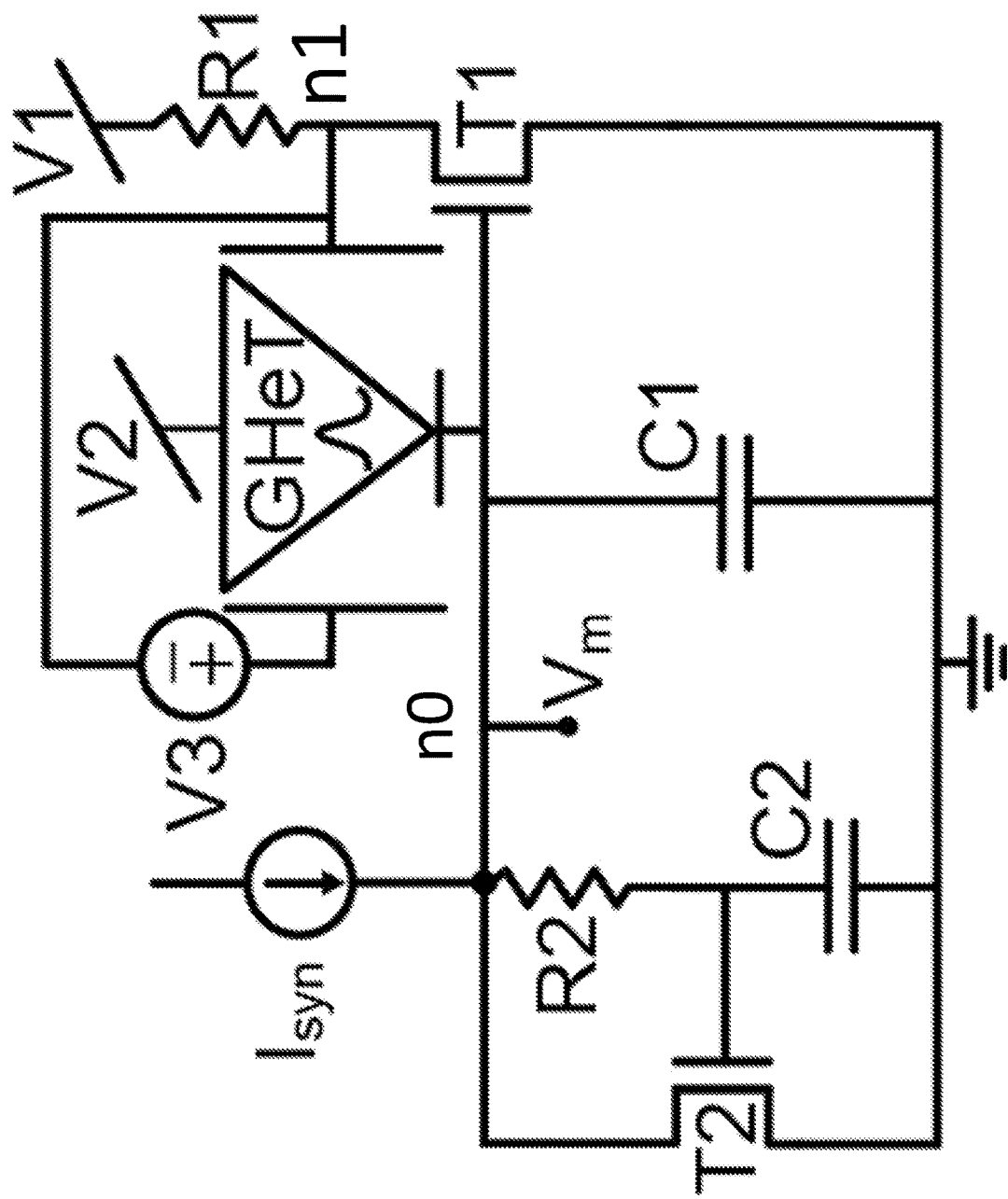
FIG. 19 shows a circuit for constant and class I spiking according to embodiments of the invention. Constant spiking is achieved using a 40 nA synapse current pulse for 25 sec (FIG. 5A). If the synapse current is increased linearly from 0 nA to 80 nA over 75 sec (FIG. 5B), class I spiking occurs. This circuit design matches the experimental demonstration of constant spiking.
Figure 20:
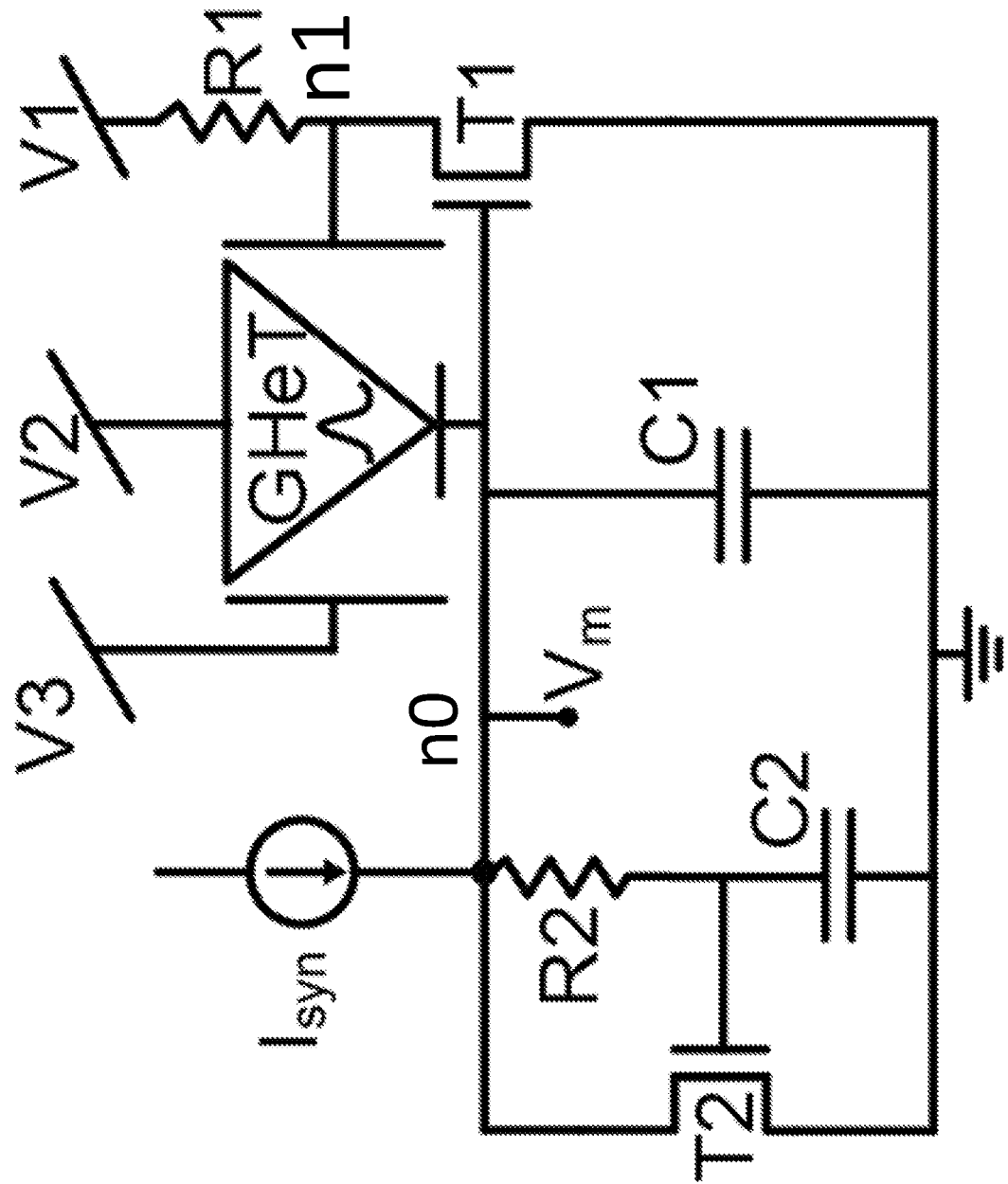
FIG. 20 shows a circuit for spike latency, integrator, and phasic spiking according to embodiments of the invention. The circuit has been modified from FIG. 19 to allow independent biasing of the bottom gate of the GHeT. A bottom gate bias (V3) of 2.5 V enables spike latency for 0.4-sec synapse pulse of 50 nA (FIG. 5C) and integration of spikes when 0.4-sec synapse pulses of 35 nA are within 0.3 sec of each other (FIG. 5D). Phasic spiking occurs by biasing V3 at 3.1 V using a 40 nA synapse pulse for 25 sec (FIG. 5E).

In certain embodiments shown in FIGS. 4D and 19, bottom and top gates of the GHeT are electrically connected to a bias voltage V3 for providing a bias offset between the bottom and top gates. The top gate of the GHeT is electrically connected to the output node n1. A drain of the GHeT is electrically connected to potential V2. A source of the GHeT is electrically connected to the node n0 that integrates the synapse current $I_{syn}$. In one embodiment shown in FIG. 4D, the circuit further comprises voltage sources V4 and V5 electrically connected at the sources of the first and second transistors T1 and T2, respectively, to allow threshold voltage programmability for the field-effect transistors.

Figure 15:
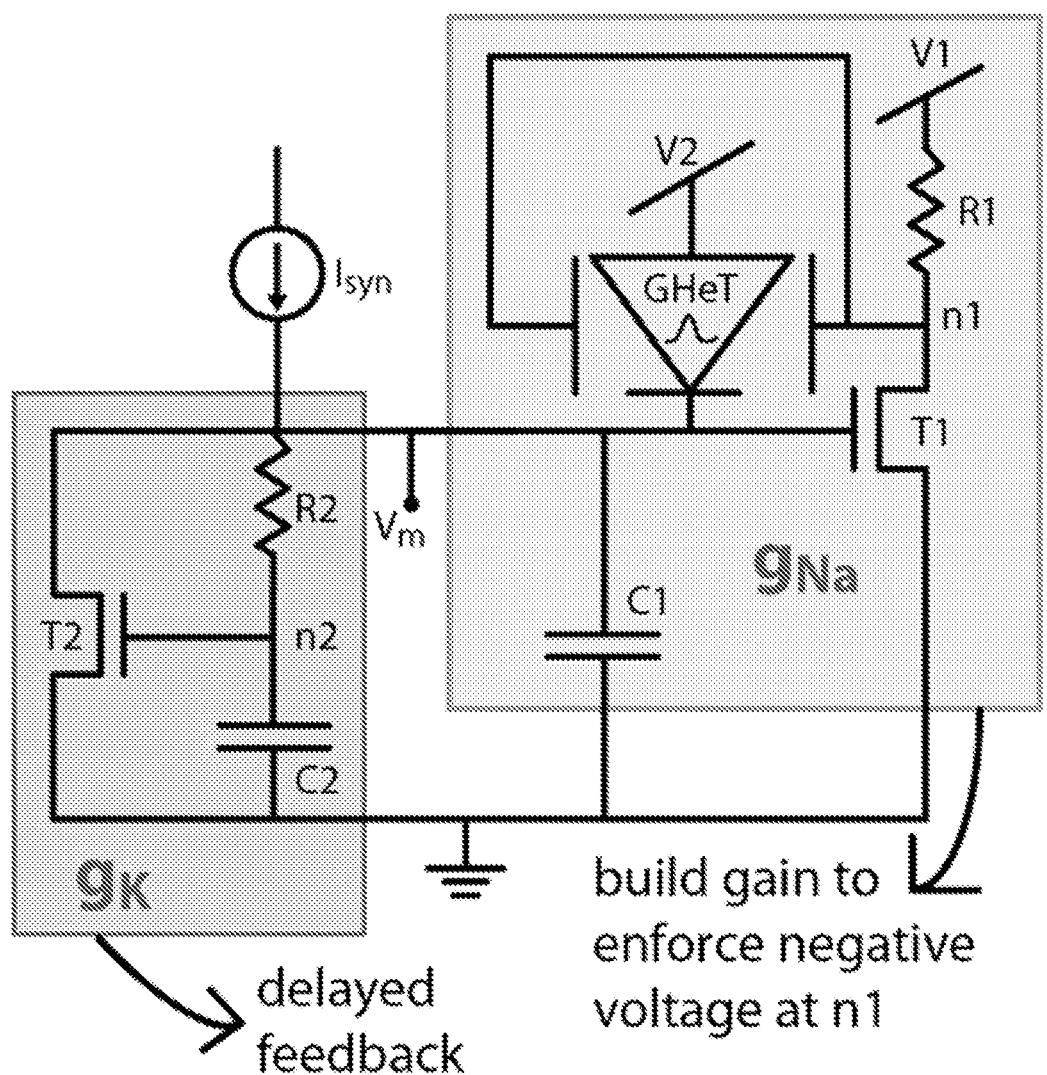
FIG. 15 shows a GHeT-based spiking neuron circuit according to embodiments of the invention. The GHeT device along with T1-R1-C1 emulates the Na$^+$ ion channel conductance ($g_{Na}$) while T2-R2-C2 emulates the K$^+$ ion channel conductance ($g_K$). In this circuit, the conductivity of GHeT is exploited for negative gate-to-source bias to induce spiking. The gates of the GHeT device are controlled using a common source (CS) amplifier (formed by T1-R1) negative gain stage. For sufficiently high synapse current ($I_{syn}$), load C1 integrates the $I_{syn}$ and OFF current from the GHeT ($I_{OFF}$) (i.e., source bias of GHeT ($V_m$) increases with time with a slope proportional to $I_{syn}+I_{OFF}$). The potential $V_m$, in turn, biases the CS stage as well as the delayed feedback stage. As $V_m$ exceeds the threshold voltage of T1, voltage applied to the gates of the GHeT is pulled down due to the negative gain of the CS stage ($V_{n1}=-g_{m,T1} \times V_m$), resulting in negative gate-to-source voltage across the GHeT ($V_{GS}=-g_{m,T1} \times V_m - V_m$). This forces GHeT to conduct maximum current ($I_{PEAK}$), increasing the slope of $V_m$ in proportion to ($I_{syn}+I_{PEAK}$). As $V_m$ continues to increase, $V_{TG}-V_m$ continues to decrease, accessing the positive $g_m$ of the GHeT and $V_{n2}$ exceeds the T2 threshold voltage, allowing $g_K$ to initiate and reset $V_m$.

In one embodiment shown in FIG. 15, bottom and top gates of the GHeT are electrically shorted and electrically connected to the output node n1. A drain of the GHeT is electrically connected to potential V2. A source of the GHeT is electrically connected to the node n0 that integrates the synapse current $I_{syn}$.

In some embodiments shown in FIGS. 20-23, a top gate of the GHeT is electrically connected to the output node n1. A bottom gate of the GHeT is electrically connected to a bias voltage V3. A drain of the GHeT is electrically connected to potential V2. A source of the GHeT is electrically connected to the node n0 that integrates a synapse current $I_{syn}$.

Figure 21:
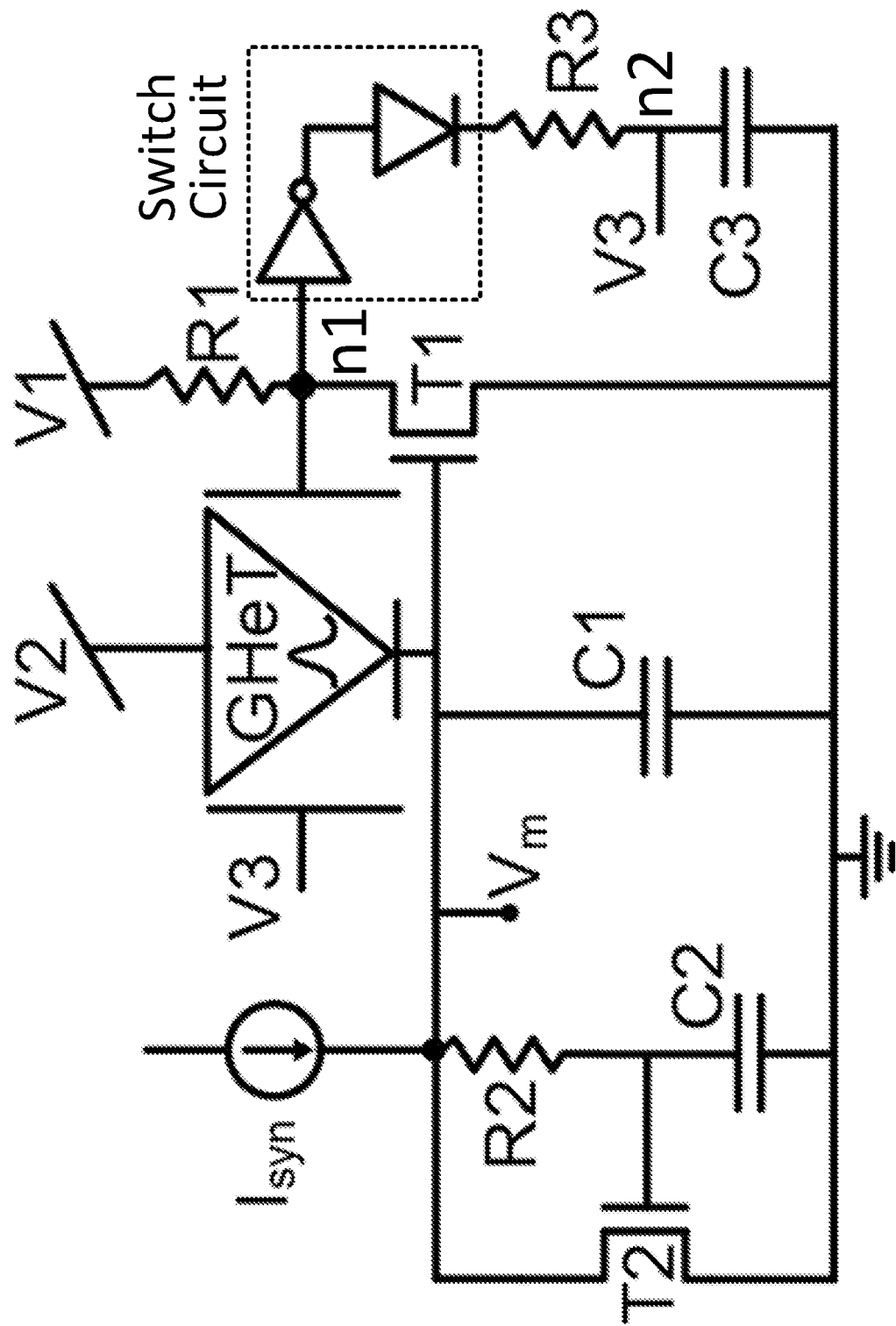
FIG. 21 shows a circuit for phasic bursting according to embodiments of the invention. For phasic bursting, the loss of the positive $g_m$ for independent gate biasing above $V_{BG}=3.5$ V (FIGS. 9A-9F) is exploited by controlling the bias at V3 through controlled, spiking dependent charging of C3 (FIG. 5F).

In one embodiment shown in FIG. 21, the circuit further comprises a third resistor R3 and a third capacitor C3, where the third resistor R3 has a first terminal electrically coupled, via a switch circuit, to the output node n1, and a second terminal electrically connected to a common node n2, and the third capacitor C3 has a first terminal electrically connected to the common node n2, and a second terminal electrically connected to the ground node. In the embodiment shown in FIG. 21, the common node n2 is eclectically connected to the bias voltage V3.

Figure 22:
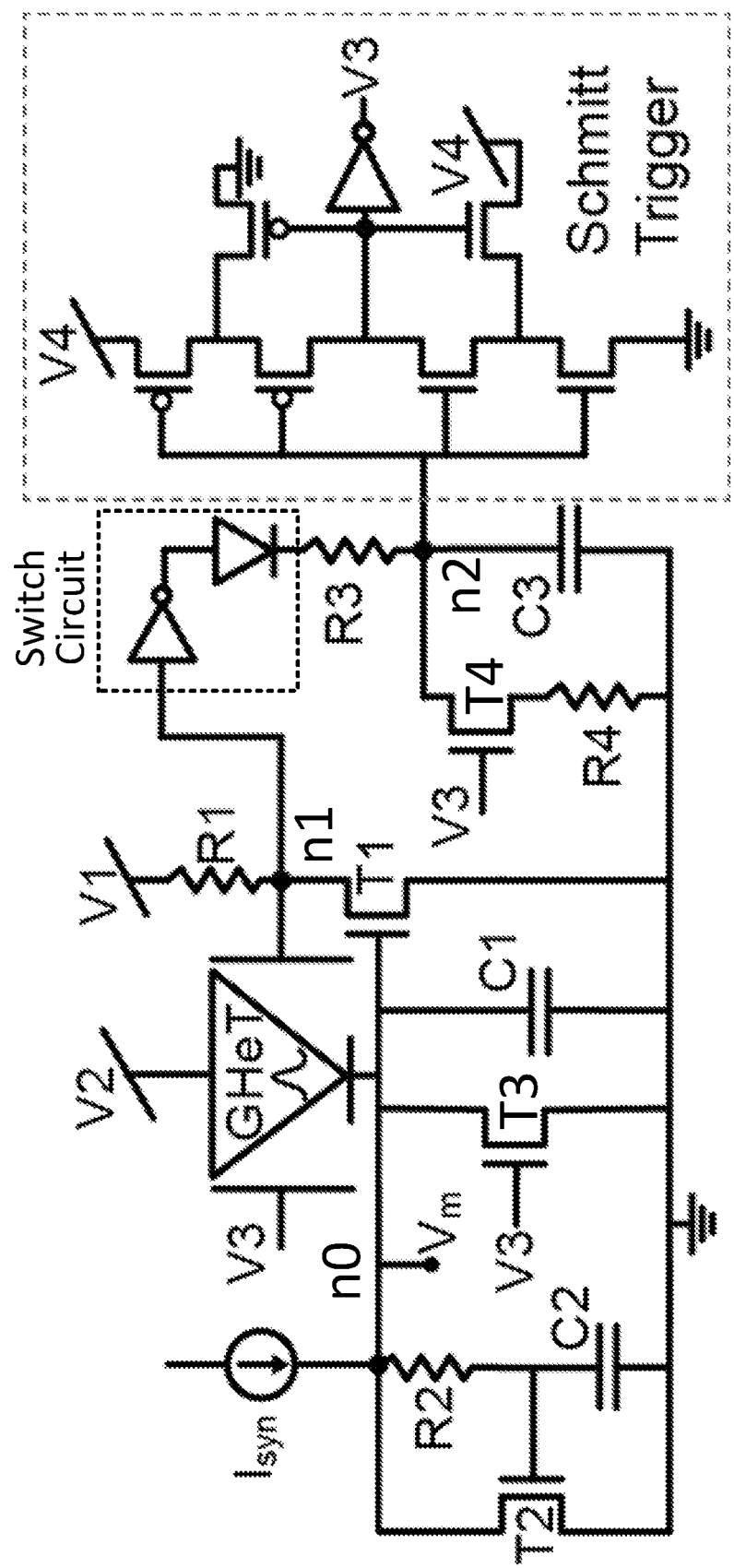
FIG. 22 shows a circuit for tonic bursting according to embodiments of the invention. In addition to spiking-dependent charging of C3, a Schmitt Trigger circuit and two additional transistors are incorporated to control the biasing at V3, thus enabling tonic bursting (FIG. 5G).

In one embodiment shown in FIG. 22, the circuit further comprises a third transistor T3 having a gate electrically connected to the bias voltage V3, a drain electrically connected to the node n0, and a source electrically connected to the ground node; a fourth transistor T4 having a gate electrically connected to the bias voltage V3, a drain electrically connected to the common node n2, and a source; a fourth resistor R4 having a first terminal electrically connected to the source of the fourth transistor T4, and a second terminal electrically connected to the ground node; and a Schmitt trigger circuit electrically connected to the common node n2.

Figure 23:
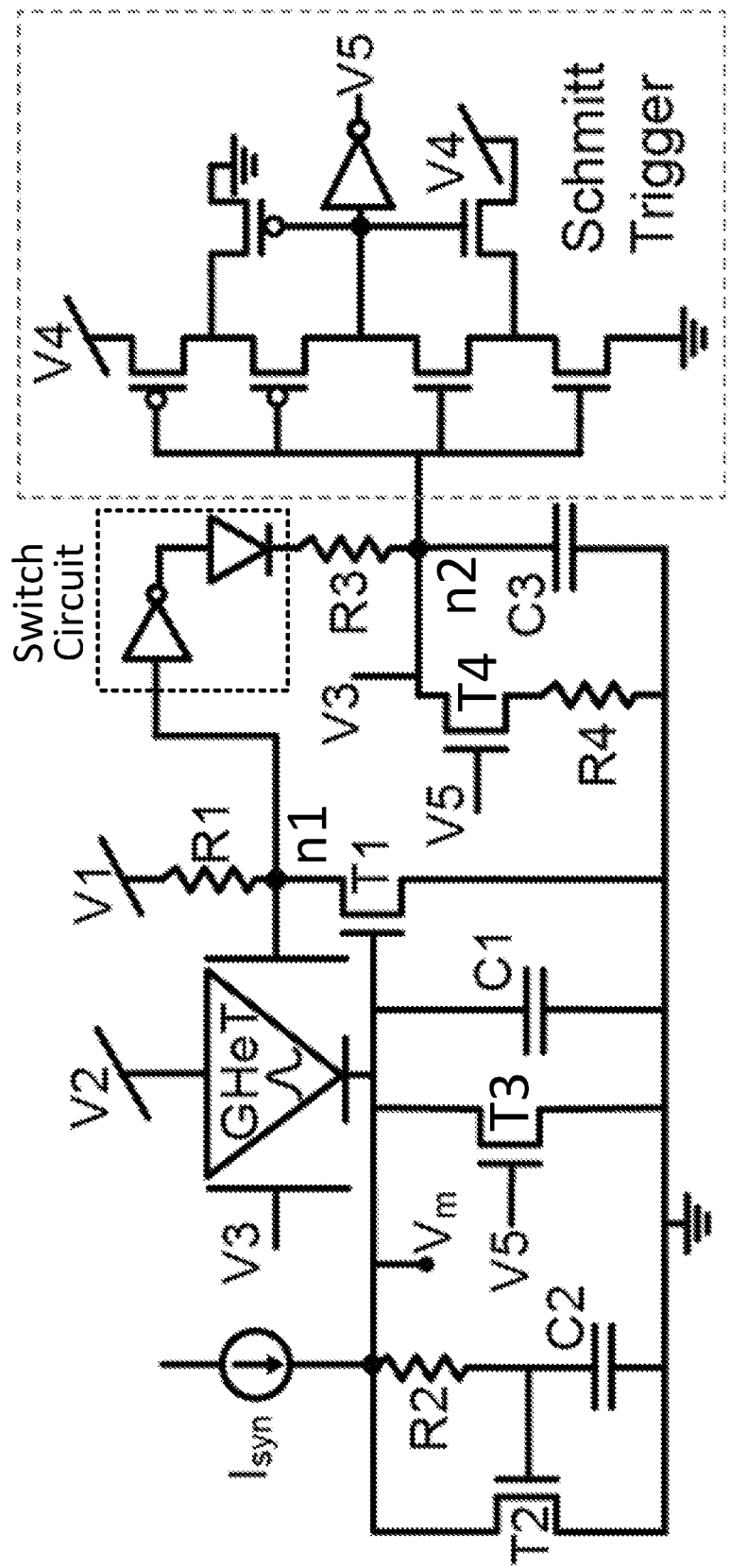
FIG. 23 shows a circuit for dampened tonic bursting according to embodiments of the invention. Compared to FIG. 22, here, V3 is directly connected to C3, causing the bottom-gate bias to gradually increase as the spiking burst occurs, thereby reducing the positive $g_m$ of the GHeT. This condition results in a dampening of the spiking response (FIG. 5H).

In one embodiment shown in FIG. 23, the circuit further comprises a third transistor T3 having a gate electrically connected to voltage V5, a drain electrically connected to the node n0, and a source electrically connected to the ground node; a fourth transistor T4 having a gate electrically connected to the voltage V5, a drain electrically connected to the bias voltage V3 that is in turn electrically connected to the common node n2, and a source; a fourth resistor R4 having a first terminal electrically connected to the source of the fourth transistor T4, and the ground node; and a second terminal electrically connected to the ground node; and a Schmitt trigger circuit electrically connected to the common node n2.

Certain aspects of the invention also relate to a circuit for tonic bursting, comprising: a spiking neuron circuit comprising at least one GHeT; and a Schmitt Trigger circuit coupled with field-effect transistors for enabling tonic bursting.

To further illustrate the principles of the invention and their practical applications, certain exemplary embodiments of the invention are described below with reference to the accompanying drawings.

Figure 1B:
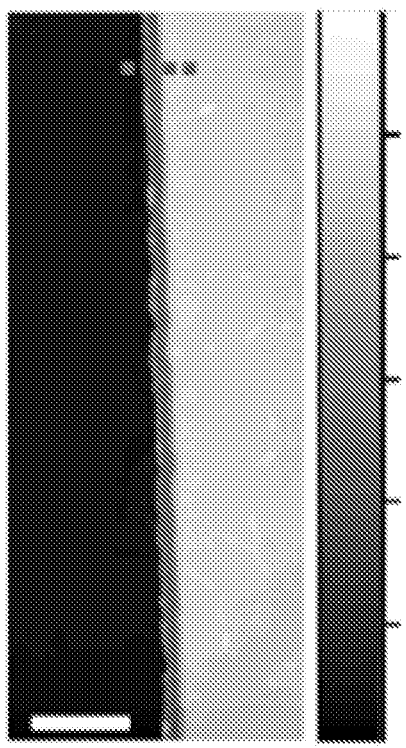
Figure 1C:
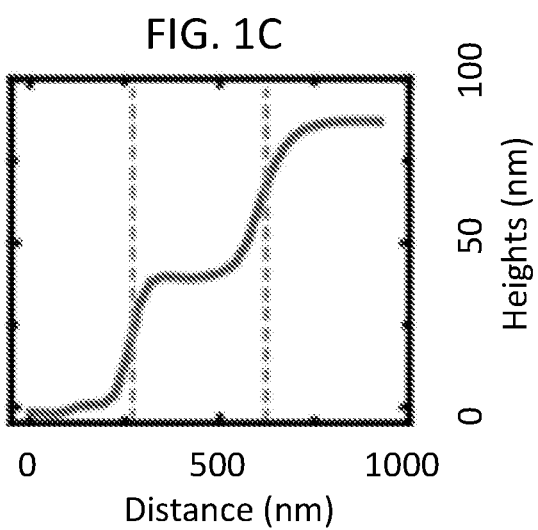

In certain embodiments, monolayer $MoS_2$ was specifically selected as the n-type materials for the p-n heterojunction because of its atomically thin nature, processing stability, and large-area compatibly via chemical vapor deposition. Solution-processed CNTs were the ideal candidate for the second semiconducting material because of their p-type/ambipolar characteristics, ability to conform over arbitrary surfaces, and desired band alignment with $MoS_2$. Therefore, a recently reported self-alignment method was adapted to large-area photolithography to enable the fabrication dual-gated GHeTs. As shown in FIG. 1A, the undercut profile (i) in developed negative photoresist combined with (ii) directional metal evaporation and conformal atomic layer deposition (ALD) of a dielectric oxide results in an encapsulated metal electrode with a self-aligned dielectric extension (iii). Atomic force microscopy (AFM) is used to evaluate both the quality and length of the dielectric extension, as shown in FIG. 1B. The height profile in FIG. 1C corresponding to the dashed line in FIG. 1B shows a sub-exposure-wavelength dielectric extension of about 300 nm. The steps in the height profile correspond to the ALD $Al_2O_3$ (about 35 nm) and metal electrode (about 50 nm).

Figures 1D, 1E:
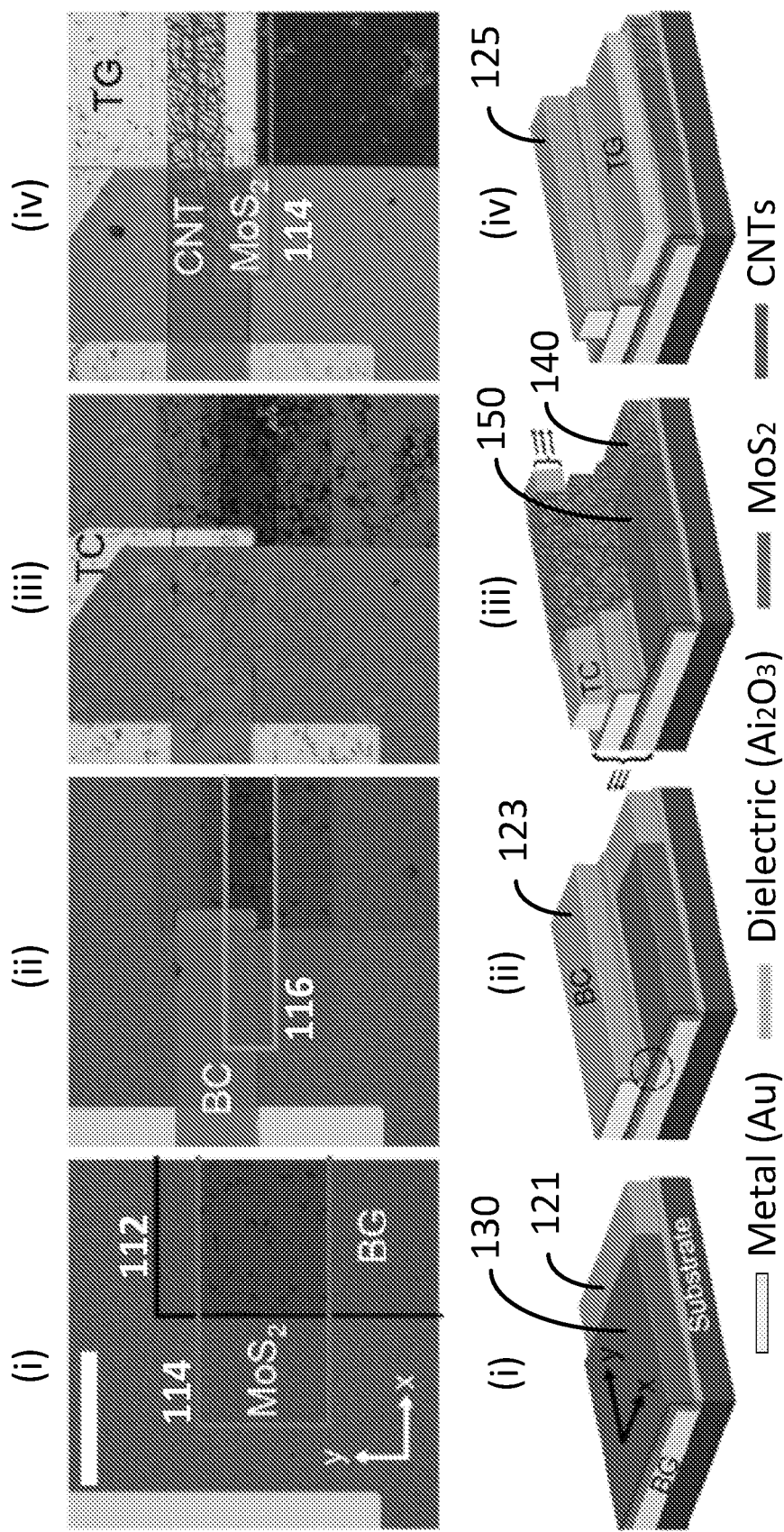
Figure 6:
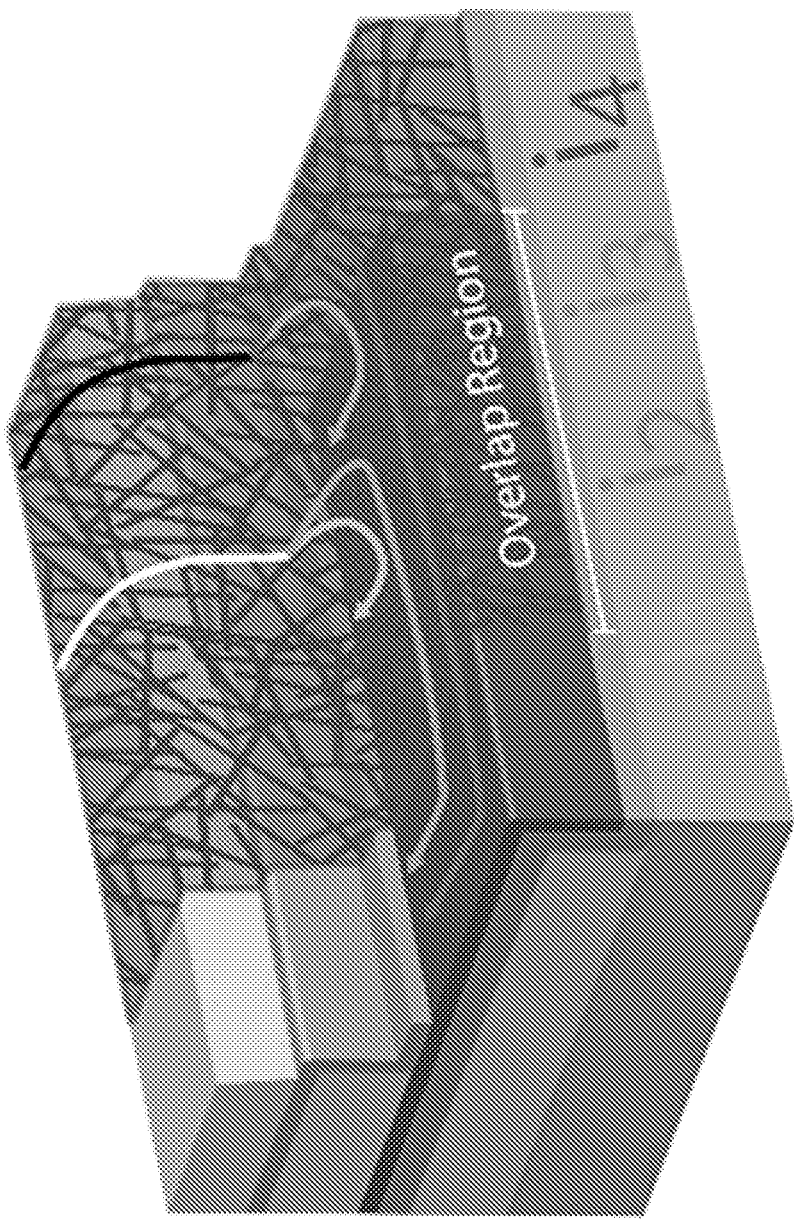
FIG. 6 shows charge transport paths in GHeTs according to embodiments of the invention. The intentional offset between the MoS$_2$ (pink) and CNT (purple) semiconducting regions results in multiple charge transport paths with two possible current paths originating from the top contact at the overlap region (white) and the other two possible paths originating from the top contact away from the overlap region (black). The first current path ($i_1$, blue) is contained entirely in the overlap region, proceeding from the CNTs vertically down into the MoS$_2$. Note that this is the shortest path with a total device channel length <1 μm (twice the dielectric extension of 300 nm plus the bottom (85 nm) and top (80 nm) contact heights). The second current path ($i_2$, green) starts with ii but proceeds vertically down into the MoS$_2$ and then laterally out of the overlap region. The third current path ($i_3$, orange) starts in the CNTs away from the overlap region and then proceeds laterally through the CNT film into the overlap region and vertically down into the MoS$_2$ film. The final current path ($i_4$, red) starts with $i_3$ but proceeds vertically down into the MoS$_2$ and then laterally out of the overlap region.
Figure 24:
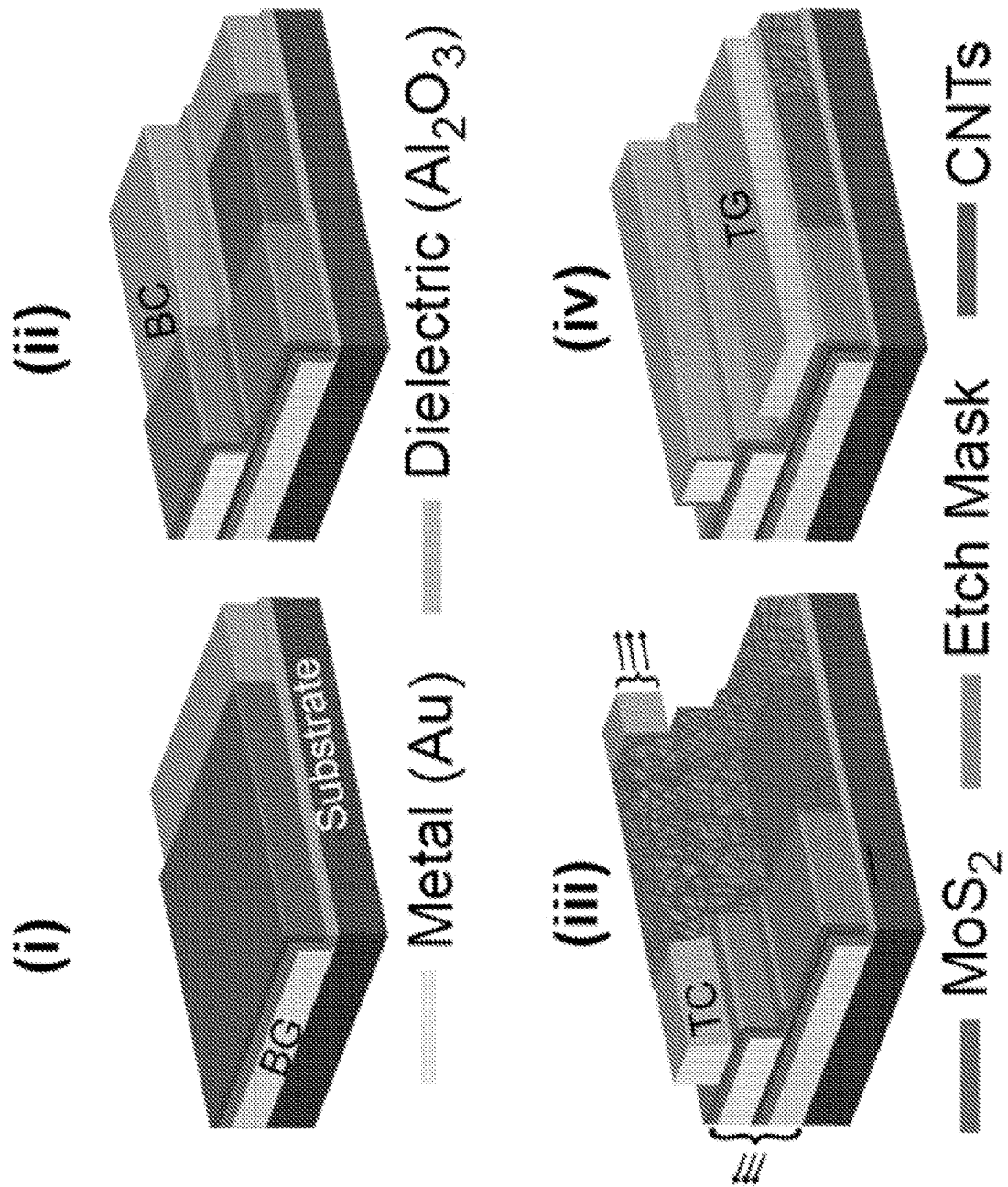
FIG. 24 show the full device structure through fabrication according to embodiments of the invention. (i) $MoS_2$ is transferred onto the self-aligned bottom gate (BG) and etched. (ii) Self-aligned bottom contact (BC) is deposited on $MoS_2$ followed by the few nm $Al_2O_3$ etch mask. (iii) Top contact (TC) is deposited on the BC followed by semiconducting single-walled carbon nanotube (CNT) network transfer and etching. (iv) Atomic layer deposition (ALD) $Al_2O_3$ is used to cover the entire device structure, after which the top gate (TG) is deposited and patterned.
Figure 25B:
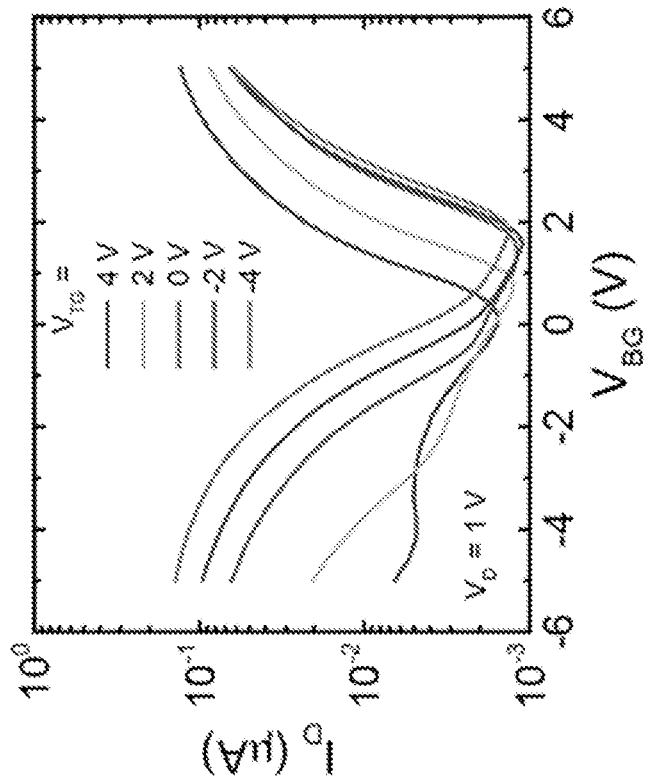
FIGS. 25A-25B show the transfer characterization of control transistors according to embodiments of the invention.
Figure 25A:
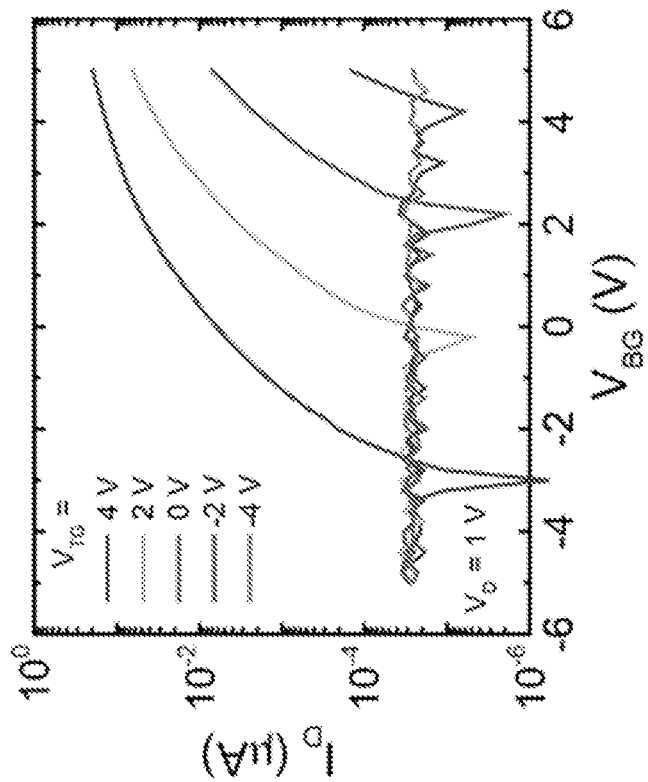
Figure 26A:
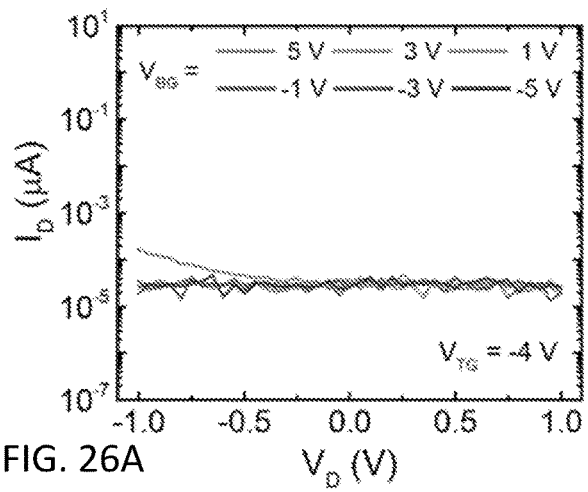
FIGS. 26A-26F show the output characterization of control transistors according to embodiments of the invention. Output response of a dual-gated $MoS_2$ transistor for FIG. 26A: $V_{TG}=-4$ V.
Figure 26D:
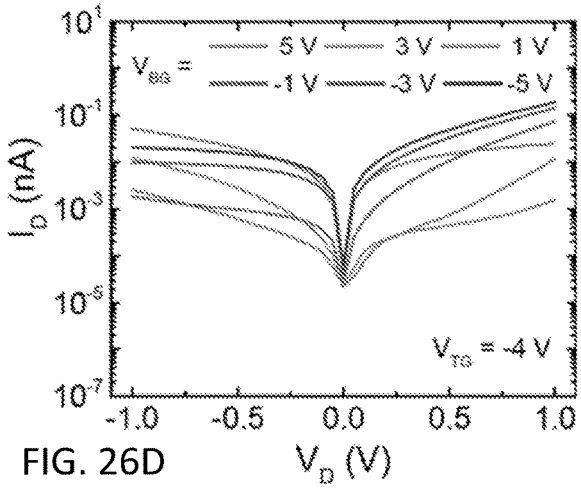
Figure 26B:
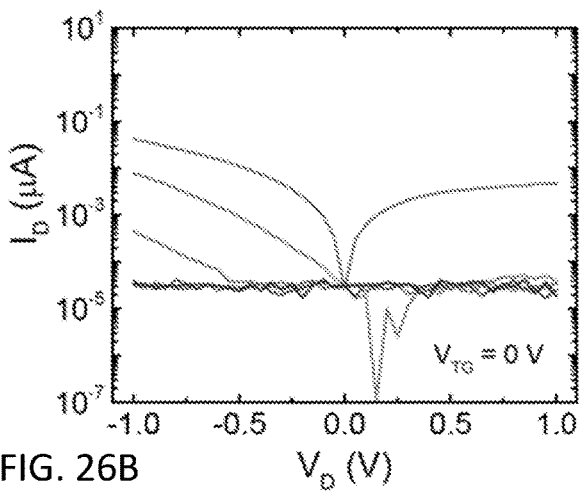
Figure 26E:
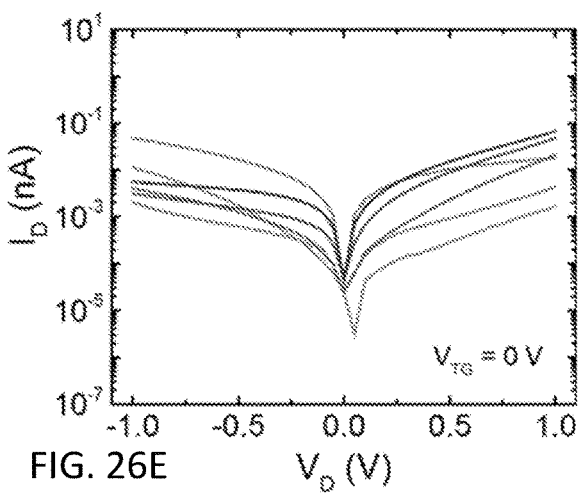
Figure 26C:
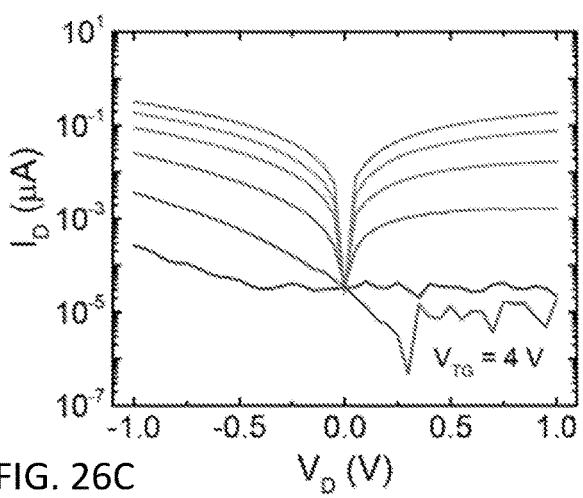
Figure 26F:
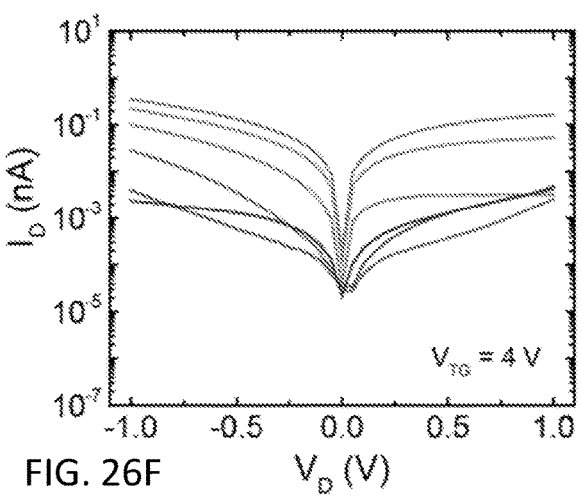

Optical micrographs of the fabrication process are shown in FIG. 1D. (i) CVD-grown monolayer $MoS_2$ is transferred onto a self-aligned local bottom gate (BG, outlined in black 112) and patterned (outlined in pink 114) using reactive ion etching (RIE). It should be appreciated that the overall concept and architecture is also compatible with similar monolayer materials obtained by mechanical exfoliation, metal-organic chemical vapor deposition (MOCVD), and atomic layer deposition (ALD). (ii) A self-aligned bottom contact (BC) is then fabricated on $MoS_2$ followed by an additional patterning and growth of a thin $Al_2O_3$ dielectric (outlined in green 116, distinct from the self-aligned $Al_2O_3$ dielectric layer 123) on part of the $MoS_2$ to act as an etch mask for subsequent RIE processing. (iii) The metal top contacts (TC) are then deposited directly on the top of the BC followed by transfer of a network of semiconducting single-walled carbon nanotubes (CNTs) over the entire substrate, after which RIE is used to define the CNT network (purple lines 140) with a deterministic overlap of the $MoS_2$ region. (iv) Finally, an $Al_2O_3$ dielectric layer 125 is grown via ALD over the entire substrate, and local top gates are patterned over the junction region 150. Three-dimensional renderings of the fabrication process shown in FIG. 1E corresponds to: (i) $MoS_2$ is transferred onto the bottom gate (BG) and etched; (ii) Bottom contact (BC) is deposited on $MoS_2$ (dielectric extension in dashed circle, green etch mask not shown); (iii) Top contact (TC) is deposited on the BC followed by semiconducting CNT network transfer and etching. (iv) ALD $Al_2O_3$ layer 125 is used to cover the entire device structure, after which the top gate (TG) is deposited and patterned. Note, the ALD etch mask outlined in green in FIG. 1D (ii) is intentionally not shown in FIG. 1E to better illustrate the self-aligned and semi-vertical device architecture but is shown in FIG. 24. In this dual-gated semi-vertical device, the multiple current paths through the semiconducting materials increase the versatility of device operation, as shown in FIG. 6.

Dual-gated control transistors from the constituent semiconductors were characterized to affirm the desired individual material properties. Transfer and output measurements of the 50 μm $MoS_2$ and CNT dual-gated devices are shown in FIGS. 25A-25B and 26A-26F. The $MoS_2$ devices exhibit n-type behavior while the CNT devices exhibit ambipolar behavior. Both materials show dual gate tunability of threshold voltages, indicating that the heterojunction should also exhibit dual-gate tunable diode properties and the desired antiambipolar response.

Figure 7A:
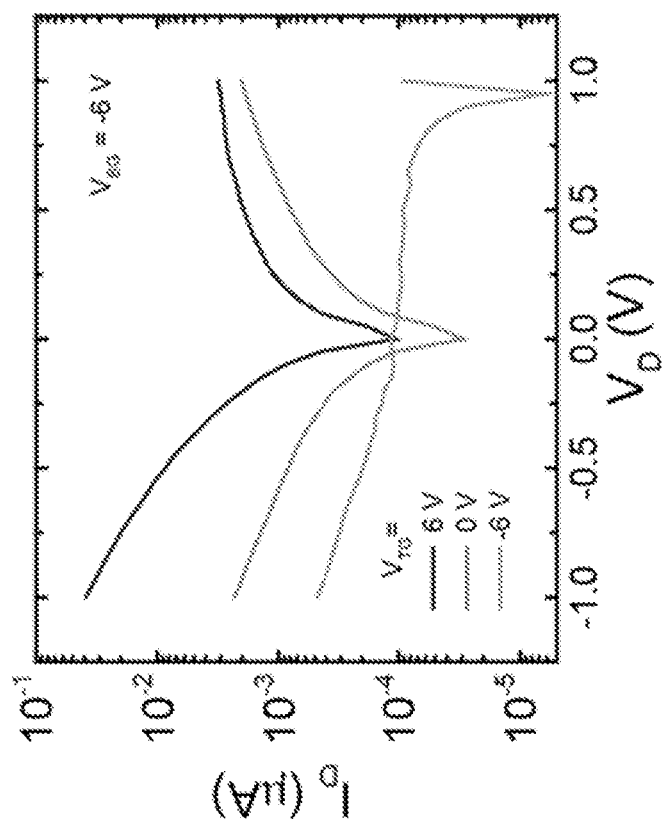
FIGS. 7A-7B show output responses for independent dual-gate operation according to embodiments of the invention.
Figure 7B:
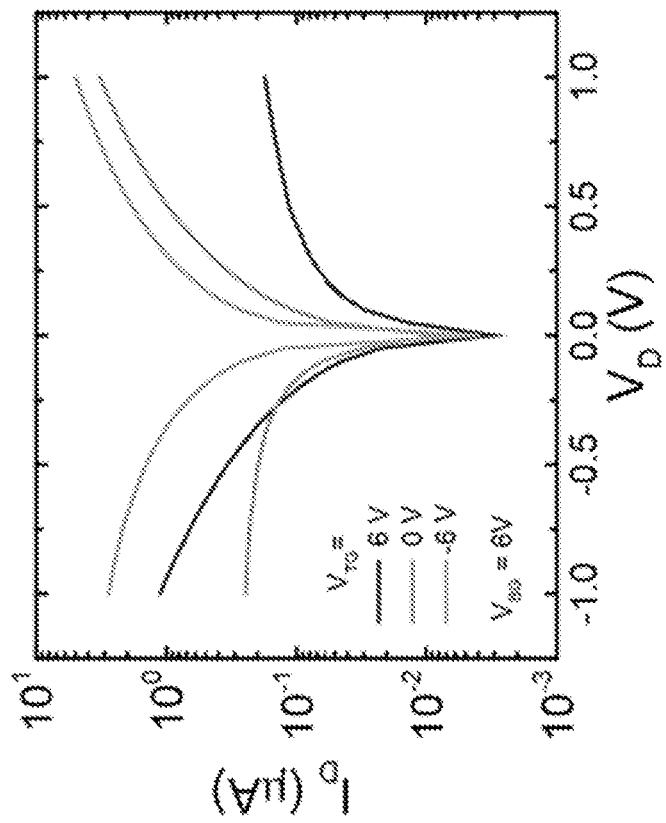
Figure 8:
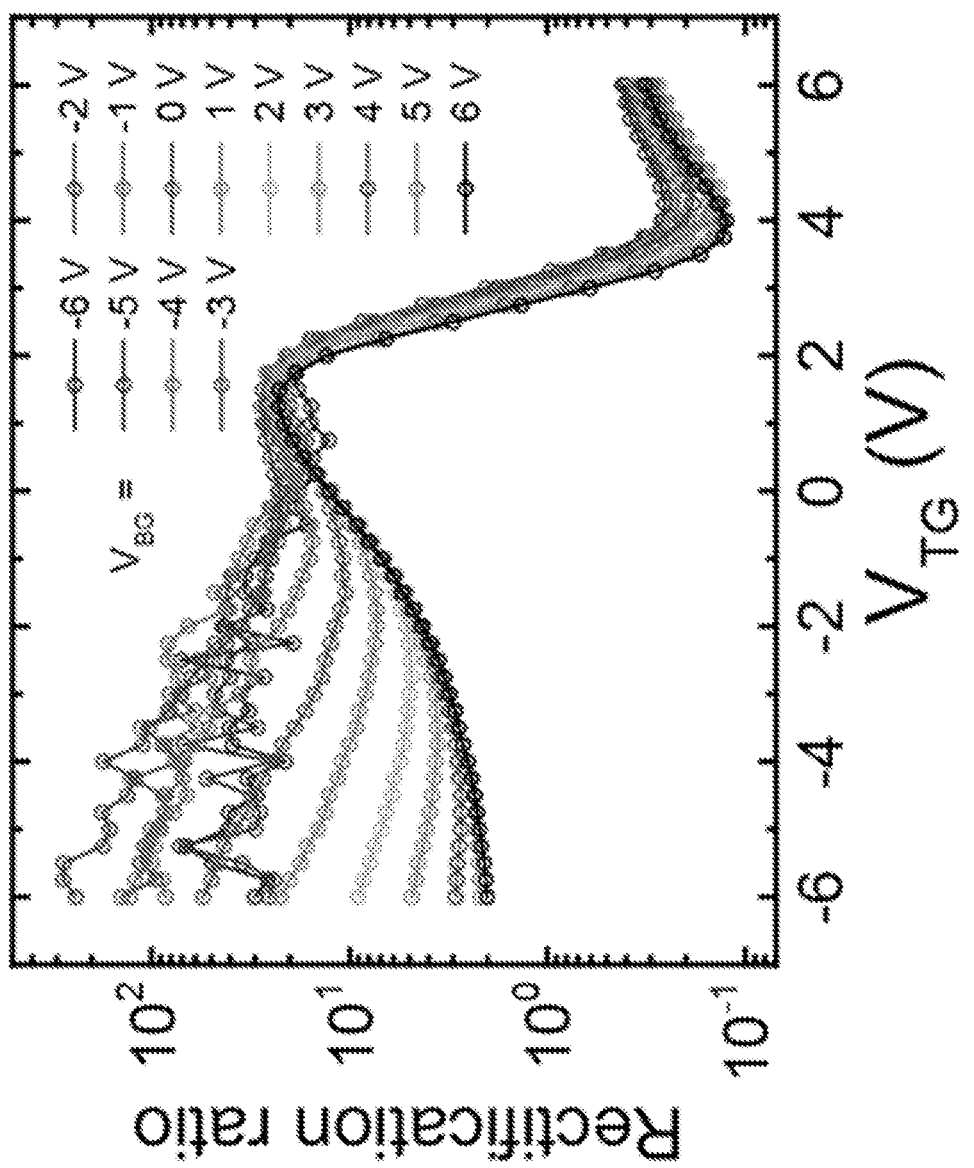
FIG. 8 shows rectification ratios for independent dual-gate operation according to embodiments of the invention. Shown for $V_{BG}$=6 V to $V_{BG}$=−6 V, the rectification ratio is defined as ratio $I_D$ at $V_D$=1 V divided by $I_D$ at $V_D$=−1 V, as extracted from the transfer curve.
Figure 9A:
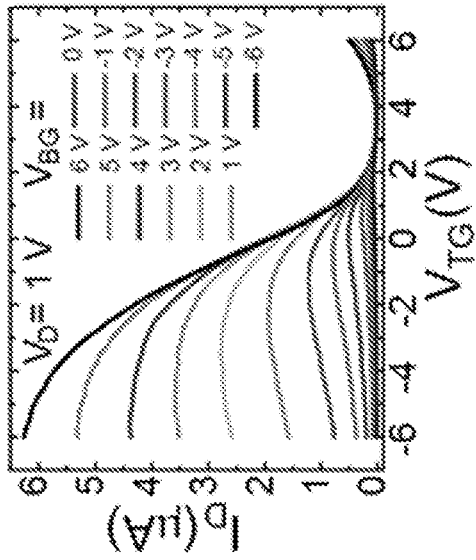
FIGS. 9A-9F show transfer responses for independent dual-gate operation according to embodiments of the invention.
Figure 9C:
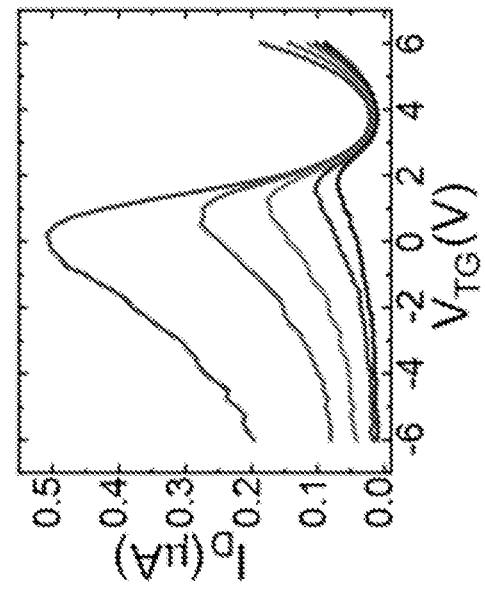
Figure 9E:
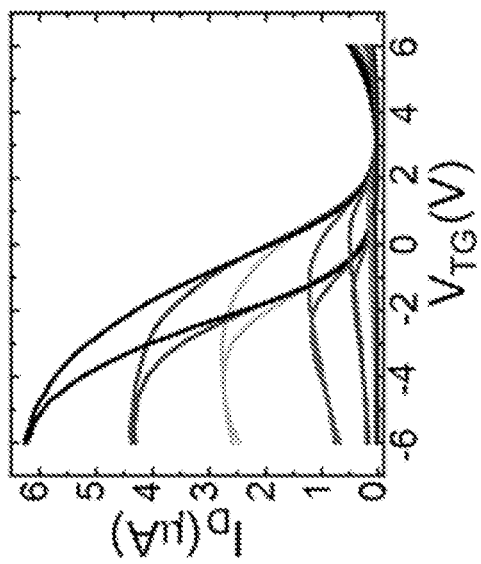
Figure 9B:
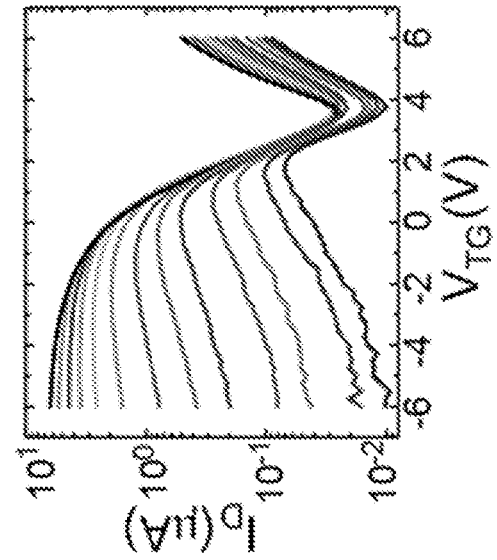
Figure 9D:
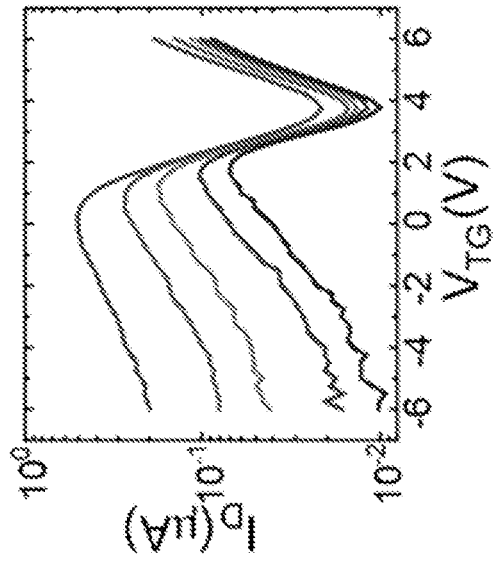
Figure 9F:
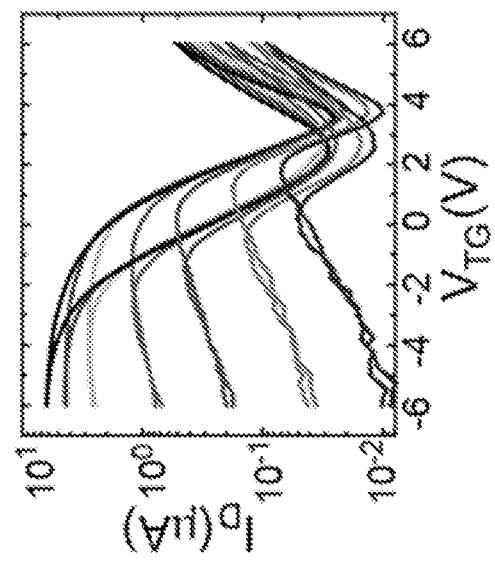

The GHeTs were first characterized by biasing the bottom and top gates independently with the source voltage ($V_S$) grounded. FIG. 2A shows selected output curves corresponding to different top gate voltages ($V_{TG}$) for $V_{BG}$=0 V. The top gate modulates the output response of the GHeT from a rectifying diode at $V_{TG}$=−6 V (orange) to an inverted polarity rectifying diode at $V_{TG}$=6 V (purple), due to band-to-band tunneling between the $MoS_2$ and CNTs which has been previously reported. FIGS. 7A-7B show additional sets of output curves corresponding to $V_{BG}$=6 V and −6 V. To further characterize the GHeT rectifying behavior, FIG. 2B shows the rectification ratio (defined here as $I_D$ at $V_D$=1 V divided by $I_D$ at $V_D$=−1 V) extracted from the corresponding transfer curves. The top and bottom gates are both able to modulate the diode rectification ratio. For $V_{TG}$>0 V, the rectification ratio can be tuned by over two orders of magnitude, including reversal of the rectification direction (i.e., rectification ratio <1) for $V_{TG}$>2 V. For $V_{TG}$<0, modulation by the bottom gate is more evident with tunability of the rectification ratio by over two orders of magnitude for $V_{TG}$=−6 V. The rectification ratios for $V_{BG}$ from 6 V to −6 V with 1 V increments are shown in FIG. 8.

Figure 2C:
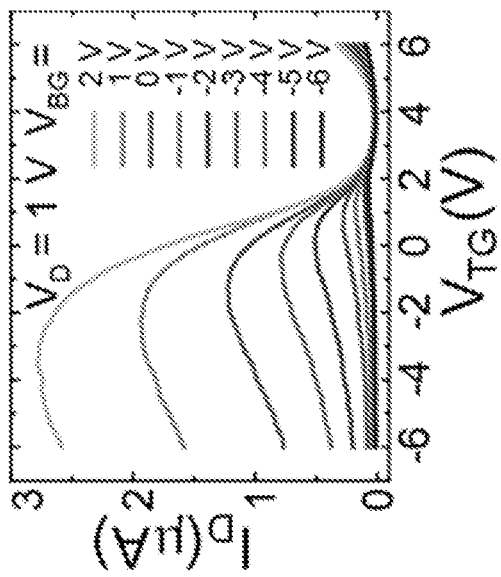
FIGS. 2A-2C show the independent gate operation of Gaussian heterojunctions transistors according to embodiments of the invention.
Figure 2B:
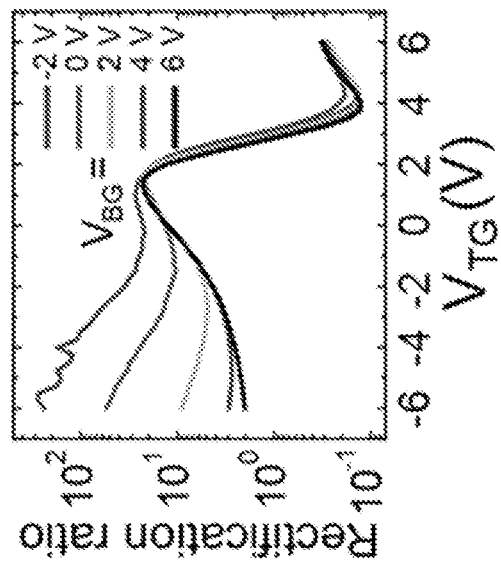
Figure 2A:
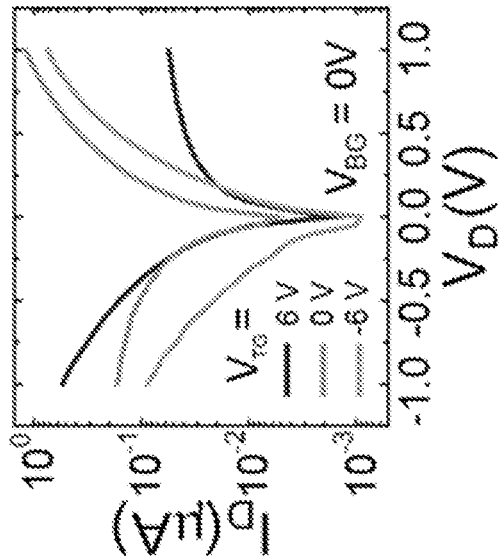
Figure 10A:
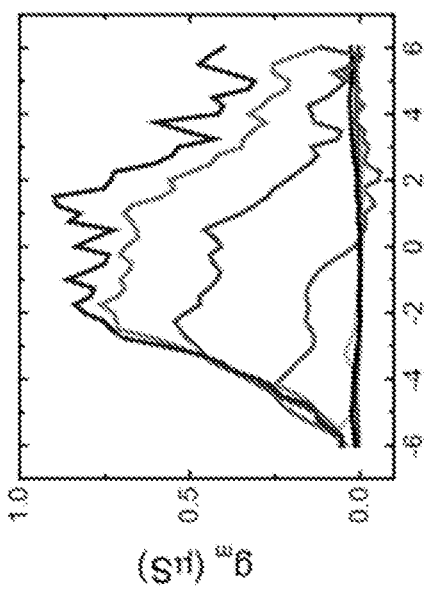
FIGS. 10A-10C show transfer responses with respect to $V_{BG}$ for independent dual-gate operation according to embodiments of the invention.
Figure 10B:
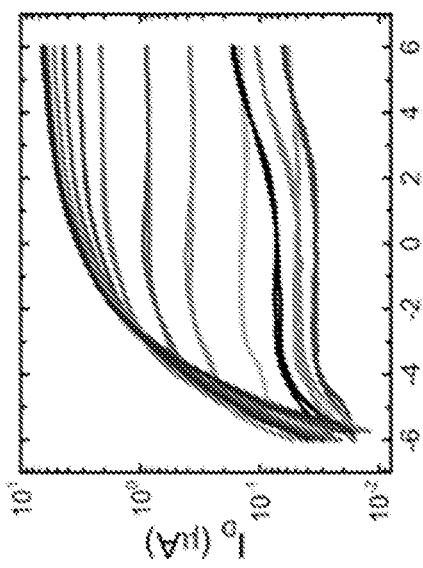
Figure 10C:
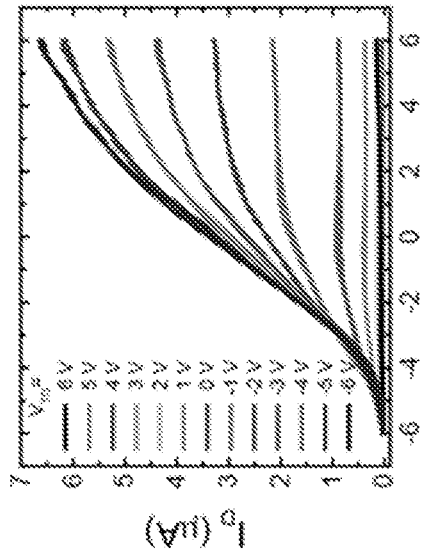
Figure 27:
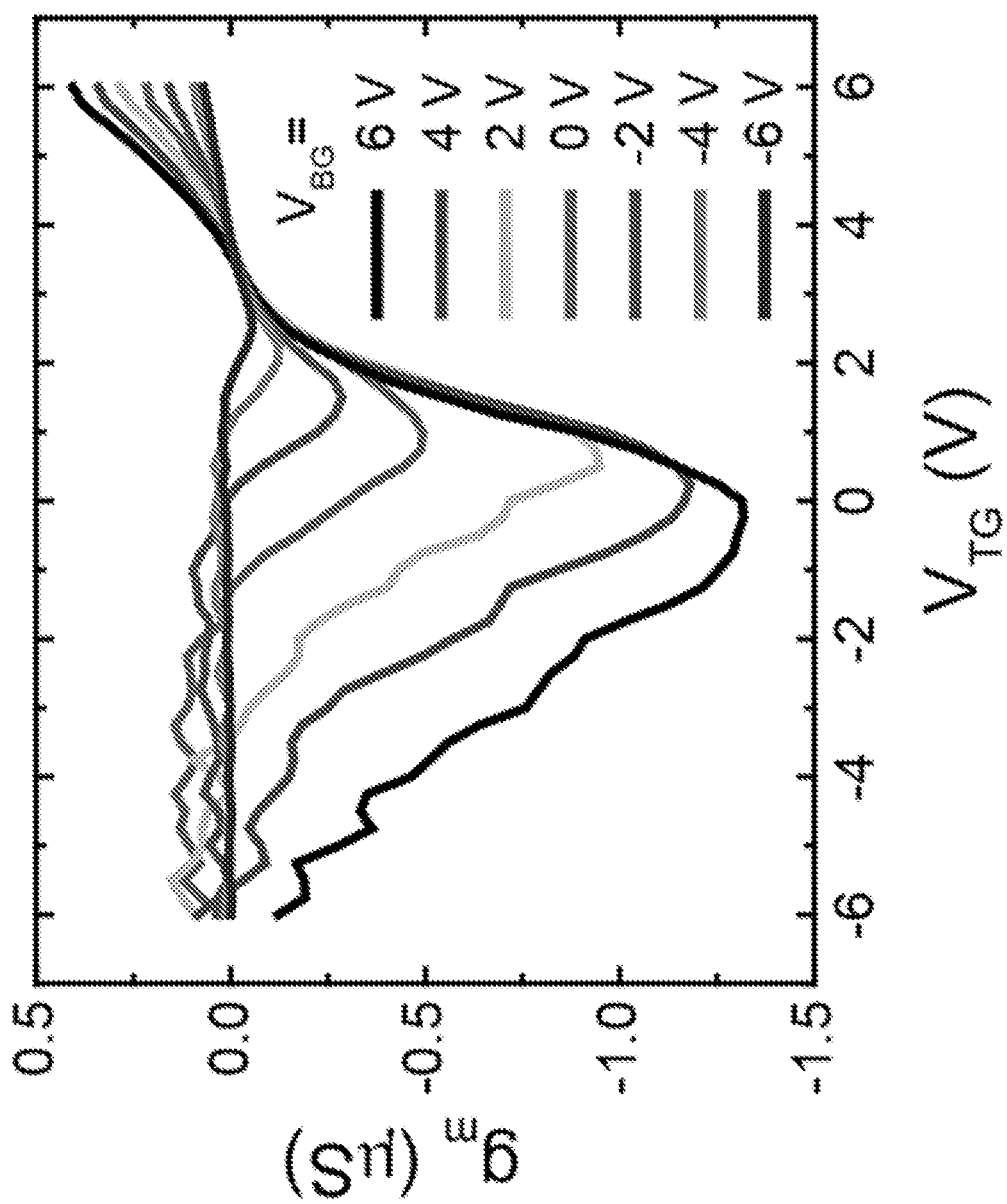
FIG. 27 shows the transconductance for independent gate operation according to embodiments of the invention. Values were extracted by calculating the slope of the raw data shown in FIGS. 9A-9F.

The GHeT transfer curve as a function of $V_{TG}$ for independent biasing where $V_{BG}$ is set constant throughout measurement is shown in FIG. 2C. As the $V_{BG}$ setpoint is varied, the peak position of the antiambipolar response can be tuned from $V_{TG}$=2 V to $V_{TG}$=−3 V (see FIGS. 9A-9F for additional curves). Note that the behavior to the right of the peak is correlated to electrostatic control of the CNT film while the behavior to the left of the peak is correlated to electrostatic control of the $MoS_2$. Thus, the top gate can fully modulate the CNTs at all $V_{BG}$, as evidenced by a distinct OFF state at $V_{TG}$~4 V shown in FIG. 2C and the negative transconductance ($g_m$) from the peak voltage to $V_{TG}$=4 V shown in FIG. 27. Due to low dielectric screening by CNT networks, the top gate can partially modulate the n-type $MoS_2$ as evidenced by positive $g_m$ shown in FIG. 27 for $V_{BG}$<0 V and negative $V_{TG}$. For $V_{BG}$>0, the negative bias field from the top gate through the CNT network is not sufficiently strong to fully deplete the $MoS_2$ that has been driven into accumulation by the bottom gate, resulting in loss of dual-gate control for the left side of the antiambipolar response. The corresponding GHeT transfer curve and plot of $g_m$ as a function of $V_{BG}$ (see FIGS. 10A-10C) indicates that the bottom gate can fully modulate $MoS_2$ for all biases but is unable to modulate the CNT network completely at any bias due to stronger dielectric screening of the bottom gate bias by the continuous $MoS_2$ monolayer. The loss of dual-gate control for independent biasing indicates that the current flows primarily through the overlap region of the GHeT, as shown in FIG. 6.

Figure 3B:
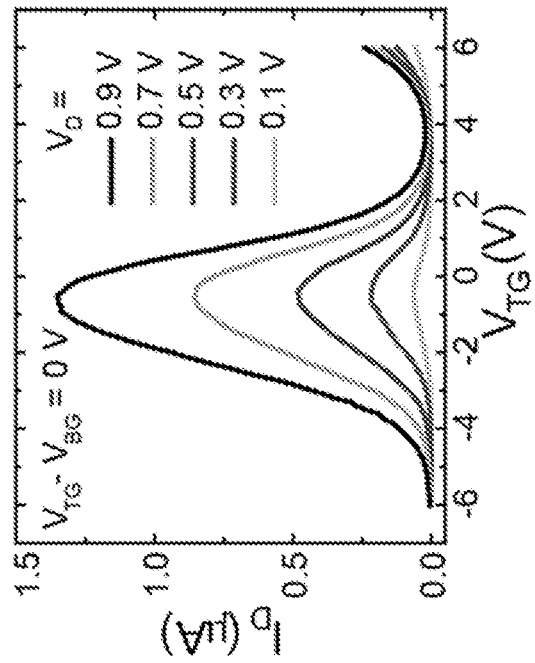
FIGS. 3A-3D show the dependent gate operation of Gaussian heterojunction transistors according to embodiments of the invention.
Figure 3D:
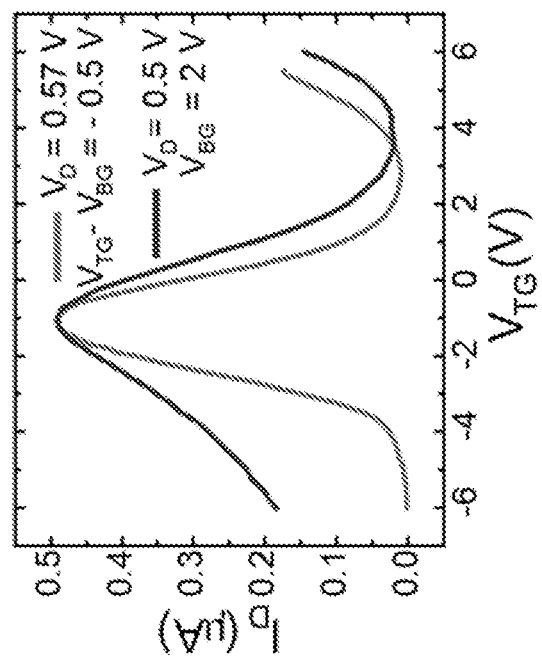
Figure 3A:
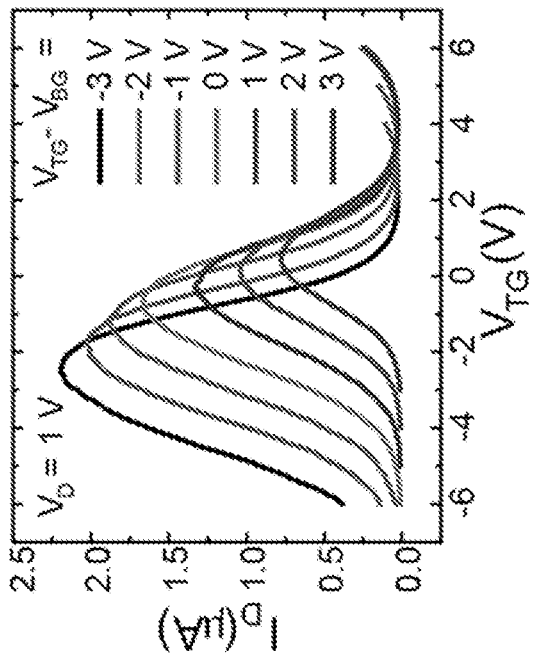
Figure 11A:
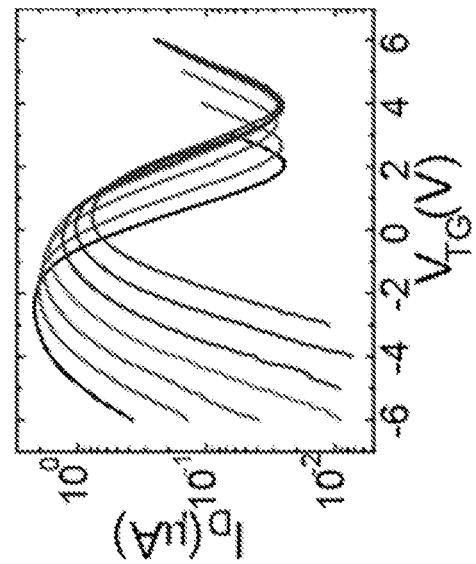
FIGS. 11A-11C show the rectification ratio and transfer response for dependent dual-gate operation according to embodiments of the invention.
Figure 11B:
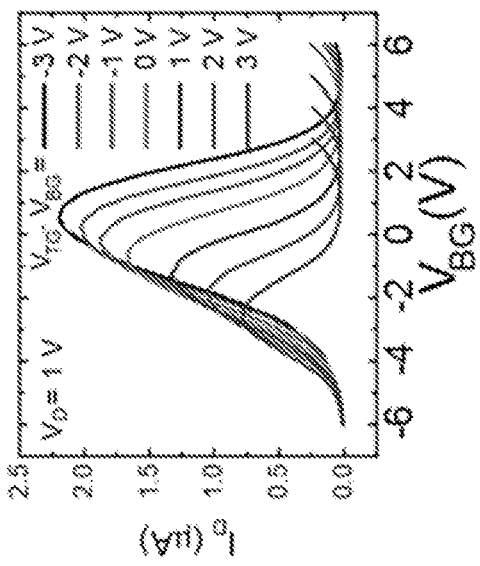
Figure 11C:
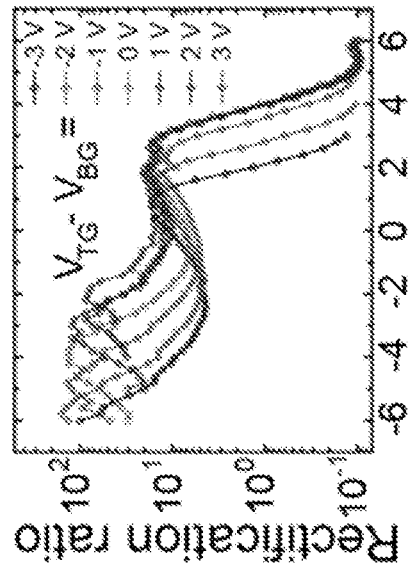
Figure 12:
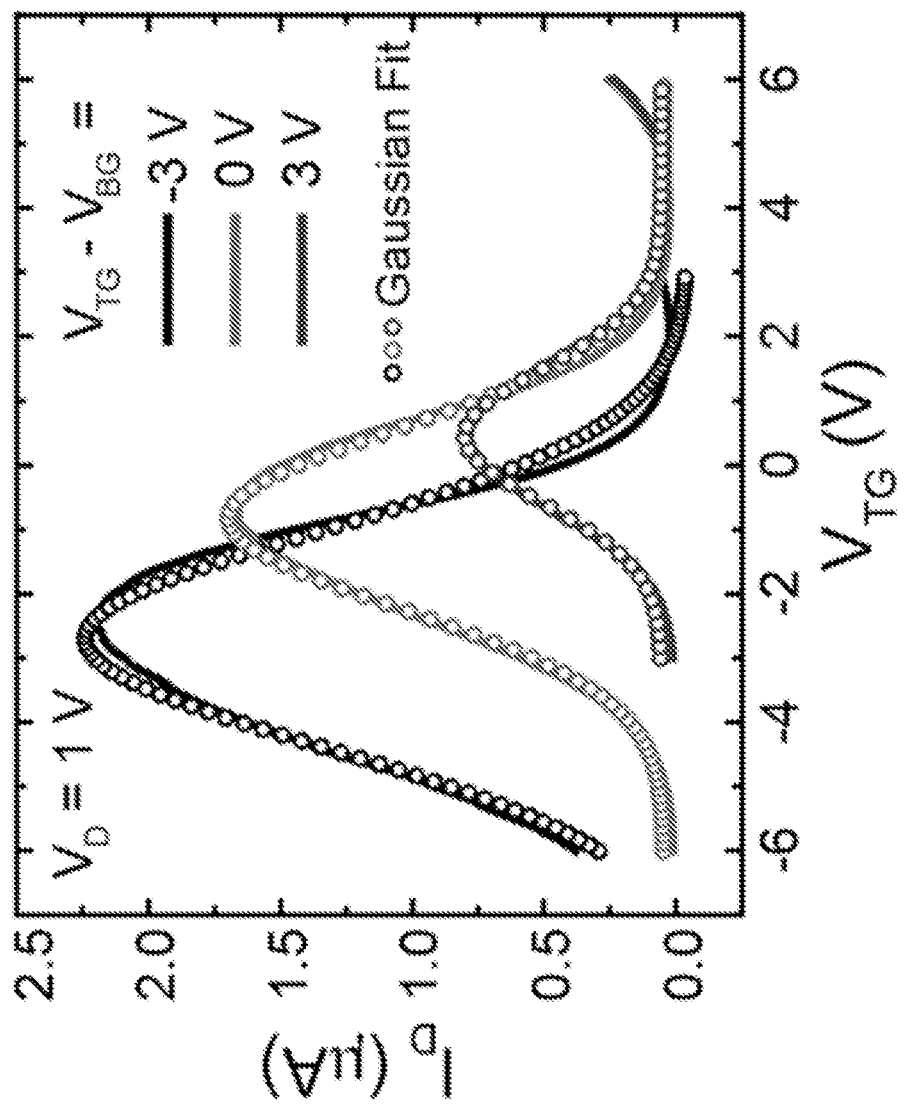
FIG. 12 shows Gaussian fits for dependent dual-gate operation according to embodiments of the invention. Gaussian fitting of representative curves from FIG. 3A highlights the consistently symmetric response for dependent biasing without a significant loss of peak current.
Figure 13A:
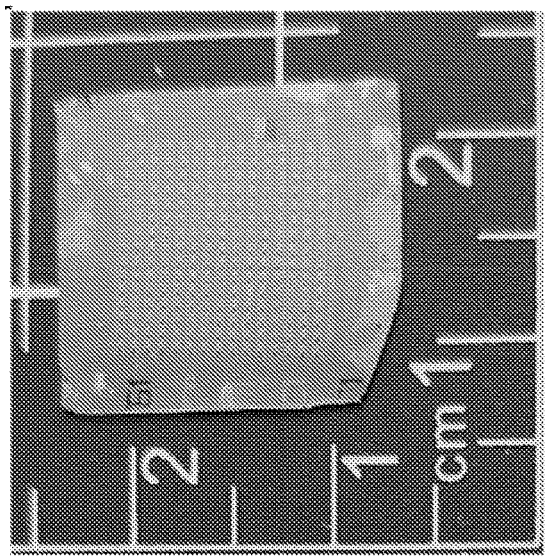
FIGS. 13A-13C show large-area device statistics according to embodiments of the invention.
Figure 13C:
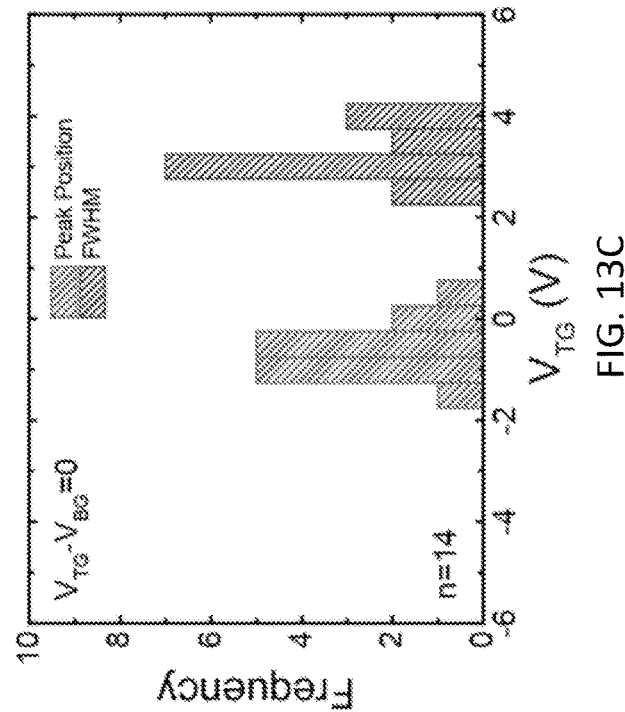
Figure 13B:
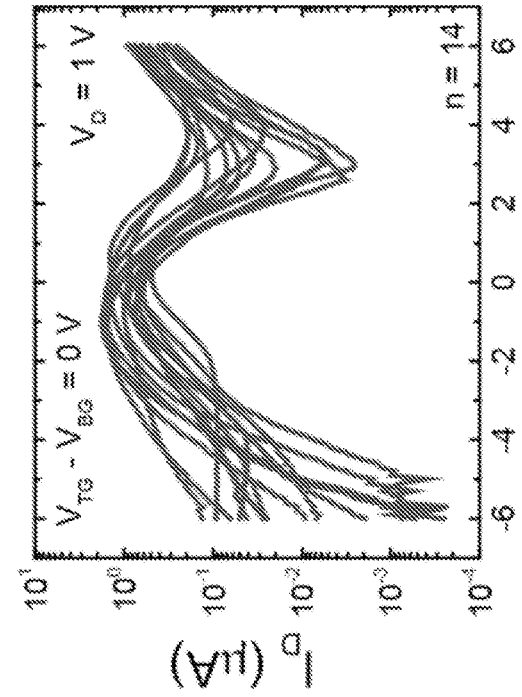

Alternatively, the GHeT can be operated in a dependent biasing scheme to combine the modulation of the CNTs by the top gate and the modulation of the $MoS_2$ by the bottom gate, resulting in enhanced electrostatic control of the device response. Since the $Al_2O_3$ dielectric layer for both gates is about 35 nm thick, the fields from the top gate and the bottom gate are equivalent to the same bias. FIG. 3A shows the transfer response of the GHeT when $V_{BG}$ and $V_{TG}$ are changed together throughout measurement with a constant offset ranging from −3 V to 3 V while $V_s$ is grounded. Rectification ratios extracted from the corresponding transfer curves for dependent gate operation can be tuned by over three orders of magnitude as shown in FIGS. 11A-11C. The Gaussian fits of the antiambipolar response shown in FIG. 12 illustrate that changing the offset between the gates from −3 V to 3 V can shift the peak position from $V_{TG}$=−3 V to 0.5 V without a loss of symmetry in the antiambipolar response and a substantial loss in the peak current. As shown in FIGS. 13A-13C for $V_{TG}$−$V_{BG}$=0 V, 85% of working devices fabricated over a 0.5 cm×0.5 cm area exhibit a Gaussian transfer response. The average peak position of these 14 devices was −0.42 V±0.55 V, and the average full-width-half-maximum (FWHM) was 2.92 V±0.48 V.

Figure 3C:
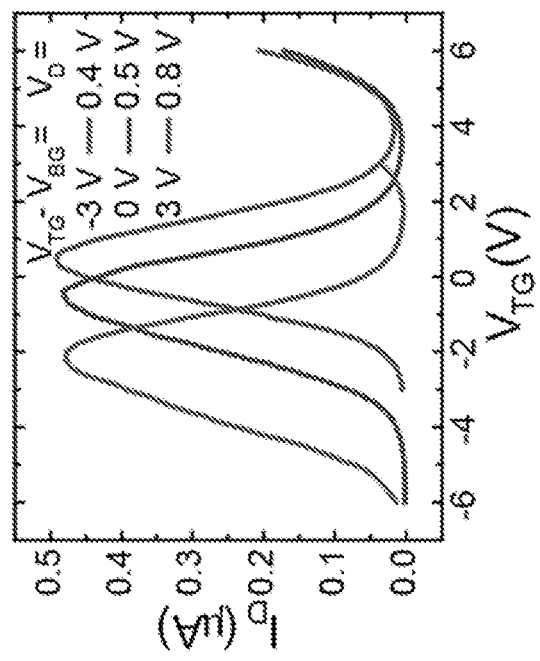

Combining $V_D$ modulation with dual-gate tunability results in further control over the peak height, position, and FWHM of the GHeT antiambipolar response. FIG. 3B shows that for the dependent operation of the gates at $V_{TG}-V_{BG}=0$ V, variable $V_D$ modulates the peak height while maintaining the peak position with minimal change in the FWHM. On the other hand, by changing the dependent gating offset $V_{TG}-V_{BG}$ from 3 V to −3 V and $V_D$ from 0.8 V to 0.4 V, the peak position can be tuned while maintaining the peak height and FWHM as shown in FIG. 3C. Finally, FIG. 3D shows that the peak height and peak position can be maintained while the FWHM is varied by switching between dependent and independent gate operation. Independent modulation of peak height, position, and FWHM confirm that the mixed-dimensional $MoS_2$/CNT GHeT possesses a fully tunable Gaussian transfer response in a single heterojunction device.

Figure 14B:
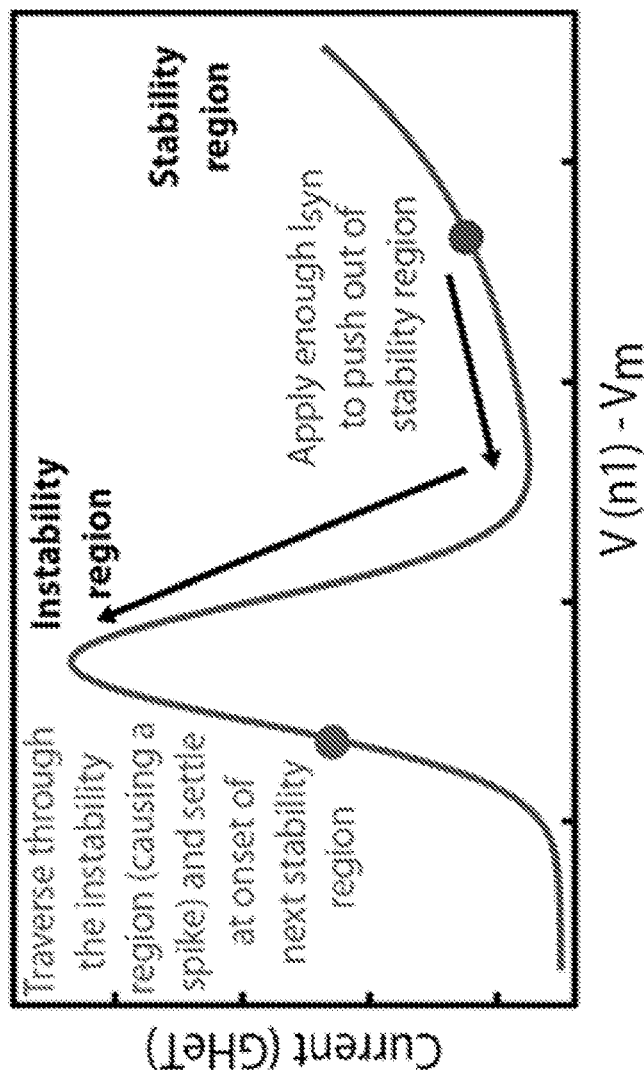
FIGS. 14A-14B show a basis for using the GHeT response to mimic $g_{Na}$ according to embodiments of the invention.
Figure 14A:
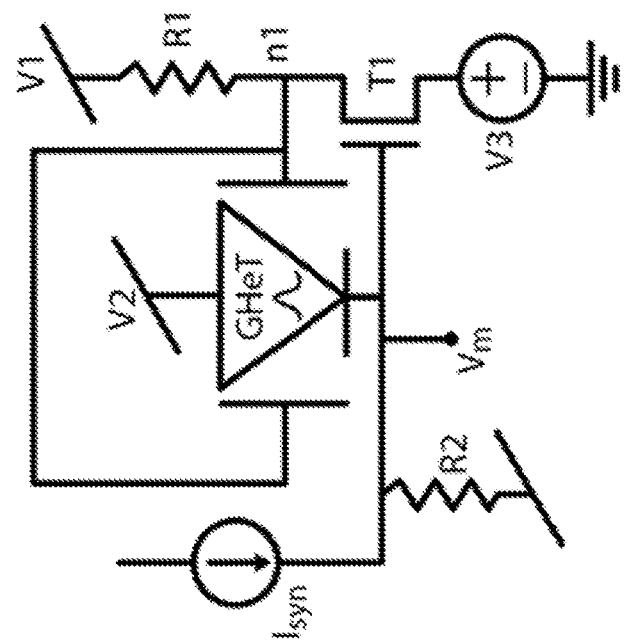

The ability to tune the antiambipolar response of the GHeT enables a variety of applications including Hodgkin-Huxley (HH) spiking neurons. A circuit-level representation of the HH model for biological neurons is shown in FIG. 4A where $Na^+$ ions injected into the neuron lead to spike generation in the membrane potential, $V_m$, while released $K^+$ ions reset $V_m$. Capacitance, $C_m$, and leakage conductance, $g_L$, represent the bilayer of the neuron membrane. The conductance of the $Na^+$ ($K^+$) ions channels is modeled by $g_{Na}$ ($g_K$). FIGS. 4B and 4C show the temporal evolution of $g_{Na}$ and $g_K$ as described by the HH model. The activation of the $K^+$ ion channel is delayed and $g_K$ increases with increasing $V_m$. The time-dependent evolution of $g_K$ can be represented by the delayed turn-on of an n-channel metal-oxide semiconductor (NMOS) transistor where a voltage, $V_m$, is applied to the gate through a resistive-capacitive load. Meanwhile, the behavior of the $Na^+$ ion channel is more complex and requires a peaked time-dependent response, where the peak conductance increases but the delay to reach the peak conductance is reduced with increasing $V_m$. To efficiently capture the more complex transient behavior of $g_{Na}$, the dual-gated GHeT antiambipolar response is exploited as described in FIG. 14.

Figure 4F:
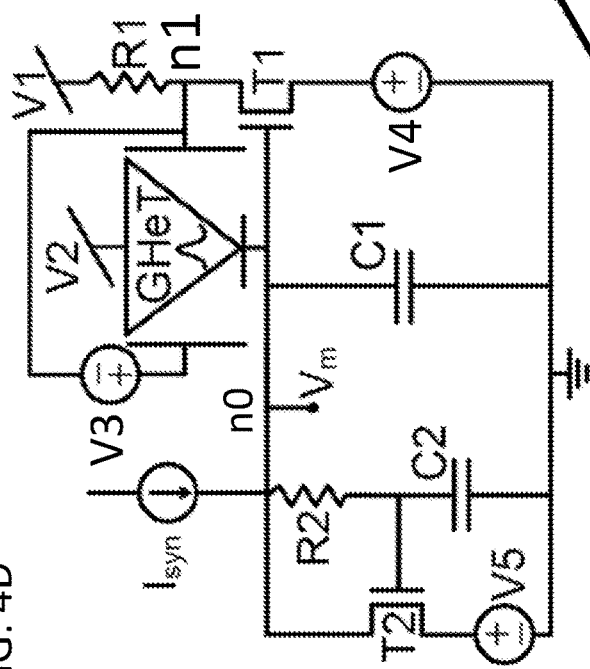
Figure 4E:
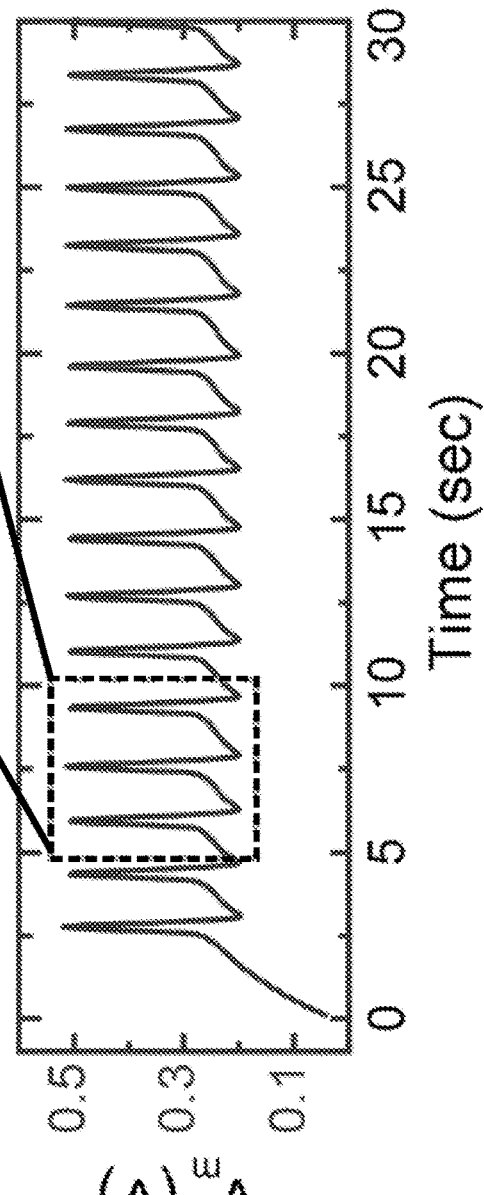
Figure 16:
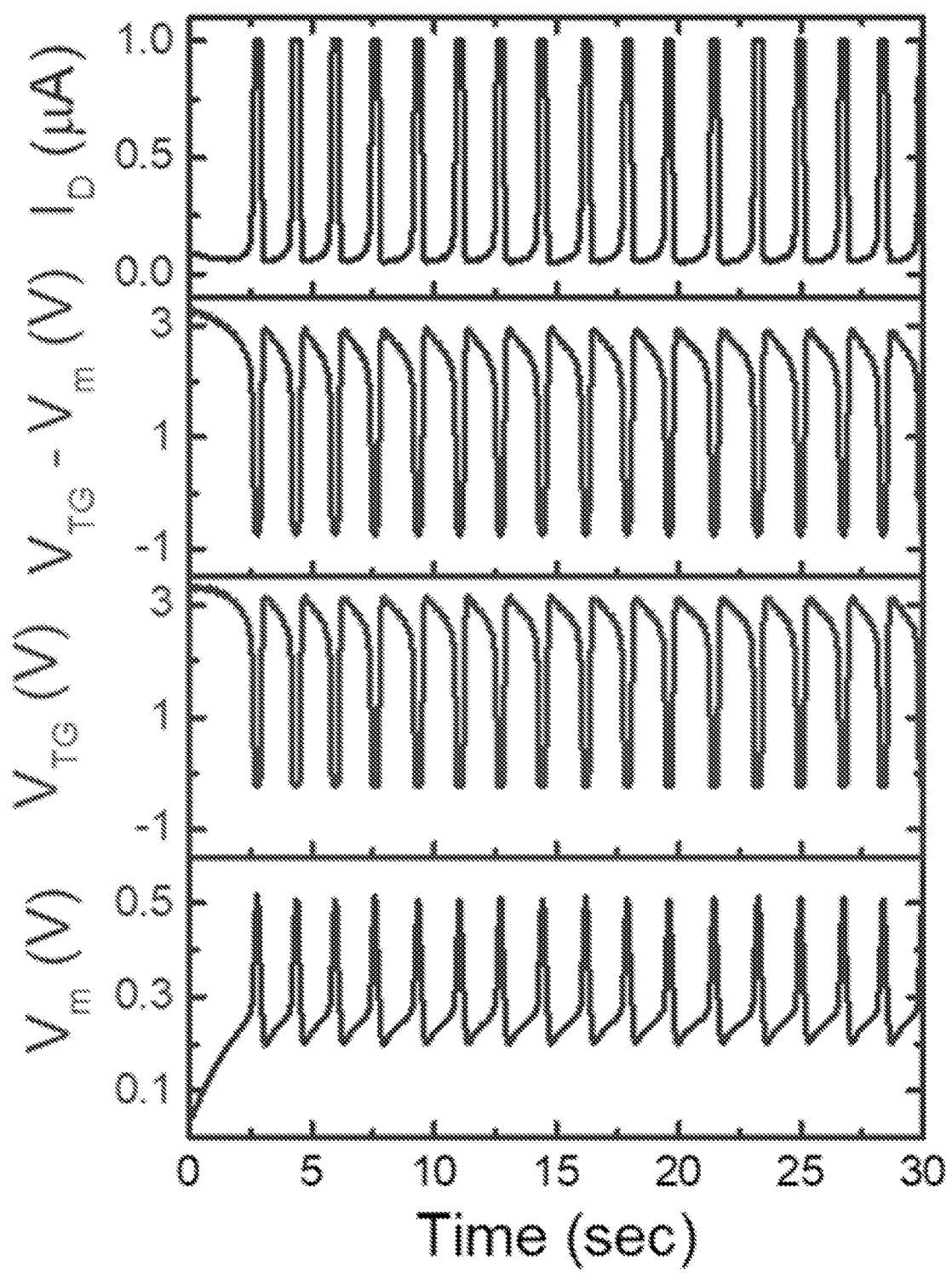
FIG. 16 shows GHeT gate voltage and current during spiking according to embodiments of the invention. Experimental results for the actual voltage applied to the top gate and the corresponding current flowing through the GHeT while functioning in the spiking neuron circuit detailed in FIG. 4D. The consistency of spiking in $V_m$ with the gate voltage and current of the GHeT affirms that the spiking response originates from the GHeT device.
Figure 18A:
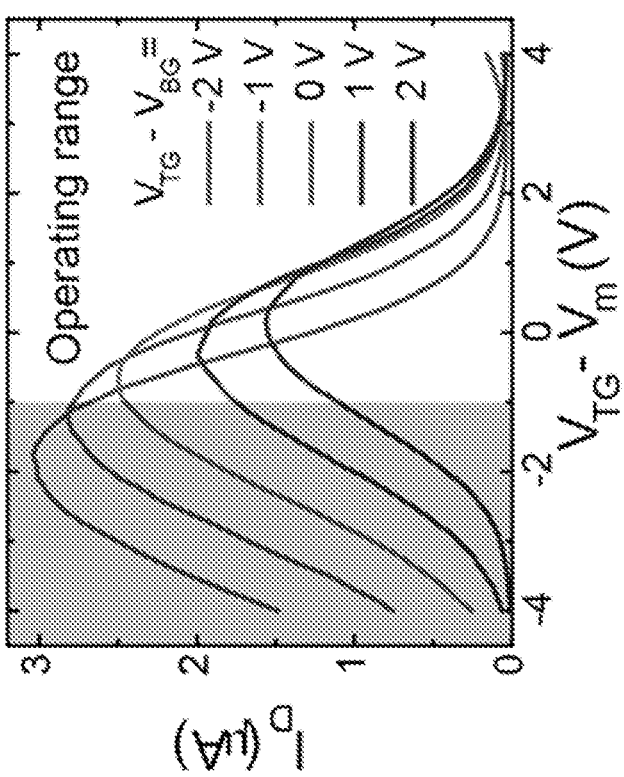
FIGS. 18A-18B shows simulated neuron spiking controlled by gate offset according to embodiments of the invention.
Figure 18B:
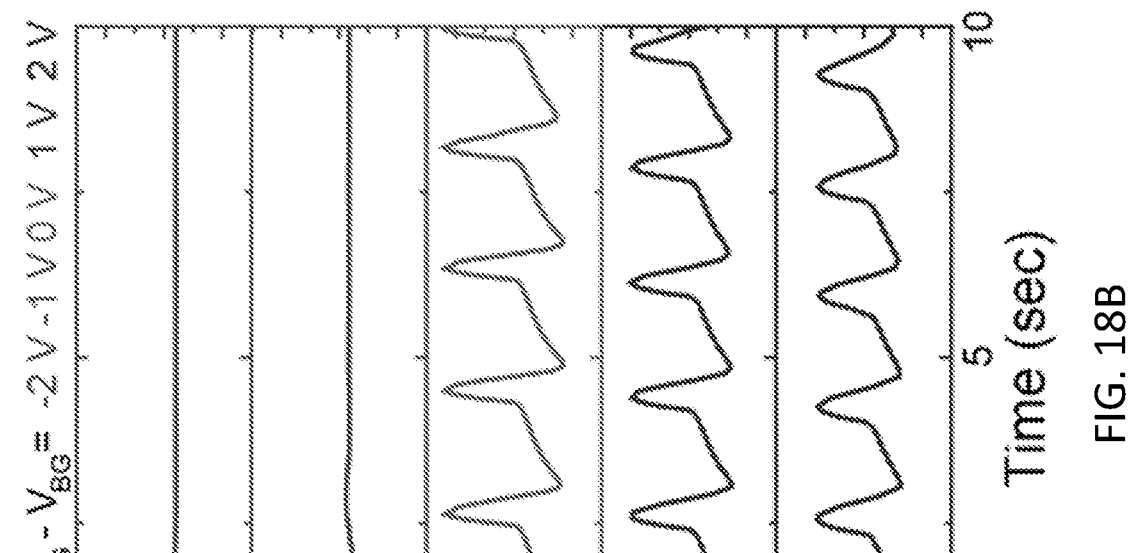

FIG. 4D details the full circuit used for the experimental spiking neuron demonstration based on a single $MoS_2$-CNT GHeT device, n-type field-effect transistors (T1 and T2), an a few passive elements (R1, R2, C1, C2). Voltage sources, V3 and V5, were connected at the source electrodes of T1 and T2 to allow threshold voltage programmability for the field-effect transistors. The GHeT and circuit components T1-R1-C1 emulate $g_{Na}$, while circuit components T2-R2-C2 emulate $g_K$, as shown in FIG. 15. Before application of a synaptic current, the GHeT is in an OFF state due to a large positive gate bias (~V1), corresponding to position 1 in FIGS. 28A-28B For sufficiently high $I_{syn}$, C1 and C2 integrate $I_{syn}$ and the OFF current of the GHeT ($I_{OFF}$). In other words, the voltage at the GHeT source, $V_m$, increases with time proportional to $I_{syn}+I_{OFF}$ (position 2 in FIGS. 28A-28B). As $V_m$ exceeds the threshold voltage of T1, the voltage applied to the gates drops quickly from V1 to near 0 V, resulting in a negative relative gate voltage, $V_{TG}-V_m$. This condition drives the GHeT from its OFF state to the peak ON state, going through the region of negative transconductance. The increased current, $I_{PEAK}$, causes a sharp increase in the slope of $V_m$ in proportion to $I_{syn}+I_{PEAK}$. As $V_m$ continues to increase, $V_{TG}-V_m$, continues to decrease thereby accessing the left side of the Gaussian response, resulting in a decreasing current and positive $g_m$ (position 3 in FIGS. 28A-28B). At this point, $V_m$ has reached the threshold voltage of T2 and the delayed $g_K$ channel is able to dominate and reset $V_m$ below the threshold voltage of T1 (position 4 in FIGS. 28A-28B). This spiking and resetting behavior, experimentally shown in FIG. 4E, will continue as long as $I_{syn}+I_{OFF}$ is sufficiently high. FIG. 4F shows that simulations performed on the Cadence Virtuoso platform using the Spectre simulator for a prototypical GHeT (brown dashed) agree with the experimental spiking response of the circuit (blue) with a temporal FWHM that is about 200 ms. The energy consumption of this GHeT-based spiking neuron circuit is ~250 nJ/spike, which can be reduced by orders of magnitude by decreasing the channel width, circuit capacitances (C1 and C2) and gate dielectric thickness of the GHeT as well as by custom design and on-chip integration of T1 and T2 transistors. The measured gate voltage and current from the GHeT during the full 30 seconds of constant spiking are shown in FIG. 16, thereby confirming that the GHeT is responsible for the spiking behavior. In addition to capacitance values and $I_{syn}$ affecting the spiking response (FIGS. 29A-29B), experimental results in FIGS. 17A-17B and simulation results in FIGS. 18A-8B show that the offset between the gates can be used to control the spiking response. Constant spiking only occurs when the circuit operating region (4 V to −1 V) contains both negative and positive $g_m$ values near $I_{PEAK}$ of the Gaussian transfer response, demonstrating that the antiambipolar response is required to correctly mimic $g_{Na}$ in the HH model of a spiking neuron.

TABLE 1

Figure 28B:
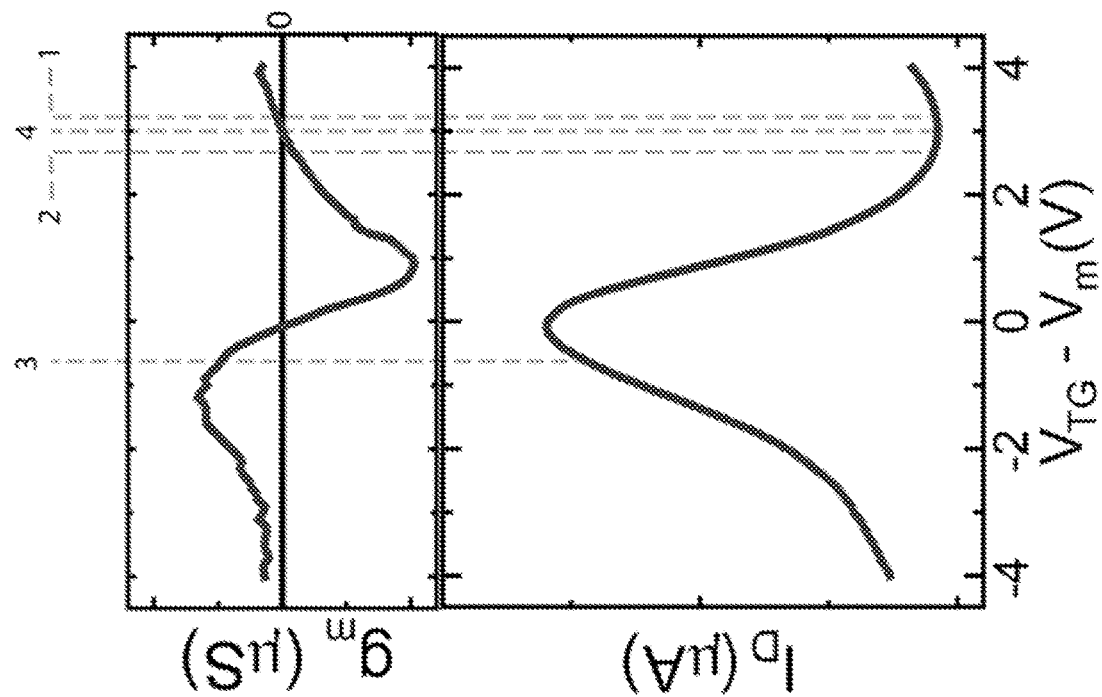
FIGS. 28A-28B show the spike evolution with respect to GHeT according to embodiments of the invention.
Figure 28A:
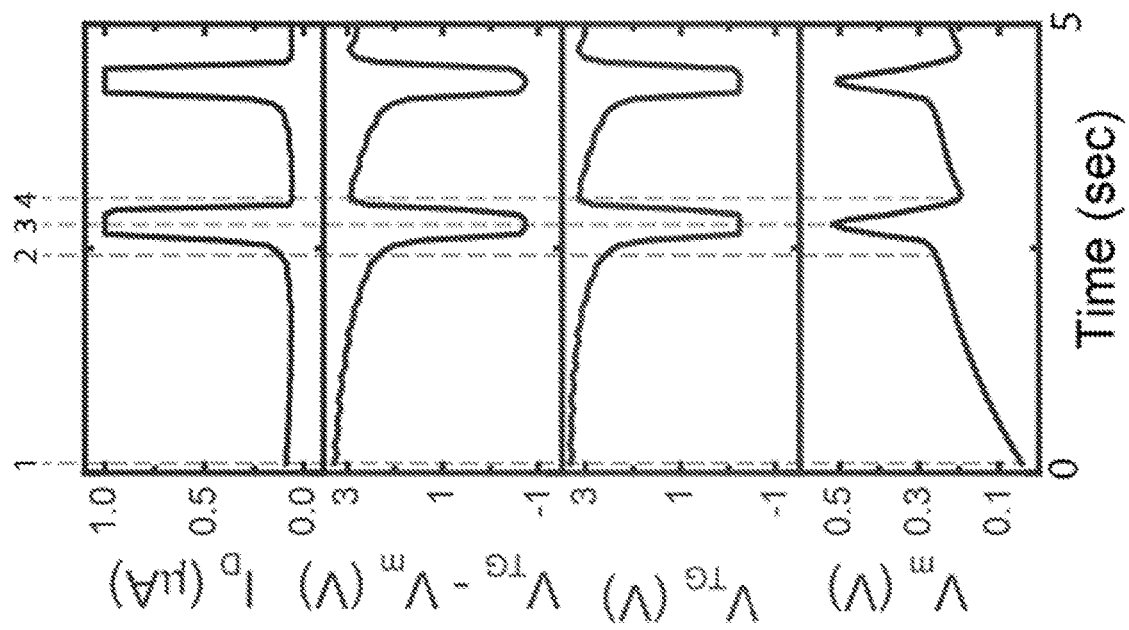
Figure 29B:
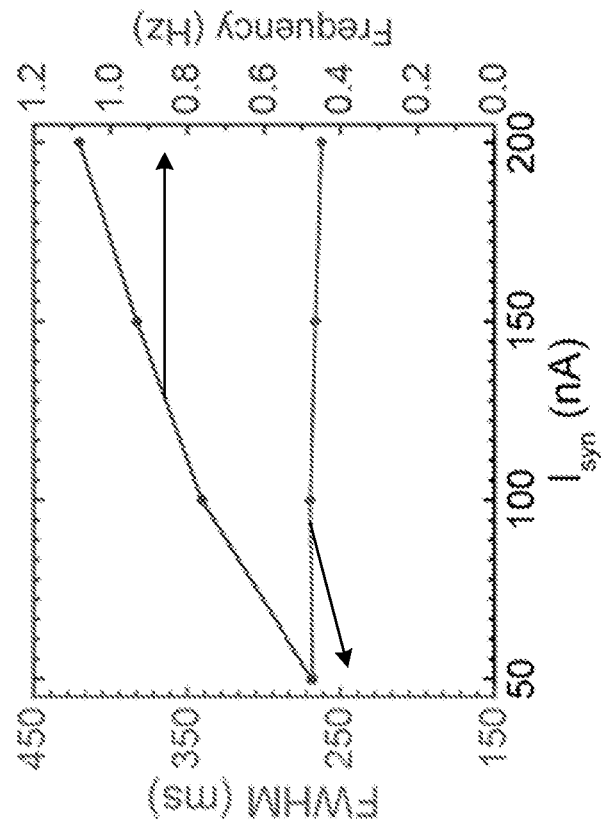
FIGS. 29A-29B show the changes in FWHM and spiking frequency with varied capacitance and $I_{syn}$ based on simulations according to embodiments of the invention.
Figure 29A:
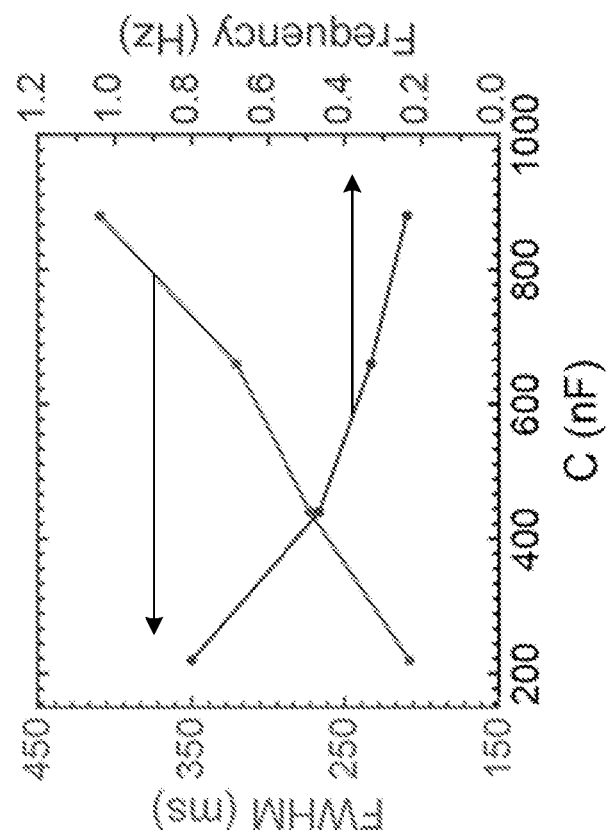

State of various elements in the circuit at numbered positions in FIGS. 28A-28B.

| Position | $V_m$ | T1 | C1 and C2 | T2 | GHeT Gate ($V_{TG}$) | State of GHeT | $g_m$ |
|---|---|---|---|---|---|---|---|
| 1 | 0 V | OFF | Starts to charge | OFF | ~3.3 V | OFF | >0 |
| 1 to 2 | Increasing with $I_{syn}+I_{OFF}$ | OFF | Charges | OFF | Decreases with Vm | OFF | >0 to <0 |
| 2 | ~0.25 V ~$V_{th,T1}$ | Turns ON | Charges | OFF | ~2.5 V | OFF | <0 |
| 2 to 3 | Increasing with $I_{syn}+I_{PEAK}$ | ON | Charges | OFF | Drops as T1 is ON | Turns ON with increasing current through $I_{PEAK}$ then decreasing | <0 to >0 |

TABLE 1-continued

State of various elements in the circuit at numbered positions in FIGS. 28A-28B.

| Position | $V_m$ | T1 | C1 and C2 | T2 | GHeT Gate ($V_{TG}$) | State of GHeT | $g_m$ |
|---|---|---|---|---|---|---|---|
| | | | | | | current with increasing $V_m$ | |
| 3 | ~0.5 V ~$V_{th,T2}$ | ON | Starts to Discharge | Turns ON | ~−0.75 V | ON $I_D < I_{PEAK}$ | >0 |
| 3 to 4 | Decreasing due to pull-down path | Turns OFF | Discharges | Turns OFF | Spikes as T1 turns OFF | Turns OFF through $I_{PEAK}$ with decreasing current as Vm drops and $V_{TG}$ spikes. | >0 to ~0 |
| 4 | ~0.2 V <$V_{th,T1}$ | OFF | Starts to charge | OFF | ~3 V | OFF | ~0 |

Additional simulations show that multiple biological spiking neuron responses can be achieved with GHeT-based circuits by modification to how the GHeT is biased by the top and bottom gates. Simulations using the experimental circuit (see FIG. 19), where the GHeT experiences dependent biasing, show that constant spiking occurs for a constant $I_{syn}$ of 40 nA (FIG. 5A), whereas, if $I_{syn}$ increases linearly from 0 to 80 nA, then the spiking frequency increases (FIG. 5B). A slight modification to the GHeT-based circuit that allows for independent gate biasing (see FIG. 20) enables additional functionality such as spike latency, integrator, and phasic spiking responses. For example, FIG. 5C illustrates spike latency where a single neuron spike occurs after a 0.4-sec $I_{syn}$ pulse of 50 nA. The integrator response in FIG. 5D shows that a neuron spike occurs when the 0.4 sec $I_{syn}$ pulses of 35 nA are within 0.3 sec of each other (first set of pulses) but does not occur when the pulses are 1.6 sec apart (second set of pulses). In this circuit, a constant $I_{syn}$ of 40 nA results in a single neuron spike, mimicking phasic spiking (FIG. 5E). Further modification of the circuit to connect the top and bottom gates through an inverter, diode, resistor, and capacitor (see FIG. 21) results in phasic bursting for a constant $I_{syn}$ of 40 nA (FIG. 5F). Incorporating a Schmitt Trigger and two additional transistors (see FIGS. 22 and 23) results in tonic bursting (FIG. 5G) and dampened tonic bursting (FIG. 5H) for a constant $I_{syn}$ of 40 nA. With incremental modifications to the original circuit, these simulations highlight the versatility of GHeTs-enabled circuits to have runtime programmability of spiking threshold and spiking modes which are desirable for spiking neuron applications.

By creating a device with intrinsic neuronal responses, it is possible to significantly simplify spiking neuron implementations. In particular, the use of mixed-dimensional MoS$_2$/CNT van der Waals heterostructures and a semi-vertical, dual-gated geometry results in a smaller device footprint with superior electrostatic control compared to other antiambipolar demonstrations. Not only is the fundamental behavior of the Na$^+$ ion channel of a biological neuron captured by the GHeT in a simple circuit, but by exploiting the dual-gated programmability both through independent and dependent biasing, it is possible to achieve eight different biological neuron responses. Five of which are achieved using a single GHeT, two transistors, two capacitors, and two resistors. Additionally, the fabrication process for GHeT-based spiking neurons is compatible with previous demonstrations of monolayer MoS$_2$ memtransistor-based synapses, enabling scalable implementations of biomimetic neuromorphic platforms.

More broadly, since CMOS transistors cannot natively mimic the Gaussian response demonstrated here, CMOS-based digital designs implement Gaussian functions with complex circuits and look-up tables while analog CMOS circuits suffer from limited programmability and high bias current. Thus, the tunable GHeT Gaussian antiambipolar response is applicable to hardware-level implementations of spiking neurons as well as other artificial learning paradigms. For example, several natural language processing algorithms require Gaussian functions to build statistical distributions of speech and phoneme characteristics. Similarly, neural networks used in machine learning often account for uncertainties in Bayesian inference using weight densities represented by a mixture of Gaussian functions. GHeTs are also likely to be useful for highly efficient computer vision algorithms in artificial neural networks that rely on the tunability and intrinsic filtering ability of a Gaussian response. Given that the complexity of CMOS-based implementations is a bottleneck for many learning models, the simplification of the Gaussian response to a single GHeT circuit element is expected to accelerate the realization of AI-based technologies.

These and other aspects of the invention are further described below. Without intent to limit the scope of the invention, exemplary instruments, apparatus, methods, and their related results according to the embodiments of the invention are given below. Note that titles or subtitles may be used in the examples for convenience of a reader, which in no way should limit the scope of the invention. Moreover, certain theories are proposed and disclosed herein; however, in no way they, whether they are right or wrong, should limit the scope of the invention so long as the invention is practiced according to the invention without regard for any particular theory or scheme of action.

Fabrication of Gaussian Heterojunction Transistors

All photolithography steps were performed on a Suss MABA6 Mask Aligner with an exposure wavelength of 365 nm and an exposure intensity of 9 mW/cm$^2$ using resist developer RD6 (Futurrex, Inc.) and liftoff for 1 hr in Remover PG (MicroChem) at 70° C. unless specified otherwise. The devices were fabricated on undoped Si/300 nm SiO$_2$ substrates. Following the self-aligned process described in FIG. 1A using negative resist (NR9-1000PY, Futurrex), the bottom gate metal of 10 nm Cr/10 nm Au/4 nm Al was thermally evaporated (Kurt J. Lesker, Nano 38) followed by atomic layer deposition (ALD, Cambridge Nanotech ALD S100) of about 35 nm of Al$_2$O$_3$ grown at 100° C. The 4 nm of Al oxidizes readily in ambient conditions and acts as a seeding layer for the growth of the ALD dielectric on the Au metal surface. A monolayer of MoS$_2$ grown on a sapphire substrate using solid-precursor CVD was then transferred onto the local bottom gate structure using a wet polycarbonate-assisted transfer process. The MoS$_2$ monolayer was patterned using a positive resist bilayer of polymethylglutarimide (PMGI, MicroChem) and S1813 (MicroChem), and etched by reactive ion etching (RIE, Samco RIE-10NR) using 50 sccm Ar at 13.3 Pa and 50 W for 20 sec. The PMGI/S1813 bilayer was used to minimize S1813 resist residue on the remaining MoS$_2$ monolayer but required overnight liftoff After repeating the self-aligned process, the encapsulated bottom contacts (4 nm Ti/40 nm Au/4 nm Al, 35 nm Al$_2$O$_3$) were patterned and deposited on the etched MoS$_2$ monolayer. The portion of the final MoS$_2$ film that is designed not to be covered by the film of semiconducting single-walled carbon nanotubes (CNTs) was protected from further etching by a patterned region of about 5 nm Al$_2$O$_3$. The top contacts (10 nm Cr/70 nm Au) were deposited on top of the encapsulated bottom contacts in preparation for the CNT film. The optimized concentration (about 10 tubes/μm transferred) of solution-processed P2 single-walled semiconducting CNTs with 99% semiconducting purity obtained via density gradient ultracentrifugation was vacuum filtered onto a cellulose membrane (VMWP, 0.05 μm pore size, Millipore Sigma) and acetone-bath transferred overnight on the entire substrate. The film of CNT was patterned using S1813 and etched by RIE using 20 sccm O$_2$ at 26.5 Pa and 100 W for 15 seconds. The substrate was rinsed briefly (<30 seconds) with acetone to remove all but a few nanometers of the residual S1813 film. The S1813 residue acts as an encapsulant to minimize doping of the CNTs from the top gate dielectric ALD of about 35 nm Al$_2$O$_3$ that was deposited over the entire substrate. The top gate metal (10 nm Cr/60 nm Au) was then patterned and deposited to overlap the entire device region.

Materials Characterization and Electrical Measurements

The thicknesses of the different device layers were characterized by atomic force microscopy (AFM) in ambient using an Asylum Cypher AFM. All electrical measurements were performed in ambient on a Cascade MicroTech semi-automated probe system using a Keithley 4200 semiconductor analyzer.

Statistics

Devices were fabricated over an area of 0.5 cm×0.5 cm with 85% yield. The $I_D$–$V_{TG}$ antiambipolar response for 14 distinct devices is shown in FIG. 13B. Values for the histograms in FIG. 13C were obtained by fitting the raw data to $$y = y_0 + Ae^{-0.5\left(\frac{x-x_c}{w}\right)^2} \quad (1)$$

where $x_c$ is the peak position and w is the FWHM. The average peak position was −0.42 V±0.55 V, and the average FWHM was 2.92 V±0.48 V. The data shown in FIGS. 2A-2C and 3A-3D correspond to the same device.

Spiking Neuron Demonstration

The experimental demonstration of a constant spiking neuron was achieved from the circuit shown in FIG. 4D using V1=4 V, V2=1 V, V3=3 V, V4=−230 mV, V5=−280 mV, R1=100 kΩ, R2=1 MΩ, C1=440 nF, C2=220 nF, $I_{syn}$=1 nA and commercial field-effect transistors, BSR802N L6327 (Mouser). Circuits simulations were performed using the Cadence Virtuoso platform using Spectre simulator with a look-up table-based Verilog-A model developed for a prototypical MoS$_2$-CNT GHeT as well as for the commercial transistors based on experimental charge transport characteristics. Other passive and active elements were obtained from the Analog library available within Virtuoso. Table 2 contains the parameters used in the simulations of the GHeT-based circuits used in FIGS. 4A-4F and 5A-5H.

TABLE 2

Simulation parameters for spiking neuron circuits, used for the simulations corresponding to each of FIGS. 4F and 5A-5H. For all simulations, the other parameters do not change (V1 = 4 V, V2 = 1 V, C2 = 0.22 μF, R1 = 100 kΩ and R2 = 1.5 MΩ).

Figure 5A:
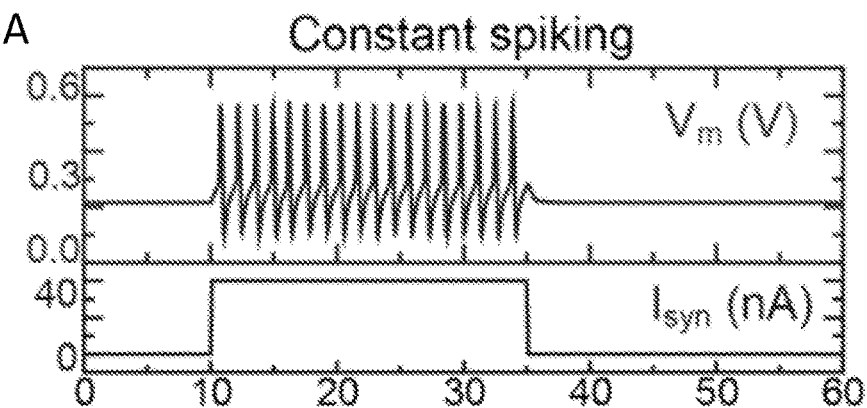
FIGS. 5A-5H show simulated spiking responses from GHeT-based circuits according to embodiments of the invention.
Figure 5B:
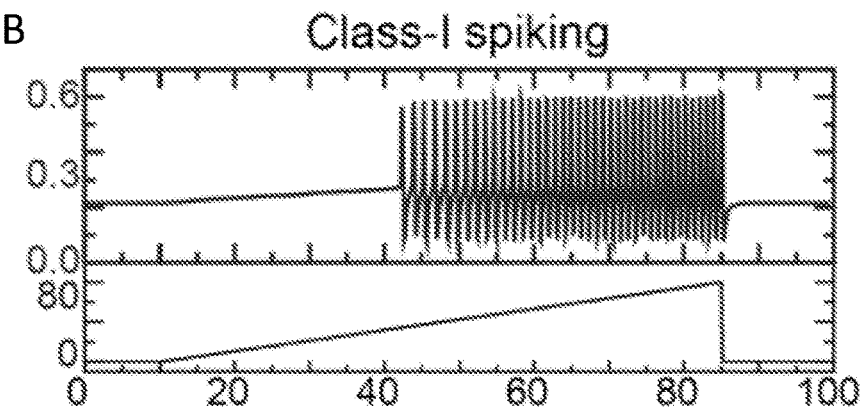
Figure 5C:
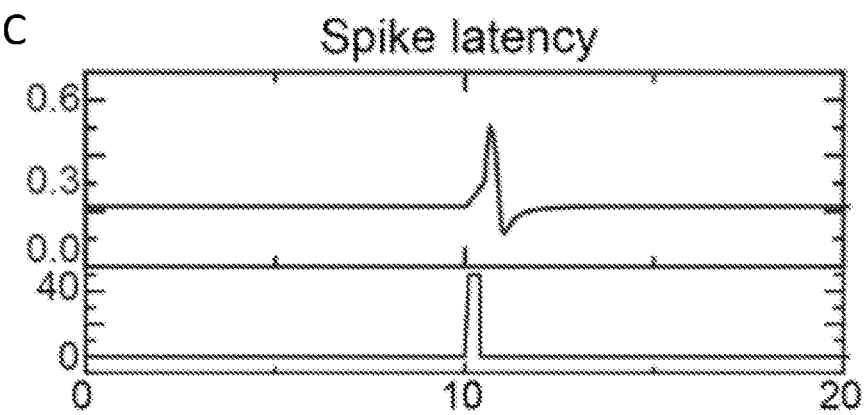
Figure 5D:
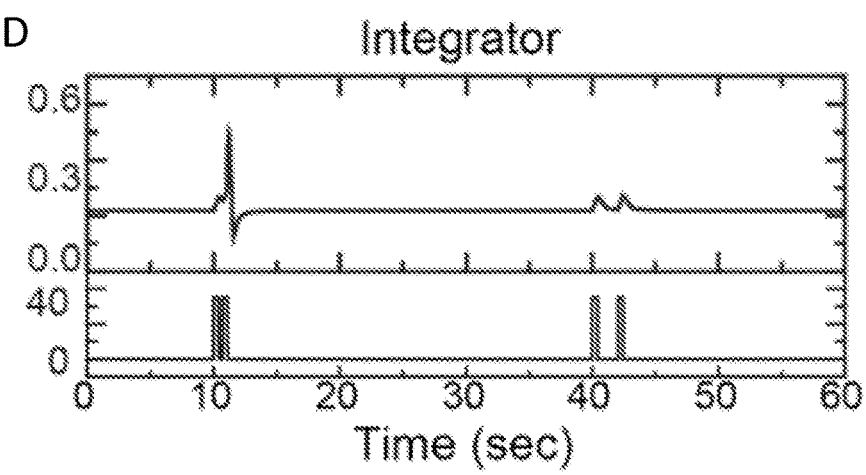
Figure 5E:
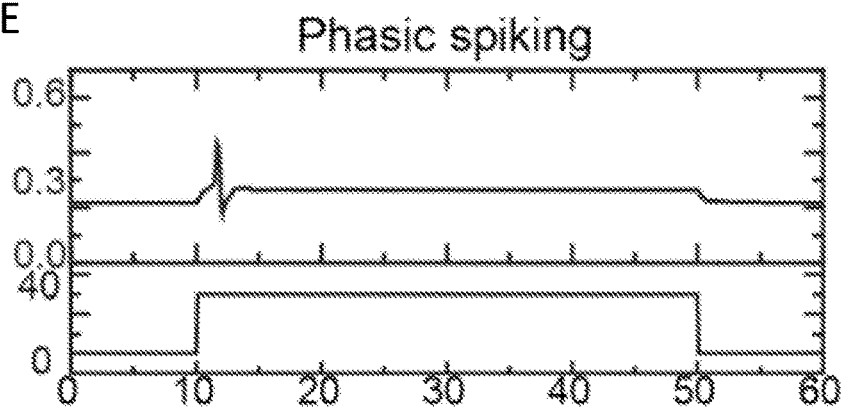
Figure 5F:
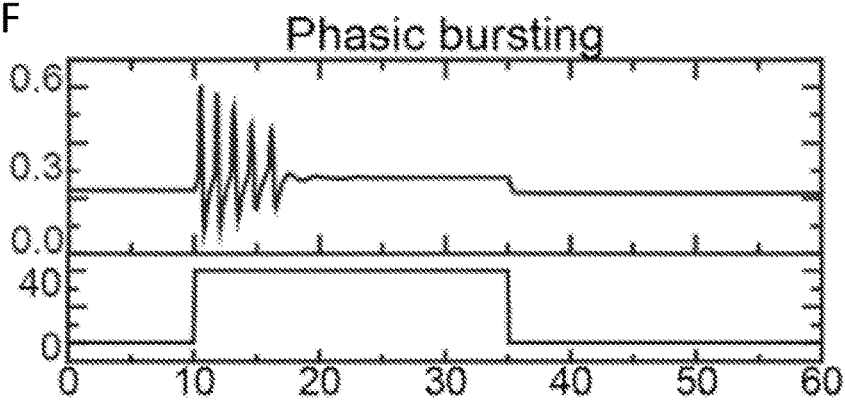
Figure 5G:
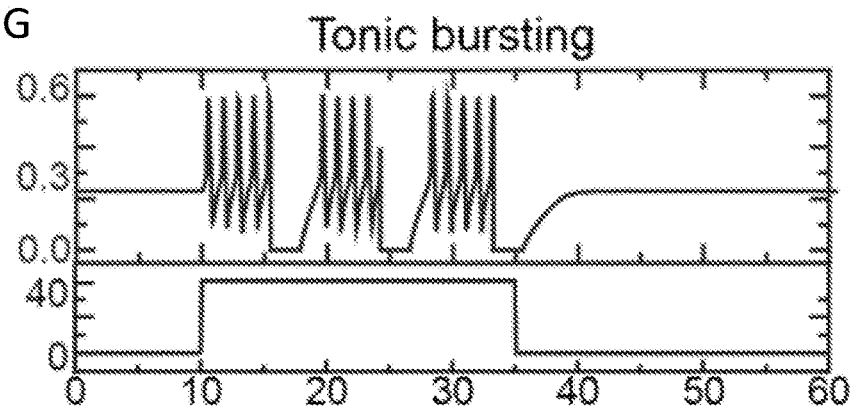

| FIGS. | V3 | V4 | V5 | C1 | C3 | R3 | R4 | $I_{syn}$ (timing) |
|---|---|---|---|---|---|---|---|---|
| FIG. 4F | n/a | −210 mV | −10 mV | 0.44 μF | n/a | n/a | n/a | 50 nA (constant) |
| FIG. 5A (Constant) | n/a | 0 V | n/a | 0.22 μF | n/a | n/a | n/a | 40 nA (10-35 s) |
| FIG. 5B (Class 1) | n/a | 0 V | n/a | 0.22 μF | n/a | n/a | n/a | 0-80 nA (linearly over 10-85 s) |
| FIG. 5C (Latency) | n/a | 2.5 V | n/a | 0.22 μF | n/a | n/a | n/a | 50 nA (10-10.4 s) |
| FIG. 5D (Integrator) | n/a | 2.5 V | n/a | 0.22 μF | n/a | n/a | n/a | 35 nA (0.4 s pulses at 10, 10.7, 40, and 42 s) |
| FIG. 5E (Phasic) | n/a | 3.1 V | n/a | 0.22 μF | n/a | n/a | n/a | 40 nA (10-35 s) |
| FIG. 5F (Phasic bursting) | n/a | n/a | n/a | 0.22 μF | 0.3 μF | 1.5 MΩ | n/a | 40 nA (10-35 s) |
| FIG. 5G (Tonic | n/a | n/a | n/a | 0.22 μF | 0.3 μF | 2 MΩ | 6 MΩ | 40 nA (10-35 s) |

TABLE 2-continued

Simulation parameters for spiking neuron circuits, used for the simulations corresponding to each of FIGS. 4F and 5A-5H. For all simulations, the other parameters do not change (V1 = 4 V, V2 = 1 V, C2 = 0.22 μF, R1 = 100 kΩ and R2 = 1.5 MΩ).

Figure 5H:
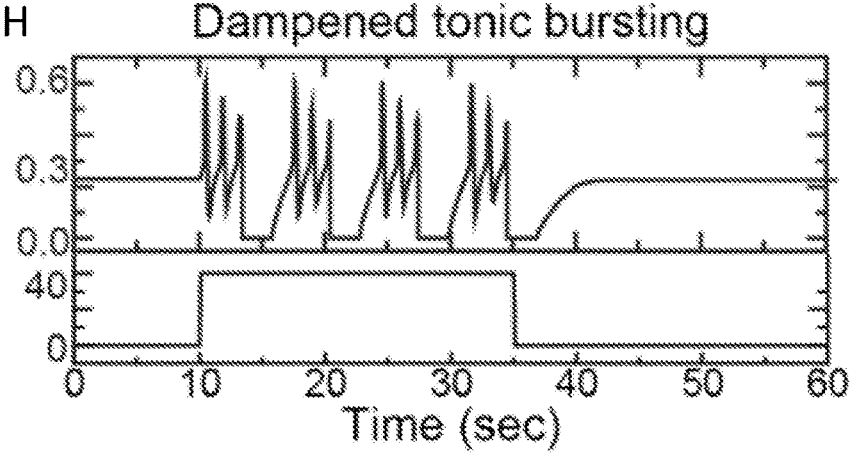

| FIGS. | V3 | V4 | V5 | C1 | C3 | R3 | R4 | $I_{syn}$ (timing) |
|---|---|---|---|---|---|---|---|---|
| bursting) | | | | | | | | |
| FIG. 5H (Dampened tonic bursting) | n/a | n/a | n/a | 0.22 μF | 0.3 μF | 1.5 MΩ | 6 MΩ | 40 nA (10-35 s) |

Spiking neural networks exploit spatiotemporal processing, spiking sparsity, and high interneuron bandwidth to maximize the energy efficiency of neuromorphic computing. While conventional silicon-based technology can be used in this context, the resulting neuron-synapse circuits require multiple transistors and complicated layouts that limit integration density.

Certain aspects of the invention demonstrate unprecedented electrostatic control of dual-gated Gaussian heterojunction transistors for simplified spiking neuron implementation. These devices employ wafer-scale mixed-dimensional van der Waals heterojunctions including chemical vapor deposited monolayer molybdenum disulfide and solution-processed semiconducting single-walled carbon nanotubes to emulate the spike-generating ion channels in biological neurons. Circuits based on these dual-gated Gaussian devices enable a variety of biological spiking responses including phasic spiking, delayed spiking, and tonic bursting. In addition to neuromorphic computing, the tunable Gaussian response has significant implications for a range of other applications including telecommunications, computer vision, and natural language processing.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the invention pertains without departing from its spirit and scope. Accordingly, the scope of the invention is defined by the appended claims rather than the foregoing description and the exemplary embodiments described therein.

Some references, which may include patents, patent applications, and various publications, are cited and discussed in the description of this invention. The citation and/or discussion of such references is provided merely to clarify the description of the invention and is not an admission that any such reference is "prior art" to the invention described herein. All references cited and discussed in this specification are incorporated herein by reference in their entireties and to the same extent as if each reference was individually incorporated by reference.

LIST OF REFERENCES

1. Indiveri, G. et al. Neuromorphic silicon neuron circuits. *Front. Neurosci.* 5, 1-23 (2011).
2. Indiveri, G. In 2003 *IEEE Int. Symp. Circ. S.* 820-823 (IEEE, 2003); https://doi.org/10.1109/ISCAS.2003.1206342
3. Folowosele, F. et al. In 2009 *IEEE Int. Symp. Circ. S.* 2149-2152 (IEEE, 2009); https://doi.org/10.1109/ISCAS.2009.5118221
4. Asai, T., Kanazawa, Y. & Amemiya, Y. A subthreshold MOS neuron circuit based on the Volterra system. *IEEE Trans. Neural Networks* 14, 1308-1312 (2003).
5. Wijekoon, J. H. B. & Dudek, P. In 2008 *IEEE Int. Symp. Circ. S.* 1784-1787 (IEEE, 2008); https://doi.org/10.1109/ISCAS.2008.4541785
6. Akopyan, F. et al. TrueNorth: Design and tool flow of a 65 mW 1 million neuron programmable neurosynaptic chip. *IEEE Trans. Comput. Aided Des. Integr. Circuits Syst.* 34, 1537-1557 (2015).
7. Furber, S. B., Galluppi, F., Temple, S. & Plana, L. A. The SpiNNaker project. *Proc. IEEE* 102, 652-665 (2014).
8. Jo, S. H. et al. Nanoscale memristor device as synapse in neuromorphic systems. *Nano Lett.* 10, 1297-1301 (2010).
9. Sangwan, V. K. et al. Multi-terminal memtransistors from polycrystalline monolayer molybdenum disulfide. *Nature* 554, 500-504 (2018).
10. Wang, L. et al. Artificial synapses based on multiterminal memtransistors for neuromorphic application. *Adv. Funct. Mater.* 29, 1901106 (2019).
11. Sharad, M., Augustine, C., Panagopoulos, G. & Roy, K. Spin-based neuron model with domain-wall magnets as synapse. *IEEE Trans. Nanotechnol.* 11, 843-853 (2012).
12. Shi, J., Ha, S. D., Zhou, Y., Schoofs, F. & Ramanathan, S. A correlated nickelate synaptic transistor. *Nat. Commun.* 4, 2676 (2013).
13. Sebastian, A., Pannone, A., Subbulakshmi Radhakrishnan, S. & Das, S. Gaussian synapses for probabilistic neural networks. *Nat. Commun.* 10, 4199 (2019).
14. Pickett, M. D., Medeiros-Ribeiro, G. & Williams, R. S. A scalable neuristor built with Mott memristors. *Nat. Mater.* 12, 114 (2012).
15. Gao, L., Chen, P.-Y. & Yu, S. $NbO_x$ based oscillation neuron for neuromorphic computing. *Appl. Phys. Lett.* 111, 103503 (2017).
16. Thakur, C. S. et al. Large-scale neuromorphic spiking array processors: A quest to mimic the brain. *Front. Neurosci.* 12, 891 (2018).
17. Jaiswal, A., Roy, S., Srinivasan, G. & Roy, K. Proposal for a leaky-integrate-fire spiking neuron based on magnetoelectric switching of ferromagnets. *IEEE Trans. Electron Devices* 64, 1818-1824 (2017).
18. Wang, Z. et al. In 2018 *IEEE Int. Electron Devices Meet.* 300-303 (IEEE, 2018); https://doi.org/10.1109/IEDM.2018.8614586
19. Izhikevich, E. M. *Dynamical Systems in Neuroscience.* (MIT Press, Cambridge, 2007).

20. Meng, X. J. et al. Temperature dependence of ferroelectric and dielectric properties of PbZr$_{0.5}$Ti$_{0.5}$O$_3$ thin film based capacitors. *Appl. Phys. Lett.* 81, 4035-4037 (2002).
21. Feldmann, J., Youngblood, N., Wright, C. D., Bhaskaran, H. & Pernice, W. H. P. All-optical spiking neurosynaptic networks with self-learning capabilities. *Nature* 569, 208-214 (2019).
22. Jariwala, D. et al. Gate-tunable carbon nanotube-MoS$_2$ heterojunction p-n diode. *Proc. Natl Acad. Sci. USA* 110, 18076-18080 (2013).
23. Jariwala, D. et al. Hybrid, gate-tunable, van der Waals p-n heterojunctions from pentacene and MoS$_2$. *Nano Lett.* 16, 497-503 (2016).
24. Nourbakhsh, A., Zubair, A., Dresselhaus, M. S. & Palacios, T. Transport properties of a MoS$_2$/WSe$_2$ heterojunction transistor and its potential for application. *Nano Lett.* 16, 1359-1366 (2016).
25. Li, Y. et al. Anti-ambipolar field-effect transistors based on few-layer 2D transition metal dichalcogenides. *ACS Appl. Mater. Inter.* 8, 15574-15581 (2016).
26. Hong, T. et al. Anisotropic photocurrent response at black phosphorus-MoS$_2$ p-n heterojunctions. *Nanoscale* 7, 18537-18541 (2015).
27. Lee, C.-H. et al. Atomically thin p-n junctions with van der Waals heterointerfaces. *Nat. Nanotechnol.* 9, 676 (2014).
28. Wu, E. et al. Photoinduced doping to enable tunable and high-performance anti-ambipolar MoTe$_2$/MoS$_2$ heterotransistors. *ACS Nano* 13, 5430-5438 (2019).
29. He, X., Chow, W., Liu, F., Tay, B. & Liu, Z. MoS$_2$/rubrene van der Waals heterostructure: Toward ambipolar field-effect transistors and inverter circuits. *Small* 13, 1602558 (2017).
30. Yoo, H., On, S., Lee, S. B., Cho, K. & Kim, J.-J. Negative transconductance heterojunction organic transistors and their application to full-swing ternary circuits. *Adv. Mater.* 31, 1808265 (2019).
31. Sangwan, V. K. et al. Self-aligned van der Waals heterojunction diodes and transistors. *Nano Lett.* 18, 1421-1427 (2018).
32. Li, D., Wang, B., Chen, M., Zhou, J. & Zhang, Z. Gate-controlled BP—WSe$_2$ heterojunction diode for logic rectifiers and logic optoelectronics. *Small* 13, 1603726 (2017).
33. Jariwala, D. et al. Large-area, low-voltage, antiambipolar heterojunctions from solution-processed semiconductors. *Nano Lett.* 15, 416-421 (2015).
34. Amsterdam, S. H. et al. Electronic coupling in metallophthalocyanine-transition metal dichalcogenide mixed-dimensional heterojunctions. *ACS Nano* 13, 4183-4190 (2019).
35. Geier, M. L. et al. Solution-processed carbon nanotube thin-film complementary static random access memory. *Nat. Nanotechnol.* 10, 944 (2015).
36. Gaviria Rojas, W. A. et al. Solution-processed carbon nanotube true random number generator. *Nano Lett.* 17, 4976-4981 (2017).
37. Phan, T. L. et al. Efficient gate modulation in a screening-engineered MoS$_2$/single-walled carbon nanotube network heterojunction vertical field-effect transistor. *ACS Appl. Mater. Inter.* 11, 25516-25523 (2019).
38. Hodgkin, A. L. & Huxley, A. F. Currents carried by sodium and potassium ions through the membrane of the giant axon of Loligo. *J. Physiol.* 116, 449-472 (1952).
39. Kang, K. & Shibata, T. An on-chip-trainable Gaussian-kernel analog support vector machine. *IEEE Trans. Circuits-I* 57, 1513-1524 (2010).
40. Reynolds, D. A., Quatieri, T. F. & Dunn, R. B. Speaker verification using adapted Gaussian mixture models. *Digit. Signal Process.* 10, 19-41 (2000).
41. Blei, D. M., Kucukelbir, A. & McAuliffe, J. D. Variational inference: A review for statisticians. *J. Am. Stat. Assoc.* 112, 859-877 (2017).
42. Crespo, J. L., Duro, R. J. & Pena, F. L. Gaussian synapse ANNs in multi- and hyperspectral image data analysis. *IEEE Trans. Instrum. Meas.* 52, 724-732 (2003).

What is claimed is:

1. A Gaussian heterojunction transistor (GHeT), comprising:
   a bottom gate electrode formed on a substrate;
   a first dielectric layer formed on the bottom gate electrode;
   a monolayer film formed of an atomically thin material on the first dielectric layer;
   a bottom contact formed on a part of the monolayer film;
   a second dielectric layer formed on the bottom contact;
   a top contact formed on the second dielectric layer on the top of the bottom contact;
   a network of carbon nanotubes (CNTs) formed on the top contact and the monolayer film, so as to define an overlap region with the monolayer film;
   a third dielectric layer formed on the CNT network, the monolayer film and the top contact over the substrate; and
   a top gate electrode formed on the third dielectric layer and overlapping with the overlap region.

2. The GHeT of claim 1, wherein the atomically thin material comprises a two-dimensional (2D) semiconductor material.

3. The GHeT of claim 2, wherein the 2D semiconductor material comprises MoS$_2$, MoSe$_2$, WS$_2$, WSe$_2$, InSe, GaTe, black phosphorus (BP), or related 2D materials.

4. The GHeT of claim 1, wherein the bottom and top gate electrodes and the bottom and top contacts comprise a same conductive material or different conductive materials.

5. The GHeT of claim 4, wherein each of the bottom and top gate electrodes and the bottom and top contacts is formed of gold (Au), titanium (Ti), aluminum (Al), nickel (Ni), chromium (Cr), or other conductive materials.

6. The GHeT of claim 1, wherein the first, second and third dielectric layers comprise a same dielectric material or different dielectric materials.

7. The GHeT of claim 6, wherein each of the first, second and third dielectric layers is formed of Al$_2$O$_3$, HfO$_2$, ZrO$_2$, ZnO, SiO$_2$, or dielectrics including alumina, hafnia, or zirconia.

8. The GHeT of claim 1, wherein the top and bottom gates are configured to modulate a diode rectification ratio.

9. The GHeT of claim 8, wherein the top gate operably modulates an output response of the GHeT from a rectifying diode at a first top gate voltage to an inverted polarity rectifying diode at a second top gate voltage.

10. The GHeT of claim 1, wherein the GHeT is configured to have operably band-to-band tunneling between the atomically thin material and the CNTs.

11. The GHeT of claim 1, wherein the GHeT is configured to operate in a dependent biasing scheme to combine modulation of the CNTs by the top gate and modulation of the atomically thin material by the bottom gate, thereby resulting in enhanced electrostatic control of a device response.

12. The GHeT of claim 1, wherein the GHeT is configured to have a tunable Gaussian transfer response in a single heterojunction device.

13. The GHeT of claim 1, wherein the GHeT is configured to have an antiambipolar response that is tunable, so as to enable a variety of applications including Hodgkin-Huxley (HH) spiking neurons.

14. A Gaussian heterojunction transistor (GHeT), comprising:
at least one mixed-dimensional van der Waals heterojunction comprising a monolayer film formed of an atomically thin material, and a network of carbon nanotubes (CNTs).

15. The GHeT of claim 14, wherein the atomically thin material comprises two-dimensional (2D) semiconductor material.

16. The GHeT of claim 15, wherein the 2D semiconductor material comprises $MoS_2$, $MoSe_2$, $WS_2$, $WSe_2$, InSe, GaTe, black phosphorus (BP), or related two-dimensional materials.

17. A circuit, comprising at least one Gaussian heterojunction transistor (GHeT) according to claim 14.

18. The circuit of claim 17, further comprising a Schmitt Trigger circuit coupled with the at least one Gaussian heterojunction transistor.

19. The circuit of claim 17, wherein the circuit is configured to achieve a variety of biological spiking responses including phasic spiking, delayed spiking, and tonic bursting.

20. A device, comprising at least one Gaussian heterojunction transistor (GHeT) according to claim 14.

21. The device of claim 20, further comprising a Schmitt Trigger circuit coupled with the at least one Gaussian heterojunction transistor.

22. The device if claim 20, wherein the device is configured to mimic a variety of biological spiking responses including phasic spiking, delayed spiking, and tonic bursting.

23. A method for fabricating a Gaussian heterojunction transistor (GHeT), comprising:
fabricating a self-aligned bottom gate having a bottom gate electrode formed on a substrate, and a first dielectric layer formed on the bottom gate electrode;
transferring a monolayer of an atomically thin material onto the self-aligned bottom gate and patterned using reactive ion etching (RIE);
fabricating a self-aligned bottom contact on the monolayer followed by patterning and growth of a dielectric layer as an etch mask on part of the monolayer; wherein the self-aligned bottom contact has a bottom contact electrode and a second dielectric layer formed on the bottom contact electrode;
depositing a top contact on the top of the bottom contact followed by transfer of a network of carbon nanotubes (CNTs) over the substrate, after which the RIE is performed to define an overlap region of the CNT network with the monolayer, the overlap region being a junction region;
growing a third dielectric layer over the substrate; and
forming a top gate on the third dielectric layer at least over the junction region.

24. The method of claim 23, wherein the monolayer of the atomically thin material is grown by chemical vapor deposition (CVD), mechanical exfoliation, metal-organic chemical vapor deposition (MOCVD), or atomic layer deposition (ALD).

25. The method of claim 23, wherein each of the self-aligned bottom gate and self-aligned bottom contact is fabricated with an undercut profile in developed negative photoresist combined with directional metal evaporation and conformal atomic layer deposition (ALD) of a dielectric oxide resulting in an encapsulated metal electrode with a self-aligned dielectric extension.

26. The method of claim 23, wherein each of the first, second and third dielectric layers is formed by atomic layer deposition (ALD).

27. The method of claim 23, wherein the first, second and third dielectric layers comprise a same dielectric material or different dielectric materials.

28. The method of claim 27, wherein each of the first, second and third dielectric layers is formed of $Al_2O_3$, $HfO_2$, $ZrO_2$, ZnO, $SiO_2$, or dielectrics including alumina, hafnia, or zirconia.

29. The method of claim 23, wherein the atomically thin material comprises a two-dimensional (2D) semiconductor material.

30. The method of claim 29, wherein the 2D semiconductor material comprises $MoS_2$, $MoSe_2$, $WS_2$, $WSe_2$, InSe, GaTe, black phosphorus (BP), or related two-dimensional materials.

31. A circuit for spiking neuron, comprising:
at least one Gaussian heterojunction transistor (GHeT);
first and second transistors T1 and T2 coupled to the GHeT; and
a number of passive elements including first and second resistors R1 and R2 and first and second capacitors C1 and C2,
configured such that the GHeT and circuit components T1-R1-C1 operably emulate conductance of a $Na^+$ ion channel ($g_{Na}$), while circuit components T2-R2-C2 operably emulate conductance of a $K^+$ ion channel ($g_k$).

32. The circuit of claim 31, wherein
the first transistor T1 and the first resistor R1 define a T1-R1 amplifier having an output node n1, wherein first resistor R1 has a first terminal electrically connected to potential V1 and a second terminal electrically connected to the output node n1, and the first transistor T1 has a gate electrically connected to a node n0 at potential $V_m$, a drain electrically connected to the output node n1, and a source electrically connected to a ground node, and the node n0 integrates a synapse current $I_{syn}$;
the first capacitor C1 have a first terminal electrically connected to the node n0, and a second terminal electrically connected to the ground node;
the second transistor T2 has a gate, a drain electrically connected to the synapse current $I_{syn}$, and a source electrically connected to the ground node;
the second resistor R2 has a first terminal electrically connected to the synapse current $I_{syn}$, and a second terminal electrically connected to the gate of the second transistor T2; and
the second capacitor C2 has a first terminal electrically connected to the gate of the second transistor T2, and a second terminal electrically connected to the ground node.

33. The circuit of claim 32, wherein
bottom and top gates of the GHeT are electrically connected to a bias voltage V3 for providing a bias offset between the bottom and top gates;
the top gate of the GHeT is electrically connected to the output node n1;
a drain of the GHeT is electrically connected to potential V2; and
a source of the GHeT is electrically connected to the node n0 that integrates the synapse current $I_{syn}$.

34. The circuit of claim 33, further comprising voltage sources V4 and V5 electrically connected at the sources of the first and second transistors T1 and T2, respectively, to allow threshold voltage programmability for the field-effect transistors.

35. The circuit of claim 32, wherein
bottom and top gates of the GHeT are electrically shorted and electrically connected to the output node n1;
a drain of the GHeT is electrically connected to potential V2; and
a source of the GHeT is electrically connected to the node n0 that integrates the synapse current $I_{syn}$.

36. The circuit of claim 32, wherein
a top gate of the GHeT is electrically connected to the output node n1;
a bottom gate of the GHeT is electrically connected to a bias voltage V3;
a drain of the GHeT is electrically connected to potential V2; and
a source of the GHeT is electrically connected to the node n0 that integrates a synapse current $I_{syn}$.

37. The circuit of claim 36, further comprising a third resistor R3 and a third capacitor C3, wherein the third resistor R3 has a first terminal electrically coupled, via a switch circuit, to the output node n1, and a second terminal electrically connected to a common node n2, and the third capacitor C3 has a first terminal electrically connected to the common node n2, and a second terminal electrically connected to the ground node.

38. The circuit of claim 37, wherein the common node n2 is eclectically connected to the bias voltage V3.

39. The circuit of claim 37, further comprising:
a third transistor T3 having a gate electrically connected to the bias voltage V3, a drain electrically connected to the node n0, and a source electrically connected to the ground node;
a fourth transistor T4 having a gate electrically connected to the bias voltage V3, a drain electrically connected to the common node n2, and a source;
a fourth resistor R4 having a first terminal electrically connected to the source of the fourth transistor T4, and a second terminal electrically connected to the ground node; and
a Schmitt trigger circuit electrically connected to the common node n2.

40. The circuit of claim 37, further comprising:
a third transistor T3 having a gate electrically connected to voltage V5, a drain electrically connected to the node n0, and a source electrically connected to the ground node;
a fourth transistor T4 having a gate electrically connected to the voltage V5, a drain electrically connected to the bias voltage V3 that is in turn electrically connected to the common node n2, and a source;
a fourth resistor R4 having a first terminal electrically connected to the source of the fourth transistor T4, and the ground node; and a second terminal electrically connected to the ground node; and
a Schmitt trigger circuit electrically connected to the common node n2.

* * * * *